(12) United States Patent
Fukuzumi et al.

(10) Patent No.: US 12,400,686 B2
(45) Date of Patent: Aug. 26, 2025

(54) MICROELECTRONIC DEVICES, AND RELATED MEMORY DEVICES AND ELECTRONIC SYSTEMS

(71) Applicant: Micron Technology, Inc., Boise, ID (US)

(72) Inventors: Yoshiaki Fukuzumi, Kanagawa (JP); Shuji Tanaka, Tokyo (JP); Yoshihiko Kamata, Kanagawa (JP); Jun Fujiki, Tokyo (JP); Tomoharu Tanaka, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 549 days.

(21) Appl. No.: 17/812,118

(22) Filed: Jul. 12, 2022

(65) Prior Publication Data

US 2024/0021219 A1  Jan. 18, 2024

(51) Int. Cl.
*G11C 5/06* (2006.01)
*H01L 23/522* (2006.01)
(Continued)

(52) U.S. Cl.
CPC .......... *G11C 5/063* (2013.01); *H01L 23/5226* (2013.01); *H01L 23/5283* (2013.01); *H10B 41/10* (2023.02); *H10B 41/27* (2023.02); *H10B 41/35* (2023.02); *H10B 41/41* (2023.02); *H10B 43/10* (2023.02); *H10B 43/27* (2023.02); *H10B 43/35* (2023.02); *H10B 43/40* (2023.02); *H10D 30/0411* (2025.01); *H10D 30/0413* (2025.01); *H10D 30/689* (2025.01);
(Continued)

(58) Field of Classification Search
CPC . G11C 5/063; H01L 23/5226; H01L 23/5283; H10B 43/10; H10B 43/27; H10B 43/35; H10B 43/40; H10B 41/10; H10B 41/27; H10B 41/35; H10B 41/41; H10D 30/0411; H10D 30/0413; H10D 30/689; H10D 30/6892; H10D 30/693; H10D 30/696; H10D 64/035; H10D 64/037
See application file for complete search history.

(56) References Cited

U.S. PATENT DOCUMENTS 6,891,768 B2  5/2005 Smith et al.
7,729,171 B2  6/2010 Aritome
(Continued)

*Primary Examiner* — Sitaramarao S Yechuri
(74) *Attorney, Agent, or Firm* — TraskBritt

(57) ABSTRACT

A microelectronic device comprises a stack structure, pillar structures, a conductive plug structure, a sense transistor, and selector transistors. The stack structure comprises a vertically alternating sequence of conductive material and insulative material, and is divided into blocks separated by dielectric slot structures. The blocks individually include sub-blocks horizontally extending in parallel with one another. The pillar structures vertically extend through one of the blocks of the stack structure. Each pillar structure of a group of the pillar structures is positioned within a different one of the sub-blocks of the one of the blocks than each other pillar structure of the group. The conductive plug structure is coupled to multiple of the pillar structures of the group of the pillar structures. The sense transistor is gated by the conductive plug structure. The selector transistors couple the sense transistor to a read source line structure and a digit line structure.

36 Claims, 12 Drawing Sheets

(51) Int. Cl.
     *H01L 23/528*   (2006.01)
     *H10B 41/10*    (2023.01)
     *H10B 41/27*    (2023.01)
     *H10B 41/35*    (2023.01)
     *H10B 41/41*    (2023.01)
     *H10B 43/10*    (2023.01)
     *H10B 43/27*    (2023.01)
     *H10B 43/35*    (2023.01)
     *H10B 43/40*    (2023.01)
     *H10D 30/01*    (2025.01)
     *H10D 30/68*    (2025.01)
     *H10D 30/69*    (2025.01)
     *H10D 64/01*    (2025.01)

(52) U.S. Cl.
     CPC ....... *H10D 30/6892* (2025.01); *H10D 30/693* (2025.01); *H10D 30/696* (2025.01); *H10D 64/035* (2025.01); *H10D 64/037* (2025.01)

(56) References Cited

U.S. PATENT DOCUMENTS

| | | |
|---|---|---|
| 7,782,674 B2 | 8/2010 | Roohparvar et al. |
| 8,184,471 B2 | 5/2012 | Woo et al. |
| 8,426,301 B2 | 4/2013 | Oh et al. |
| 9,679,913 B1 * | 6/2017 | Hu .................. H10B 43/35 |
| 10,354,734 B2 | 7/2019 | Saito et al. |
| 2016/0099047 A1 * | 4/2016 | Lee .................. G11C 11/5642 |
| | | 365/185.03 |
| 2020/0258993 A1 * | 8/2020 | Haraguchi ......... G11C 13/0026 |

* cited by examiner

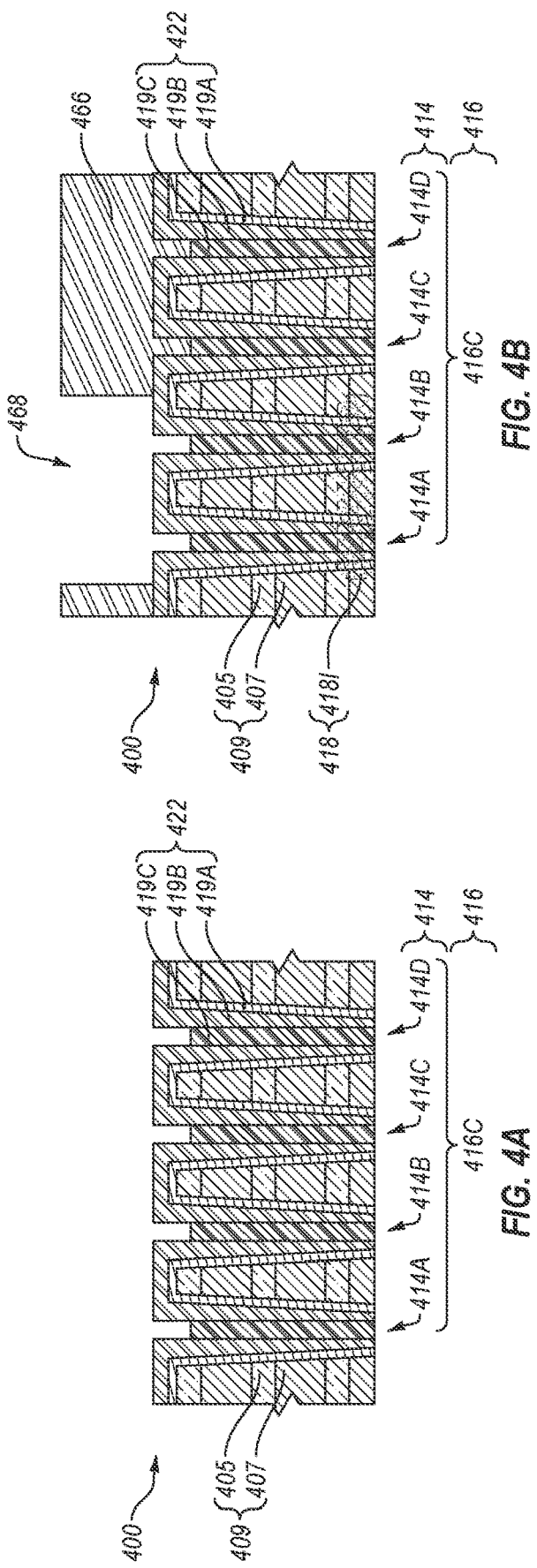

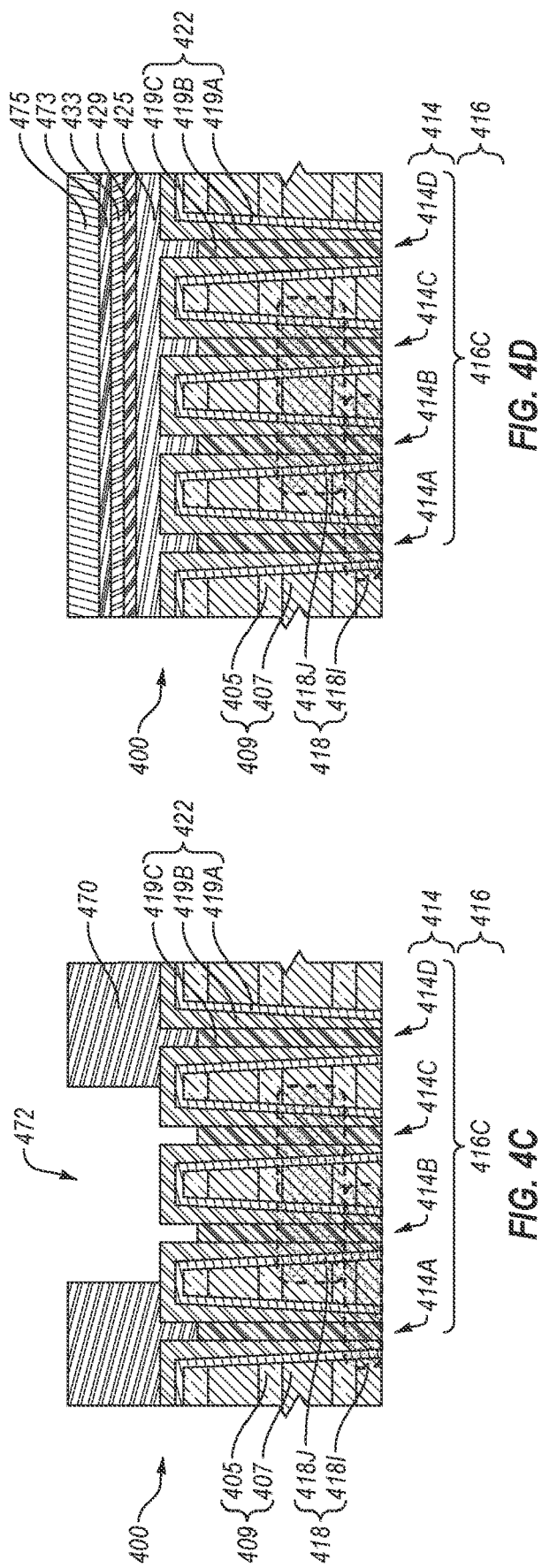

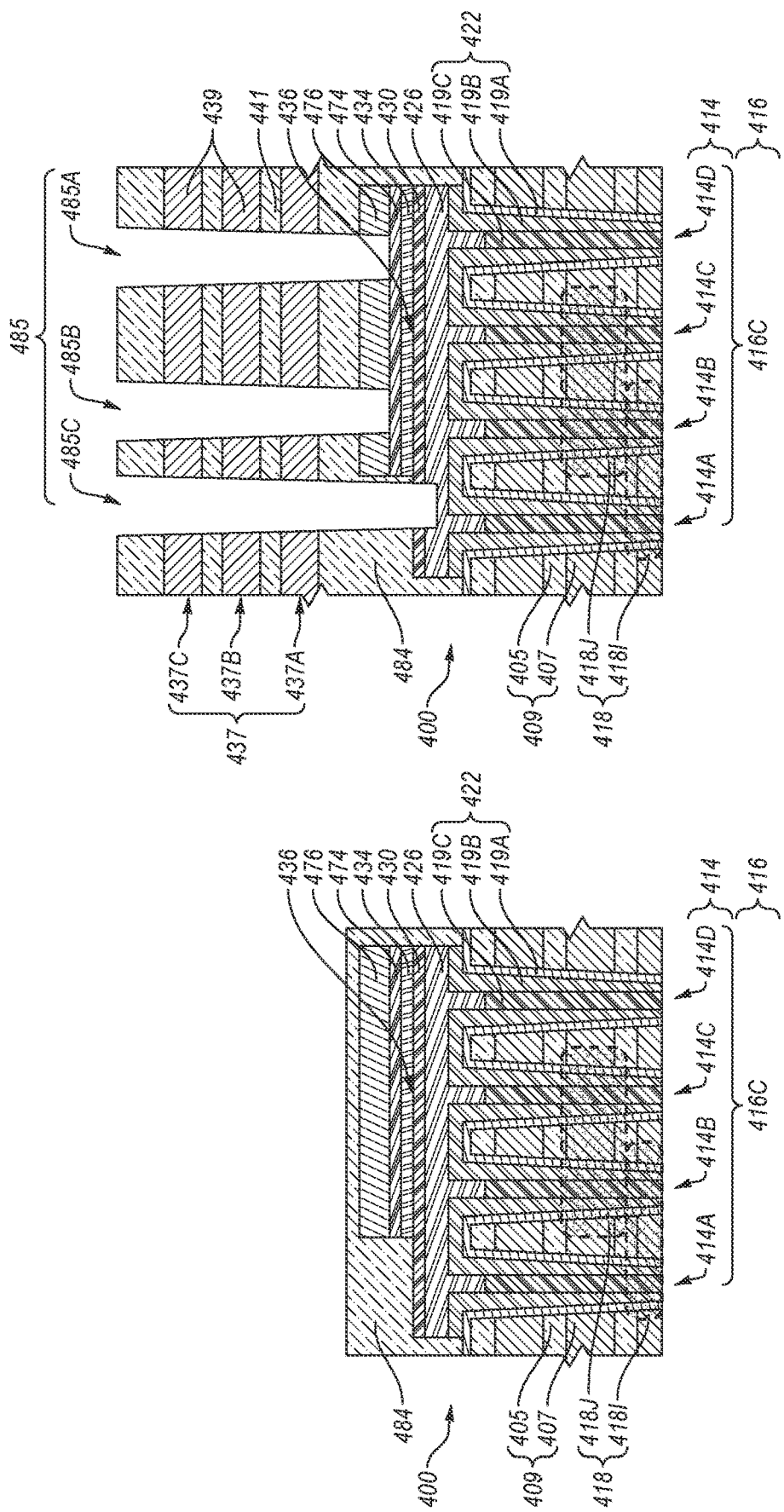

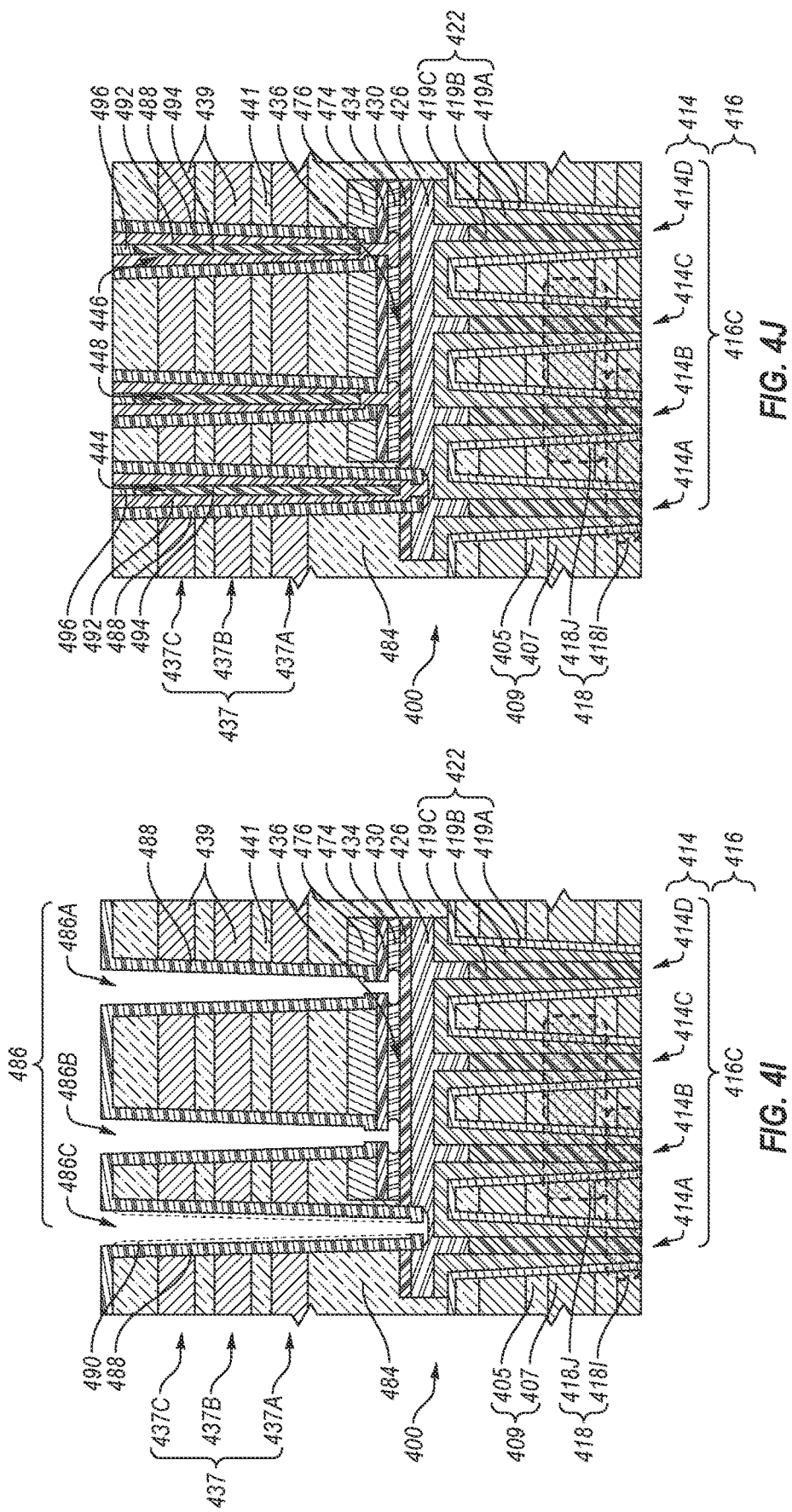

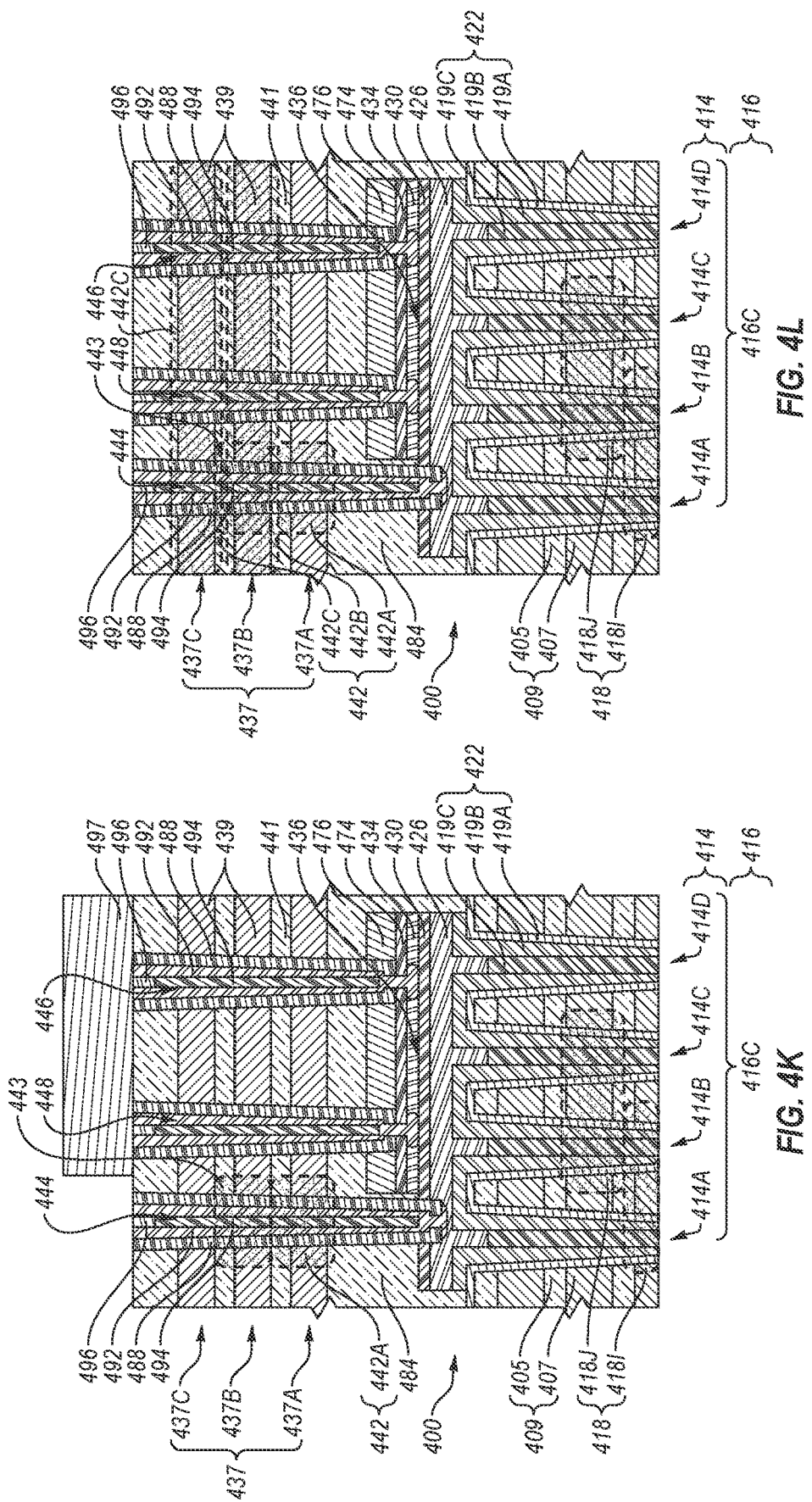

MICROELECTRONIC DEVICES, AND RELATED MEMORY DEVICES AND ELECTRONIC SYSTEMS

TECHNICAL FIELD

The disclosure, in various embodiments, relates generally to the field of microelectronic device design and fabrication. More specifically, the disclosure relates to microelectronic devices including local digit line structures and global digit line structures, and to related memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes strings of memory cells vertically extending through a stack structure including tiers of conductive structures and insulative materials. Each string of memory cells may include at least one select device coupled in series to a serial combination of vertically stacked memory cells. Such a configuration permits a greater number of switching devices (e.g., transistors) to be located in a unit of die area (e.g., length and width of active surface consumed) by building the array upwards (e.g., vertically) on a die, as compared to structures with conventional planar (e.g., two-dimensional (2D)) arrangements of transistors. However, conventional vertical memory array architectures may effectuate can hamper improvements in the performance (e.g., data transfer rates, power consumption) of the non-volatile memory device, and/or can impede reductions to the sizes (e.g., horizontal footprints) of features of the non-volatile memory device.

BRIEF DESCRIPTION OF THE SEVERAL VIEWS OF THE DRAWINGS

FIGS. 4A through 4M are simplified, partial longitudinal cross-sectional views of a microelectronic device structure at different processing stages of a method of forming a microelectronic device, in accordance with embodiments of the disclosure.

DETAILED DESCRIPTION

Figure 1A:
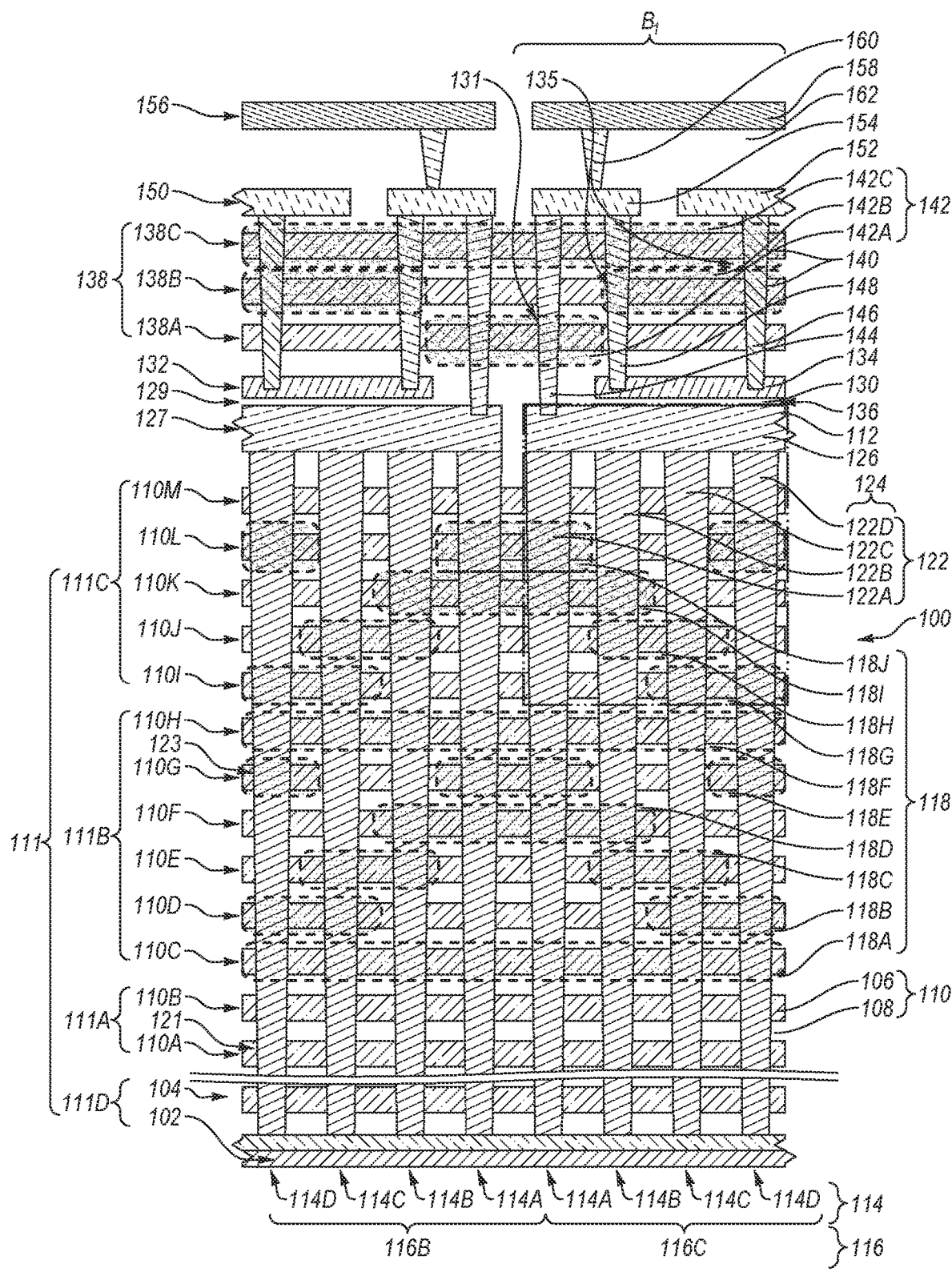
FIGS. 1A and 1B are simplified, partial longitudinal cross-sectional (FIG. 1A) and simplified, partial top-down (FIG. 1B) views of a microelectronic device structure for a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessary limited to memory functionality. Stated another way, and by way of non-limiting example only, the term "memory device" includes not only conventional memory (e.g., conventional non-volatile memory, such as conventional NAND memory; conventional volatile memory, such as conventional DRAM), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "intersection" means and includes a location at which two or more features (e.g., regions, structures, materials, devices) or, alternatively, two or more portions of a single feature meet. For example, an intersection between a first feature extending in a first direction (e.g., an X-direction) and a second feature extending in a second direction (e.g., a Y-direction) different than the first direction may be the location at which the first feature and the second feature meet.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "semiconductor material" refers to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_XGa_{1-X}As$), and quaternary compound semiconductor materials (e.g., $Ga_XIn_{1-X}As_YP_{1-Y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

As used herein, the term "homogeneous" means relative amounts of elements included in a feature (e.g., a region, a structures, a material) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

Figure 1B:
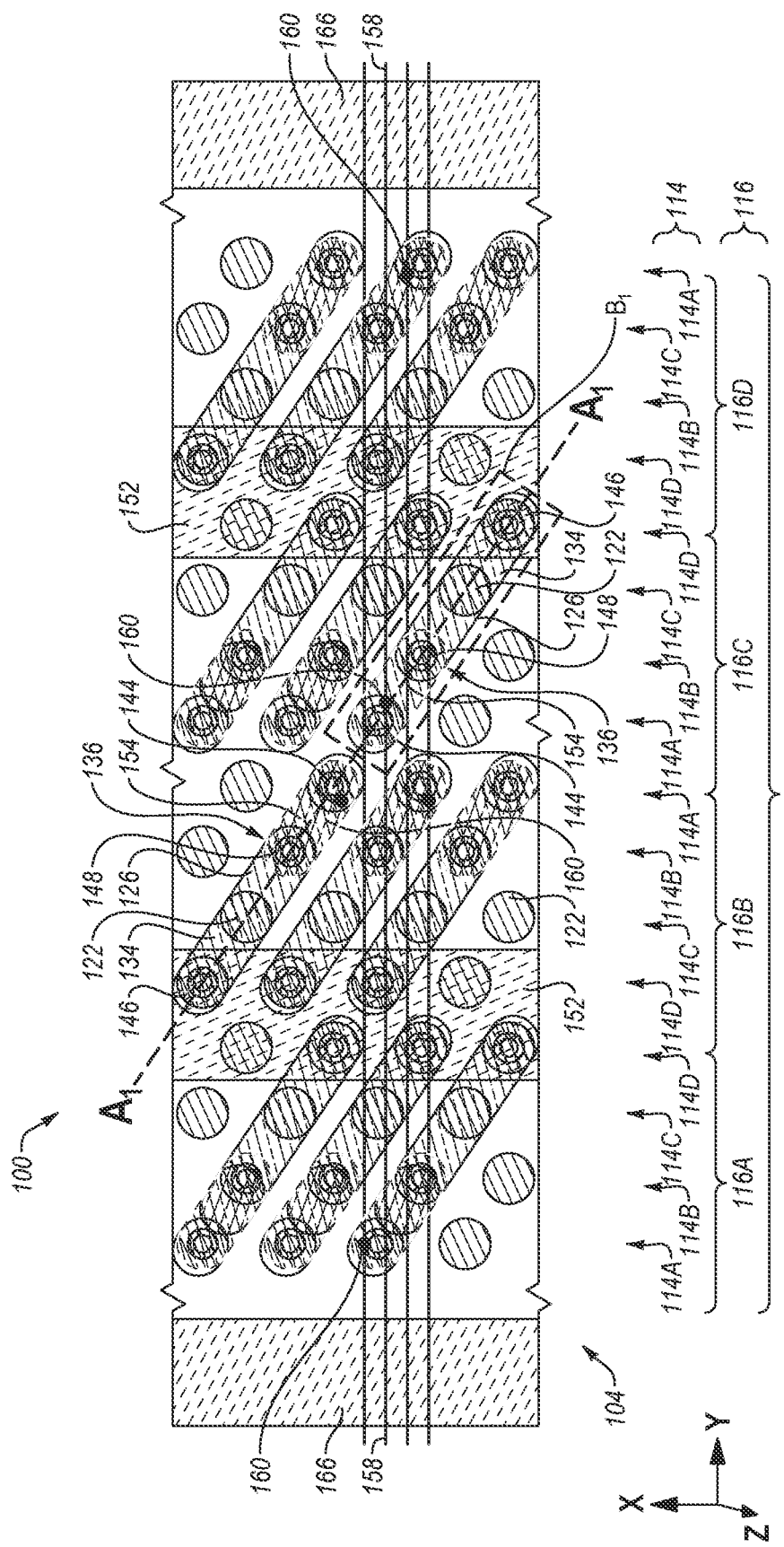

FIG. 1A is a simplified, partial longitudinal cross-sectional view of a microelectronic device structure 100 (e.g., a memory device structure, such as a 3D NAND Flash memory device structure) for a microelectronic device (e.g., a memory device, such as a 3D NAND Flash memory device), in accordance with embodiments of the disclosure. FIG. 1B is simplified, partial top-down view of the microelectronic device structure 100 depicted in FIG. 1A, wherein the view depicted in FIG. 1A is about dashed line $A_1$-$A_1$ depicted in FIG. 1B. For clarity and ease of understanding of the drawings and related description, not all features (e.g., regions, structures, materials, devices) of the microelectronic device structure 100 depicted in one of FIGS. 1A and 1B are depicted in the other of FIGS. 1A through 1B.

Referring to FIG. 1A, the microelectronic device structure 100 may be formed to include a base structure 102; a stack structure 104 vertically overlying the base structure 102, and including pillar structures 122 vertically extending therethrough; a select gate drain (SGD) plug tier 127 vertically overlying the stack structure 104; a digit line tier 156 vertically overlying the SGD plug tier 127; selector tiers 138 vertically interposed between the SGD plug tier 127 and the digit line tier 156; and a conductive routing tier 150 vertically interposed between the digit line tier 156 and the selector tiers 138. As described in further detail below, the microelectronic device structure 100 includes various features (e.g., regions, structures, materials, devices) individually operatively associated with (e.g., within; extending to, into, through, and/or between; physically and/or electrically connected to additional features of) one or more of the base structure 102, the stack structure 104, the SGD plug tier 127, the digit line tier 156, the selector tiers 138, and the conductive routing tier 150.

The base structure 102 may comprise a base material or construction upon which additional features (e.g., materials, structures, devices) of the microelectronic device structure 100 are formed. The base structure 102 may comprise one or more of semiconductor material, conductive material, and insulative material. The base structure 102 may include an arrangement of different materials, different structures, and/ or different regions. In some embodiments, the base structure 102 includes various circuitry (e.g., logic circuitry) therein.

The stack structure 104 of the microelectronic device structure 100 may be formed to include a vertically alternating sequence of conductive structures 106 and insulative structures 108 arranged in tiers 110. The conductive structures 106 may be vertically interleaved with the insulative structures 108. Each of the tiers 110 of the stack structure 104 may include at least one of the conductive structures 106 vertically neighboring at least one of the insulative structures 108. The stack structure 104 may be formed to include any desired quantity of the tiers 110, such as greater than or equal to sixteen (16) of the tiers 110, greater than or equal to thirty-two (32) of the tiers 110, greater than or equal to sixty-four (64) of the tiers 110, greater than or equal to one hundred twenty-eight (128) of the tiers 110, or greater than or equal to two hundred fifty-six (256) of the tiers 110.

The conductive structures 106 of the tiers 110 of the stack structure 104 may be formed of and include conductive material. By way of non-limiting example, the conductive structures 106 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the conductive structures 106 are formed of and include W. Each of the conductive structures 106 may individually be substantially homogeneous, or one or more of the conductive structures 106 may individually be substantially heterogeneous. In some embodiments, each of the conductive structures 106 is formed to be substantially homogeneous.

Optionally, one or more liner materials(s) (e.g., insulative liner material(s), conductive liner material(s)) may also be formed around the conductive structures 106. The liner material(s) may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material(s) comprise at least one conductive material employed as a seed material for the formation of the conductive structures 106. In some embodiments, the liner material(s) comprise titanium nitride. In further embodiments, the liner material(s) further include aluminum oxide. As a non-limiting example, aluminum oxide may be formed directly adjacent the insulative structures 108, titanium nitride may be formed directly adjacent the aluminum oxide, and tungsten may be formed directly adjacent the titanium nitride. For clarity and ease of understanding the description, the liner material(s) are not illustrated in FIGS. 1A and 1B, but it will be understood that the liner material(s) may be disposed around the conductive structures 106.

The insulative structures 108 of the tiers 110 of the stack structure 104 may be formed of and include insulative material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative structures 108 is formed of and includes a dielectric oxide material, such as $SiO_x$ (e.g., $SiO_2$). Each of the insulative structures 108 may individually be substantially homogeneous, may be substantially heterogeneous. In some embodiments, each of the insulative structures 108 is substantially homogeneous.

Referring to FIG. 1B, the stack structure 104 may be divided (e.g., separated, partitioned) into blocks 164 separated from one another by dielectric slot structures 166 (e.g., dielectric-filled slots, dielectric-filled openings). The dielectric slot structures 166 may vertically extend (e.g., in the Z-direction) completely through the stack structure 104. The blocks 164 of the stack structure 104 may be formed to horizontally extend parallel in an X-direction. As used herein, the term "parallel" means substantially parallel. Horizontally neighboring blocks 164 of the stack structure 104 may be separated from one another in a Y-direction orthogonal to the X-direction by the dielectric slot structures 166. The dielectric slot structures 166 may also horizontally extend parallel in the X-direction. Each of the blocks 164 of the stack structure 104 may exhibit substantially the same geometric configuration (e.g., substantially the same dimensions and substantially the same shape) as each other of the blocks 164, or one or more of the blocks 164 may exhibit a different geometric configuration (e.g., one or more different dimensions and/or a different shape) than one or more other of the blocks 164. In addition, each pair of horizontally neighboring blocks 164 of the stack structure 104 may be horizontally separated from one another by substantially the same distance (e.g., corresponding to a width in the Y-direction of each of the dielectric slot structures 166) as each other pair of horizontally neighboring blocks 164 of the stack structure 104, or at least one pair of horizontally neighboring blocks 164 of the stack structure 104 may be horizontally separated from one another by a different distance than that separating at least one other pair of horizontally neighboring blocks 164 of the stack structure 104. In some embodiments, the blocks 164 of the stack structure 104 are substantially uniformly (e.g., substantially non-variably, substantially equally, substantially consistently) sized, shaped, and spaced relative to one another.

Still referring to FIG. 1B, each block 164 of the stack structure 104 may be sub-divided into multiple (e.g., a plurality of, more than one) sub-blocks 114. The sub-blocks 114 of an individual block 164 may horizontally extend parallel in the X-direction. Each of the sub-blocks 114 may individually be operatively associated with at least one row of the pillar structures 122 extending the X-direction. For example, as depicted in FIG. 1B, an individual block 164 of the stack structure 104 may include sixteen (16) sub-blocks 114 operatively associated with sixteen (16) rows of the pillar structures 122. In addition, for an individual block 164, multiple (e.g., a plurality of, more than one) sub-blocks 114 thereof may be grouped together with one another within sub-block groups 116. As depicted in FIG. 1B, an individual block 164 of the stack structure 104 may, for example, include four (4) sub-block groups 116 each including four (4) of the sub-blocks 114. By way of non-limiting example, the sub-block groups 116 may include a first sub-block group 116A, a second sub-block group 116B, a third sub-block group 116C, and a fourth sub-block group 116D; and each of the sub-block groups 116 may individually include a first sub-block 114A, a second sub-block 114B, a third sub-block 114C, and a fourth sub-block 114D. Sub-block groups 116 horizontally neighboring one another in the Y-direction within an individual block 164 may exhibit an inverse horizontal arrangement of the different sub-blocks 114 thereof relative to one another. For example, the fourth sub-block 114D of the first sub-block group 116A may be most horizontally proximate the fourth sub-block 114D of the second sub-block group 116B horizontally neighboring the first sub-block group 116A; the first sub-block 114A of the second sub-block group 116B may be most horizontally proximate to the first sub-block 114A of the third sub-block group 116C horizontally neighboring the second sub-block group 116B; and the fourth sub-block 114D of the third sub-block group 116C may be most horizontally proximate to the fourth sub-block 114D of the fourth sub-block group 116D horizontally neighboring the third sub-block group 116C.

While FIG. 1B depicts an individual block 164 of the stack structure 104 as including sixteen (16) sub-blocks 114 and four (4) sub-block groups 116 each including a different four (4) of the sixteen (16) sub-blocks 114, in additional embodiments one or more (e.g., each) of the blocks 164 of the stack structure 104 includes a different quantity of sub-blocks 114, a different quantity of sub-block groups 116, and/or a different quantity of sub-blocks 114 within an individual sub-block group 116 thereof. For example, an individual block 164 may include greater than sixteen (16) sub-blocks 114 or less than sixteen (16) sub-blocks 114; may include greater than four (4) sub-block groups 116 or less four (4) sub-block groups 116; and/or may include greater than four (4) sub-blocks 114 in an individual sub-block group 116 or less than four (4) sub-blocks 114 in an individual sub-block group 116. For an individual block 164 of the stack structure 104, the quantity of sub-blocks 114, the quantity of sub-block groups 116, and the quantity of sub-blocks 114 per sub-block group 116 may be selected, at least in part, based on the horizontal area of the block 164 as well as the horizontal areas and horizontal positions of the pillar structures 122 located within the block 164.

Referring collectively to FIGS. 1A and 1B, it will be recognized that the dashed line $A_1$-$A_1$ depicted in FIG. 1B, which identifies the position and orientation of the simplified, partial longitudinal cross-sectional view of the microelectronic device structure 100 shown in FIG. 1A, horizontally extends diagonal to each of the X-direction (e.g., first horizontal direction) and the Y-direction (e.g., second horizontal direction orthogonal to the first horizontal direction) shown in FIG. 1A. Put another way, the horizontal orientation of the dashed line $A_1$-$A_1$ depicted in FIG. 1B (and, hence, the longitudinal cross-sectional view of FIG. 1A), is acutely angled relative to each of the X-direction and the Y-direction shown in FIG. 1B. Accordingly, it will be appreciated that the horizontal orientations some features (e.g., some structures, some devices, some regions) of the microelectronic device structure 100 depicted in FIG. 1A and described in further details below, such as (but without limitation) some features within a sub-section $B_1$ shown in FIGS. 1A and 1B, are also acutely angled relative to each of the X-direction and the Y-direction shown in FIG. 1B.

Referring to FIG. 1A, the tiers 110 of the stack structure 104 may be grouped into different tier sections 111. The tier sections 111 may include an access line tier section 111A, a stacked select gate drain (SGD) tier section 111B overlying the access line tier section 111A, and a sense node tier section 111C overlying the stacked SGD tier section 111B. In addition, the tier sections 111 of the stack structure 104 may further include a source side select (SGS) gate tier section 111D underlying the access line tier section 111A. As described in further details below, during use and operation of a microelectronic device including the microelectronic device structure 100, at least some of the tiers 110 within the stacked SGD tier section 111B may be employed to select different sub-blocks 114 within individual blocks 164 (FIG. 1B) of the stack structure 104; and at least some other of the tiers 110 within the sense node tier section 111C may be employed for capacitive-sense operations (amongst other operations) for the individual blocks 164 (FIG. 1B) of the stack structure 104.

As shown in FIG. 1A, a first group of the tiers 110 of the stack structure 104 within the access line tier section 111A may include an active access line tier 110A, and a dummy access line tier 110B overlying the active access line tier 110A. For an individual block 164 (FIG. 1B) of the stack structure 104, a conductive structure 106 of the active access line tier 110A may be employed as a so-called "active" access line structure facilitating electrical communication between two or more components (e.g., memory cells, string drivers) of a microelectronic device including the microelectronic device structure 100; and a conductive structure 106 of the dummy access line tier 110B may be employed as a so-called "dummy" access line structure that does not facilitate electrical communication between two or more components (e.g., memory cells, string drivers) of a microelectronic device including the microelectronic device structure 100. While FIG. 1A only depicts the access line tier section 111A as including one (1) active access line tier 110A and one (1) dummy access line tier 110B the disclosure is not so limited. Rather, the access line tier section 111A may include greater than one active access line tier 110A (e.g., greater than or equal to eight (8) active access line tiers 110A, greater than or equal to sixteen (16) active access line tiers 110A, greater than or equal to thirty-two (32) active access line tiers 110A, greater than or equal to sixty-four (64) active access line tiers 110A, greater than or equal to one-hundred twenty-eight (128) active access line tiers 110A, greater than or equal to two-hundred fifty-six (256) active access line tiers 110A); and/or greater than one dummy access line tier 110B (e.g., greater than or equal to two (2) dummy access line tiers 110B).

Still referring to FIG. 1A, a second group of the tiers 110 of the stack structure 104 within the stacked SGD tier section 111B may include a program-inhibit SGD tier 110C overlying the dummy access line tier 110B, a first SGD bar tier 110D (e.g., a first "complementary" SGD tier) overlying the program-inhibit SGD tier 110C, a second SGD bar tier 110E (e.g., a second "complementary" SGD tier) overlying the first SGD bar tier 110D, a first SGD tier 110F (e.g., a first "true" SGD tier) overlying the second SGD bar tier 110E, a second SGD tier 110G (e.g., a second "true" SGD tier) overlying the first SGD tier 110F, and a read-amplification SGD tier 110H overlying the second SGD tier 110G. For an individual block 164 (FIG. 1B) of the stack structure 104, a conductive structure 106 of the program-inhibit SGD tier 110C may be employed as a program-inhibit SGD structure; a conductive structure 106 of the first SGD bar tier 110D may be employed as a first SGD bar structure; a conductive structure 106 of the second SGD bar tier 110E may be employed as a second SGD bar structure; a conductive structure 106 of the first SGD tier 110F may be employed as a first SGD structure; a conductive structure 106 of the second SGD tier 110G may be employed as a second SGD structure; and a conductive structure 106 of the read-amplification SGD tier 110H may be employed as a read-amplification SGD structure.

With continued reference to FIG. 1A, a third group of the tiers 110 of the stack structure 104 within the sense node tier section 111C may include a first select gate programming (SGP) bar tier 110I (e.g., a first "complementary" SGP tier) overlying the read-amplification SGD tier 110H, a second SGP bar tier 110J (e.g., a second "complementary" SGP tier) overlying the first SGP bar tier 110I, a first SGP tier 110K (e.g., a first "true" SGP tier) overlying the second SGP bar tier 110J, a second SGP tier 110L (e.g., a second "true" SGP tier) overlying the first SGP tier 110K, and a gate-induced drain-leakage (GIDL) generation (GG) tier 110M overlying the second SGP tier 110L. For an individual block 164 (FIG. 1B) of the stack structure 104, a conductive structure 106 of the first SGP bar tier 110I may be employed as a first SGP bar structure; a conductive structure 106 of the second SGP bar tier 110J may be employed as a second SGD bar structure; a conductive structure 106 of the first SGP tier 110K may be employed as a first SGP structure; a conductive structure 106 of the second SGP tier 110L may be employed as a second SGP structure; and a conductive structure 106 of the GG tier 110M may be employed as a GG structure. As described in further detail below, portions of different tiers 110 (e.g., the first SGP bar tier 110I, the second SGP bar tier 110J, the first SGP tier 110K, the second SGP tier 110L) within the stacked SGD tier section 111B may be doped with one or more conductivity-enhancing species (e.g., N-type dopant, P-type dopant) that permit horizontally neighboring select transistors within vertical boundaries of an individual tier 110 of the sense node tier section 111C to have different threshold voltage ($V_t$) properties than one another. The third group of the tiers 110 of the stack structure 104 within the sense node tier section 111C facilitate associating different pillar structures 122 vertically extending through an individual block 164 (FIG. 1B) with different sub-blocks 114 of the block 164 (FIG. 1B) by programming selected transistors at vertical elevations of different tiers 110 within the sense node tier section 111C to desired $V_t$ levels, as described in further detail below.

Optionally, one or more additional "dummy" tiers (e.g., in additional to the dummy access line tiers 110B) may be included within the stack structure 104, vertically between two or more other of the tiers 110. A conductive structure 106 of an individual additional dummy tier may be employed as an additional so-called "dummy" structure that does not facilitate electrical communication between two or more components of a microelectronic device including the microelectronic device structure 100. If included, additional dummy tier(s) may be utilized to mitigate so-called "trap-up" and "downshift" of $V_t$ by relaxing the electric field between devices in ON and OFF state. An additional dummy tier may be biased at intermediate potential to mitigate (e.g., avoid) a too abrupt potential difference between the tiers at HIGH and LOW biases. As a non-limiting example, an additional dummy tier may be vertically interposed between the program-inhibit SGD tier 110C and the first SGD bar tier 110D. As another non-limiting example, an additional dummy tier may be vertically interposed between the second SGD tier 110G and the read-amplification SGD tier 110H. As a further non-limiting example, an additional dummy tier may be vertically interposed between the read-amplification SGD tier 110H and the first SGP bar tier 110I.

Still referring to FIG. 1A, the pillar structures 122 may vertically extend completely through the tiers 110 of the stack structure 104. For example, the pillar structures 122 may individually extend through each of the sense node tier section 111C, the stacked SGD tier section 111B, the access line tier section 111A, and the SGS gate tier section 111D, and to or into the base structure 102. As described in further detail below, the pillar structures 122 may each individually be formed of and include a stack of materials. By way of non-limiting example, each of the pillar structures 122 may be formed to include a charge-blocking material, such as first dielectric oxide material (e.g., $SiO_x$, such as $SiO_2$; $AlO_x$, such as $Al_2O_3$); a charge-trapping material, such as a dielectric nitride material (e.g., $SiN_y$, such as $Si_3N_4$); a gate dielectric material, such as a second dielectric oxide material (e.g., $SiO_x$, such as $SiO_2$); a channel material, such as a semiconductor material (e.g., silicon, such as polycrystalline silicon); and a dielectric fill material (e.g., a dielectric oxide, a dielectric nitride, air). The charge-blocking material may be formed on or over surfaces of the conductive structures 106 and the insulative structures 108 of the tiers 110 of stack structure 104 at least partially defining horizontal boundaries of the pillar structures 122; the charge-trapping material may be horizontally surrounded by the charge-blocking material; the gate dielectric material may be horizontally surrounded by the charge-trapping material; the channel material may be horizontally surrounded by the gate dielectric material; and the dielectric fill material may be horizontally surrounded by the channel material.

The pillar structures 122 may individually exhibit a desirable geometric configuration (e.g., dimensions, shape), and may also be distributed relative to one another in a desirable manner within horizontal areas of the blocks 164 (FIG. 1B), of the stack structure 104. The pillar structures 122 may individually exhibit a critical dimension (CD) (e.g., maximum horizontal dimension) less than about 120 nanometers (nm), such as less than or equal to about 110 nm, less than or equal to about 100 nm, less than or equal to about 90 nm, or less than or equal to about 80 nm. In some embodiments, the pillar structures 122 individually exhibit a CD within a range of from about 70 nm to about 80 nm. A pitch between pillar structures 122 horizontally neighboring one another may be less than about 140 nm, such as less than or equal to about 130 nm, less than or equal to about 120 nm, less than or equal to about 110 nm, or less than or equal to about 100 nm. In some embodiments, a pitch between pillar structures 122 horizontally neighboring one another is within a range of from about 90 nm to about 100 nm. A taper of each pillar structure 122, as defined by the difference between a largest horizontal dimension of the pillar structure 122 (e.g., at an upper vertical boundary thereof) and a smallest horizontal dimension of the pillar structure 122 (e.g., at a lower vertical boundary thereof), may be less than or equal to about 20 nm, such as less than or equal to about 19 nm, or less than or equal to about 18 nm. In some embodiments, a taper of each pillar structure 122 is within a range of from about 16 nm to about 18 nm. In addition, as shown in FIG. 1B, in some embodiments, each block 164 of the stack structure 104 exhibits a hexagonal distribution (e.g., a hexagonal pattern) of the pillar structures 122. As described in further detail below, the horizontal dimensions and pitch of the pillar structures 122 may respectively be relatively smaller than those for conventional pillar structures as a result of lower sense current (I sense) requirements facilitated by the configuration of the microelectronic device structure 100 relative to conventional configurations.

Referring to FIG. 1A, intersections of the pillar structures 122 and the conductive structures 106 of the active access line tiers (e.g., the active access line tier 110A) within the access line tier section 111A of the stack structure 104 may define vertically extending strings of memory cells 121 coupled in series with one another within the stack structure 104. As shown in FIG. 1A, intersections of the pillar structures 122 and the conductive structure 106 of the active access line tier 110A may define memory cells 121 at the horizontal positions of the pillar structures 122 and at the vertical position of the conductive structure 106. Intersections of the pillar structures 122 and the conductive structures 106 of additional active access line tiers vertically underling the active access line tier 110A may define more of the memory cells 121 at the horizontal positions of the pillar structures 122 and at the vertical positions of the conductive structures 106 of the additional active access line tiers. In some embodiments, the memory cells 121 formed at the intersections of the conductive structures 106 of the active access line tiers (e.g., the active access line tier 110A) and the pillar structures 122 within access line tier section 111A comprise so-called "MONOS" (metal-oxide-nitride-oxide-semiconductor) memory cells. In additional embodiments, the memory cells 121 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 121 comprise so-called "floating gate" memory cells including floating gates (e.g., metallic floating gates) as charge storage structures. The floating gates may horizontally intervene between central structures of the pillar structures 122 and the conductive structures 106 of the different active access line tiers (e.g., the active access line tier 110A) of the stack structure 104. The vertically extending strings of memory cells 121 together form at least one memory array within the stack structure 104.

Intersections of the pillar structures 122 and the conductive structures 106 within the tiers 110 of the sense node tier section 111C, the stacked SGD tier section 111B, and the SGS gate tier section 111D of the stack structure 104 may define different select transistors 123 coupled in series with the vertically extending strings of memory cells 121. As described in further detail below, the select transistors 123 within the sense node tier section 111C, the stacked SGD tier section 111B, and the SGS gate tier section 111D of the stack structure 104 may be employed for various memory array operations (e.g., program operations, erase operations, read operations) during use and operation of a microelectronic device including the microelectronic device structure 100.

Still referring to FIG. 1A, the microelectronic device structure 100 includes different threshold voltage ($V_t$)-enhanced sections 118 at different vertical and horizontal positions therein. By way of non-limiting example, within horizontal areas of the blocks 164 (FIG. 1B), the microelectronic device structure 100 may include $V_t$-enhanced sections 118 at vertical positions of at least some of the tiers 110 of the stack structure 104 within the stacked SGD tier section 111B and the sense node tier section 111C. Some of the $V_t$-enhanced sections 118 may include portions of a tier 110 of the stack structure 104 doped with at least one conductivity-enhancing species (e.g., at least one P-type dopant), as well as portions of one or more pillar structures 122 doped with the at least one conductivity-enhancing species. Some other of the $V_t$-enhanced sections 118 may include portions of a tier 110 of the stack structure 104 not doped with at least one conductivity-enhancing species, and portions of one or more pillar structures 122 also not doped with the at least one conductivity-enhancing species. Even in the absence of the conductivity-enhancing species within boundaries thereof, an individual $V_t$-enhanced section 118 may be considered to be "$V_t$-enhanced" as a result of device (e.g., transistor) $V_t$ characteristics facilitated within the boundaries thereof by way of configurations of additional features (e.g., SGD plug structures) of the microelectronic device structure 100 in conjunction with programming operations performed for a microelectronic device including microelectronic device structure 100, as described in further detail below. For example, a select transistor 123 associated with a portions of pillar structure 122 within vertical and horizontal boundaries of an individual $V_t$-enhanced section 118 substantially free of conductivity-enhancing species may be provided with enhanced $V_t$ characteristics due, in part, to a material composition (e.g., N-type doped semiconductive material) of an SGD plug structure coupled to the pillar structure 122, as described in further detail below. Within a horizontal area of an individual block 164 (FIG. 1B) of the stack structure 104, each $V_t$-enhanced section 118 may individually vertically overlap at least the conductive structure 106 of one (1) of the tiers 110 of the stack structure 104, and may encompass at least two (2) horizontally neighboring pillar structures 122 within different sub-blocks 114 than one another. An individual $V_t$-enhanced section 118 may be substantially confined within horizontal boundaries of an individual sub-block group 116 of the block 164 (FIG. 1B), or may horizontally extend at least partially across and between at least two (2) horizontally neighboring sub-block groups 116 of the block 164 (FIG. 1B).

The $V_t$-enhanced sections 118 of the microelectronic device structure 100 may be used to provide different select transistors 123 within the stacked SGD tier section 111B and the sense node tier section 111C of the stack structure 104 with desired $V_t$ characteristics. For example, within an individual block 164 (FIG. 1B) of the stack structure 104, the $V_t$-enhanced sections 118 may be configured such that some horizontally neighboring select transistors 123 substantially vertically aligned with one another (e.g., within the same tier 110 as one another) and operatively associated with pillar structures 122 in different sub-blocks 114 of the block 164 (FIG. 1B) than one another have different $V_t$ characteristics (e.g., are set to different $V_t$ levels) than one another; and such that some other horizontally neighboring select transistors 123 substantially vertically aligned with one another and operatively associated with pillar structures 122 in different sub-blocks 114 of the block 164 (FIG. 1B) than one another have substantially the same $V_t$ characteristics (e.g., are set to the same $V_t$ levels) as one another. As another example, within an individual block 164 (FIG. 1B) of the stack structure 104, the $V_t$-enhanced sections 118 may be configured such that some vertically neighboring select transistors 123 operatively associated with the same pillar structure 122 as one another have substantially the same $V_t$ characteristics (e.g., are set to the same $V_t$ levels) as one another; and such that such that some other vertically neighboring select transistors 123 operatively associated with the same pillar structure 122 as one another have different $V_t$ properties (e.g., are set to different $V_t$ levels) than one another. As an additional example, within an individual block 164 (FIG. 1B) of the stack structure 104, the $V_t$-enhanced sections 118 may be configured such that some select transistors 123 vertically and horizontally neighboring one another and operatively associated with pillar structures 122 in different sub-blocks 114 of the block 164 (FIG. 1B) than one another have different $V_t$ properties (e.g., are set to different $V_t$ levels) than one another; and such that some other select transistors 123 vertically and horizontally neighboring one another and operatively associated with pillar structures 122 in different sub-blocks 114 of the block 164 (FIG. 1B) than one another have substantially the same $V_t$ properties (e.g., are set to the same $V_t$ levels) as one another.

As shown in FIG. 1A, in some embodiments, the $V_t$-enhanced sections 118 of the microelectronic device structure 100 include first $V_t$-enhanced sections 118A at a vertical elevation of the program-inhibit SGD tier 110C; second $V_t$-enhanced sections 118B at a vertical elevation of the first SGD bar tier 110D; third $V_t$-enhanced sections 118C at a vertical elevation the second SGD bar tier 110E; fourth $V_t$-enhanced sections 118D at a vertical elevation of the first SGD tier 110F; fifth $V_t$-enhanced sections 118E at a vertical elevation of the second SGD tier 110G; sixth $V_t$-enhanced sections 118E at a vertical elevation of the read-amplification SGD tier 110H; seventh $V_t$-enhanced sections 118G at a vertical elevation of the first SGP bar tier 110I; eighth $V_t$-enhanced sections 118H at a vertical elevation of the second SGP bar tier 110J; ninth $V_t$-enhanced sections 118I at a vertical elevation of the first SGP tier 110K; and tenth $V_t$-enhanced sections 118J at a vertical elevation of the second SGP tier 110L. Within an individual sub-block group 116 of an individual block 164 (FIG. 1B), different $V_t$-enhanced sections 118 may encompass different sub-blocks 114 of the sub-block group 116. Non-limiting examples of configurations of some of the $V_t$-enhanced sections 118 within a horizontal area of the sub-section $B_1$ of the microelectronic device structure 100 shown in FIGS. 1A and 1B are described in further detail below.

Referring to FIG. 1A, within a horizontal area of the sub-section $B_1$ of the microelectronic device structure 100, one first $V_t$-enhanced section 118A may encompass portions of the first sub-block 114A, the second sub-block 114B, the third sub-block 114C, and the fourth sub-block 114D of the third sub-block group 116C. The first $V_t$-enhanced section 118A may comprise portions of the program-inhibit SGD tier 110C, as well as portions of four (4) of the pillar structures 122 at the vertical position of the program-inhibit SGD tier 110C. The four (4) of the pillar structures 122 may include a first pillar structure 122A, a second pillar structure 122B, a third pillar structure 122C, and a fourth pillar structure 122D. The four (4) of the pillar structures 122 may be included in one (1) of multiple pillar groups 124 of within horizontal boundaries of the third sub-block group 116C, wherein each of the pillar groups 124 individually includes four (4) pillar structures 122 that are different than four (4) other pillar structures 122 of each other of the pillar groups 124. Each of the four (4) of the pillar structures 122 within the horizontal area of the sub-section $B_1$ may be positioned in a different one of the first sub-block 114A, the second sub-block 114B, the third sub-block 114C, and the fourth sub-block 114D of the third sub-block group 116C than each other of the four (4) of the pillar structures 122. The first $V_t$-enhanced section 118A may be substantially free of conductivity-enhancing species (e.g., P-type dopants, N-type dopants) therein. Select transistors 123 within the first $V_t$-enhanced section 118A may be configured (e.g., programmed) to have substantially the same $V_t$ characteristics as one another.

Within the horizontal area of the sub-section B 1 of the microelectronic device structure 100, one second $V_t$-enhanced section 118B may encompass portions of the third sub-block 114C and the fourth sub-block 114D of the third sub-block group 116C. The second $V_t$-enhanced section 118B may not encompass portions of either of the first sub-block 114A and the second sub-block 114B of the third sub-block group 116C. The second $V_t$-enhanced section 118B may comprise portions of the first SGD bar tier 110D, as well as portions of two (2) of the pillar structures 122 of the pillar group 124 at the vertical position of the first SGD bar tier 110D. In some embodiments, the two (2) of the pillar structures 122 include the third pillar structure 122C and the fourth pillar structure 122D. The second $V_t$-enhanced section 118B may not include portions of the other two (2) of the pillar structures 122 of the pillar group 124. In some embodiments, the other two (2) of the pillar structures 122 include the first pillar structure 122A and the second pillar structure 122B. The second $V_t$-enhanced section 118B may be substantially free of conductivity-enhancing species (e.g., P-type dopants, N-type dopants) therein. Select transistors 123 within the second $V_t$-enhanced section 118B may be configured (e.g., programmed) to have substantially the same $V_t$ characteristics as one another.

Within the horizontal area of the sub-section $B_1$ of the microelectronic device structure 100, one third $V_t$-enhanced section 118C may encompass portions of the second sub-block 114B and the third sub-block 114C of the third sub-block group 116C. The third $V_t$-enhanced section 118C may not encompass portions of either of the first sub-block 114A and the fourth sub-block 114D of the third sub-block group 116C. The third $V_t$-enhanced section 118C may comprise portions of the second SGD bar tier 110E doped with at least one conductivity-enhancing species, as well as portions of two (2) of the pillar structures 122 of the pillar group 124 at the vertical position of the second SGD bar tier 110E. In some embodiments, the two (2) of the pillar structures 122 include the second pillar structure 122B and the third pillar structure 122C. The third $V_t$-enhanced section 118C may not include portions of the other two (2) of the pillar structures 122 of the pillar group 124. In some embodiments, the other two (2) of the pillar structures 122 include the first pillar structure 122A and the fourth pillar structure 122D. The third $V_t$-enhanced section 118C may be substantially free of conductivity-enhancing species (e.g., P-type dopants, N-type dopants) therein. Select transistors 123 within the third $V_t$-enhanced section 118C may be configured (e.g., programmed) to have substantially the same $V_t$ characteristics as one another.

Within the horizontal area of the sub-section $B_1$ of the microelectronic device structure 100, one fourth $V_t$-enhanced section 118D may encompass portions of the first sub-block 114A and the second sub-block 114B of the third sub-block group 116C. The fourth $V_t$-enhanced section 118D may not encompass portions of either of the third sub-block 114C and the fourth sub-block 114D of the third sub-block group 116C. The fourth $V_t$-enhanced section 118D may comprise portions of the first SGD tier 110F doped with at least one conductivity-enhancing species, as well as portions of two (2) of the pillar structures 122 of the pillar group 124 at the vertical position of the first SGD tier 110F. In some embodiments, the two (2) of the pillar structures 122 include the first pillar structure 122A and the second pillar structure 122B. The fourth $V_t$-enhanced section 118D may not include portions of the other two (2) of the pillar structures 122 of the pillar group 124. In some embodiments, the other two (2) of the pillar structures 122 include the third pillar structure 122C and the fourth pillar structure 122D. The fourth $V_t$-enhanced section 118D may be substantially free of conductivity-enhancing species (e.g., P-type dopants, N-type dopants) therein. Select transistors 123 within the fourth $V_t$-enhanced section 118D may be configured (e.g., programmed) to have substantially the same $V_t$ characteristics as one another.

Within the horizontal area of the sub-section $B_1$ of the microelectronic device structure 100, one fifth $V_t$-enhanced section 118E may encompass a portion of the first sub-block 114A and another fifth $V_t$-enhanced section 118E may encompass a portion of the fourth sub-block 114D. Neither of the fifth $V_t$-enhanced sections 118E may encompass portions of either of the second sub-block 114B and the third sub-block 114C of the third sub-block group 116C. The fifth $V_t$-enhanced sections 118E may comprise portions of the second SGD tier 110G doped with at least one conductivity-enhancing species, as well as portions of two (2) of the pillar structures 122 of the pillar group 124 at the vertical position of the second SGD tier 110G. In some embodiments, the two (2) of the pillar structures 122 include the first pillar structure 122A and the fourth pillar structure 122D. The fifth $V_t$-enhanced sections 118E may not include portions of the other two (2) of the pillar structures 122 of the pillar group 124. In some embodiments, the other two (2) of the pillar structures 122 include the second pillar structure 122B and the third pillar structure 122C. The fifth $V_t$-enhanced sections 118E may be substantially free of conductivity-enhancing species (e.g., P-type dopants, N-type dopants) therein. Select transistors 123 within the fifth $V_t$-enhanced sections 118E may be configured (e.g., programmed) to have substantially the same $V_t$ characteristics as one another.

Within the horizontal area of the sub-section $B_1$ of the microelectronic device structure 100, one sixth $V_t$-enhanced section 118F may encompass portions of the first sub-block 114A, the second sub-block 114B, the third sub-block 114C, and the fourth sub-block 114D of the third sub-block group 116C. The sixth $V_t$-enhanced section 118F may comprise portions of the read-amplification SGD tier 110H doped with at least one conductivity-enhancing species, as well as portions of all four (4) of the pillar structures 122 of the pillar structures 122 of the pillar group 124 at the vertical position of the read-amplification SGD tier 110H. The sixth $V_t$-enhanced section 118F may be substantially free of conductivity-enhancing species (e.g., P-type dopants, N-type dopants) therein. Select transistors 123 within the sixth $V_t$-enhanced section 118F may be configured (e.g., programmed) to have substantially the same $V_t$ characteristics as one another.

Within the horizontal area of the sub-section $B_1$ of the microelectronic device structure 100, one seventh $V_t$-enhanced section 118G may encompass portions of the third sub-block 114C and the fourth sub-block 114D of the third sub-block group 116C. The seventh $V_t$-enhanced section 118G may not encompass portions of either of the first sub-block 114A and the second sub-block 114B of the third sub-block group 116C. The seventh $V_t$-enhanced section 118G may comprise portions of the first SGP bar tier 110I doped with at least one conductivity-enhancing species, as well as portions of two (2) of the pillar structures 122 of the pillar group 124 at the vertical position of the first SGP bar tier 110I. In some embodiments, the two (2) of the pillar structures 122 include the third pillar structure 122C and the fourth pillar structure 122D. The seventh $V_t$-enhanced section 118G may not include portions of the other two (2) of the pillar structures 122 of the pillar group 124. In some embodiments, the other two (2) of the pillar structures 122 include the first pillar structure 122A and the second pillar structure 122B. The seventh $V_t$-enhanced section 118G may be substantially free of conductivity-enhancing species (e.g., P-type dopants, N-type dopants) therein. Select transistors 123 within the seventh $V_t$-enhanced section 118G may be configured (e.g., programmed) to have substantially the same $V_t$ characteristics as one another.

Within the horizontal area of the sub-section $B_1$ of the microelectronic device structure 100, one eighth $V_t$-enhanced section 118H may encompass portions of the second sub-block 114B and the third sub-block 114C of the third sub-block group 116C. The eighth $V_t$-enhanced section 118H may not encompass portions of either of the first sub-block 114A and the fourth sub-block 114D of the third sub-block group 116C. The eighth $V_t$-enhanced section 118H may comprise portions of the second SGP bar tier 110J doped with at least one conductivity-enhancing species, as well as portions of two (2) of the pillar structures 122 of the pillar group 124 at the vertical position of the second SGP bar tier 110J. In some embodiments, the two (2) of the pillar structures 122 include the second pillar structure 122B and the third pillar structure 122C. The eighth $V_t$-enhanced section 118H may not include portions of the other two (2) of the pillar structures 122 of the pillar group 124. In some embodiments, the other two (2) of the pillar structures 122 include the first pillar structure 122A and the fourth pillar structure 122D. The eighth $V_t$-enhanced section 118H may be substantially free of conductivity-enhancing species (e.g., P-type dopants, N-type dopants) therein. Select transistors 123 within the eighth $V_t$-enhanced section 118H may be configured (e.g., programmed) to have substantially the same $V_t$ characteristics as one another.

Within the horizontal area of the sub-section $B_1$ of the microelectronic device structure 100, one ninth $V_t$-enhanced section 118I may encompass portions of the first sub-block 114A and the second sub-block 114B of the third sub-block group 116C. The ninth $V_t$-enhanced section 118I may not encompass portions of either of the third sub-block 114C and the fourth sub-block 114D of the third sub-block group 116C. The ninth $V_t$-enhanced section 118I may comprise portions of the first SGP tier 110K doped with at least one conductivity-enhancing species, as well as portions of two (2) of the pillar structures 122 of the pillar group 124 at the vertical position of the first SGP tier 110K. In some embodiments, the two (2) of the pillar structures 122 include the first pillar structure 122A and the second pillar structure 122B. The ninth $V_t$-enhanced section 118I may not include portions of the other two (2) of the pillar structures 122 of the pillar group 124. In some embodiments, the other two (2) of the pillar structures 122 include the third pillar structure 122C and the fourth pillar structure 122D. The ninth $V_t$-enhanced section 118I may be doped with one or more conductivity-enhancing species (e.g., at least one P-type dopant, such as one or more of boron (B), aluminum (Al), and gallium (Ga)). In some embodiments, the ninth $V_t$-enhanced section 118I is doped with B. The ninth $V_t$-enhanced section 118I may permit select transistors 123 associated with the two (2) of the pillar structures 122 at the vertical elevation of the first SGP tier 110K to have substantially the same $V_t$ characteristics as one another; and may also permit select transistors 123 associated with the other two (2) of the pillar structures 122 to have substantially the same $V_t$ characteristics as one another that are different than the $V_t$ characteristics of the two (2) of the pillar structures 122. In some embodiments, the select transistors 123 associated with the two (2) of the pillar structures 122 at the vertical elevation of the first SGP tier 110K comprise relatively higher $V_t$ transistors; and the select transistors 123 associated with the other two (2) of the pillar structures 122 at the vertical elevation of the first SGP tier 110K comprise relatively lower $V_t$ transistors.

Within the horizontal area of the sub-section $B_1$ of the microelectronic device structure 100, one tenth $V_t$-enhanced section 118J may encompass a portion of the first sub-block 114A and another tenth $V_t$-enhanced section 118J may encompass a portion of the fourth sub-block 114D. Neither of the tenth $V_t$-enhanced sections 118J may encompass portions of either of the second sub-block 114B and the third sub-block 114C of the third sub-block group 116C. The tenth $V_t$-enhanced sections 118J may comprise portions of the second SGP tier 110L doped with at least one conductivity-enhancing species, as well as portions of two (2) of the pillar structures 122 of the pillar group 124 at the vertical position of the second SGP tier 110L. In some embodiments, the two (2) of the pillar structures 122 include the first pillar structure 122A and the fourth pillar structure 122D. The tenth $V_t$-enhanced sections 118J may not include portions of the other two (2) of the pillar structures 122 of the pillar group 124. In some embodiments, the other two (2) of the pillar structures 122 include the second pillar structure 122B and the third pillar structure 122C. The tenth $V_t$-enhanced sections 118J may be doped with one or more conductivity-enhancing species (e.g., at least one P-type dopant, such as one or more of B, Al, and Ga). In some embodiments, the tenth $V_t$-enhanced sections 118J are doped with B. The tenth $V_t$-enhanced sections 118J may permit select transistors 123 associated with the two (2) of the pillar structures 122 at the vertical elevation of the second SGP tier 110L to have substantially the same $V_t$ characteristics as one another; and may also permit select transistors 123 associated with the other two (2) of the pillar structures 122 to have substantially the same $V_t$ characteristics as one another that are different than the $V_t$ characteristics of the two (2) of the pillar structures 122. In some embodiments, the select transistors 123 associated with the two (2) of the pillar structures 122 at the vertical elevation of the second SGP tier 110L comprise relatively higher $V_t$ transistors; and the select transistors 123 associated with the other two (2) of the pillar structures 122 at the vertical elevation of the second SGP tier 110L comprise relatively lower $V_t$ transistors.

Collectively referring to FIGS. 1A and 1B, the SGD plug tier 127 may include multiple (e.g., more than one, a plurality of) SGD plug structures 126. The SGD plug structures 126 may vertically overlie the pillar structures 122, and may individually horizontally extend across and between four (4) of the pillar structures 122 of an individual pillar group 124. An individual SGD plug structure 126 may be in electrical communication with each of the four (4) of the pillar structures 122 of an individual pillar group 124. For example, as shown in FIG. 1A, within the horizontal area of the sub-section $B_1$ of the microelectronic device structure 100, one (1) of the SGD plug structures 126 may vertically overlie and be coupled to each of the first pillar structure 122A, the second pillar structure 122B, the third pillar structure 122C, and the fourth pillar structure 122D of an individual pillar group 124 within the third sub-block group 116C of an individual block 164 (FIG. 1B) of the stack structure 104. The first pillar structure 122A may be located within the first sub-block 114A of the third sub-block group 116C; the second pillar structure 122B may be located within the second sub-block 114B of the third sub-block group 116C; the third pillar structure 122C may be located within the third sub-block 114C of the third sub-block group 116C; and the fourth pillar structure 122D may be located within the fourth sub-block 114D of the third sub-block group 116C. Accordingly, an individual SGD plug structure 126 may be coupled to each of four (4) pillar structures 122 (and, hence, the select transistors 123 and the strings of memory cells 121 that are operatively associated with each of the four (4) of the pillar structures 122) in different sub-blocks 114 than one another within an individual block 164 (FIG. 1B).

Referring to FIG. 1B, some of the SGD plug structures 126 may horizontally extend in parallel with one another, and some other of the SGD plug structures 126 may horizontally extend in series with one another. SGD plug structures 126 within a horizontal area of the same sub-block group 116 (e.g., the first sub-block group 116A, the second sub-block group 116B, the third sub-block group 116C, or the fourth sub-block group 116D) as one another may horizontally extend in parallel with one another in a direction acutely angled relative to each of the X-direction and the Y-direction shown in FIG. 1B. In addition, at least some SGD plug structures 126 within horizontal areas of different sub-block groups 116 than one another may horizontally extend in series with one another in the direction acutely angled relative to each of the X-direction and the Y-direction shown in FIG. 1B.

The SGD plug structures 126 may individually be formed of and include conductive material. By way of non-limiting example, the SGD plug structures 126 may each individually formed of and include semiconductor material (e.g., polycrystalline silicon) doped with doped with at least one conductivity-enhancing dopant (e.g., at least one N-type dopant, such as one or more of P, As, Sb, and Bi; at least one P-type dopant, such as one or more of B, Al, and Ga). In some embodiments, the SGD plug structures 126 may each individually formed of and include N-type polycrystalline silicon (e.g., polycrystalline silicon doped with at least one N-type dopant, such as polycrystalline silicon doped with P). Each of the SGD plug structures 126 may individually be substantially homogeneous, or one or more of the SGD plug structures 126 may individually be substantially heterogeneous. In some embodiments, each of the SGD plug structures 126 is substantially homogeneous.

Referring to FIG. 1A, the SGD plug structures 126, portions of the sense node tier section 111C within horizontal areas of the SGD plug structures 126, and portions of the pillar structures 122 within horizontal areas of the SGD plug structures 126 and within vertical boundaries of the sense node tier section 111C may together form sense nodes 112 of the microelectronic device structure 100. Each sense node 112 may individually be positioned within a horizontal area of an individual sub-block group 116 of an individual block 164 (FIG. 1B) of the stack structure 104, and may vertically overlie the stacked SGD tier section 111B (and, hence, the access line tier section 111A, and the strings of memory cells 121) of the stack structure 104. An individual sense node 112 may include a group of the select transistors 123 within a horizontal area of the SGD plug structure 126 of sense node 112 and within vertical boundaries of the sense node tier section 111C. For example, an individual sense node 112 within the horizontal area of the sub-section $B_1$ of the microelectronic device structure 100 shown in FIG. 1A may include one (1) of the SGD plug structures 126, as well as the select transistors 123 formed at the intersections of the four (4) pillar structures 122 (e.g., the first pillar structure 122A, the second pillar structure 122B, the third pillar structure 122C, and the fourth pillar structure 122D) coupled to the SGD plug structures 126 and the conductive structures 106 of tiers 110 (e.g., the first SGP bar tier 110I, the second SGP bar tier 110J, the first SGP tier 110K, the second SGP tier 110L) of the sense node tier section 111C and the four (4) pillar structures 122 (e.g., the first pillar structure 122A, the second pillar structure 122B, the third pillar structure 122C, and the fourth pillar structure 122D). The sense nodes 112 within horizontal areas of blocks 164 (FIG. 1B) of the stack structure 104 may facilitate capacitive-sense on block functionality for the microelectronic device structure 100, as described in further detail below.

Still referring to FIG. 1A, the microelectronic device structure 100 further includes a channel tier 132 including channel structures 134 vertically interposed between the SGD plug tier 127 and the selector tiers 138. The channel structures 134 may horizontally overlap the SGD plug structures 126. In some embodiments, the channel structures 134 are substantially confined within horizontal areas of the SGD plug structures 126, and exhibit horizontal areas relatively smaller than the horizontal areas of the SGD plug structures 126. For example, an individual channel structure 134 may horizontally extend across a portion of an individual SGD plug structure 126 that covers less than all of the pillar structures 122 coupled to the SGD plug structure 126, such as only three (3) of the four (4) pillar structures 122 coupled to the SGD plug structure 126. In some embodiments, an individual channel structure 134 horizontally overlaps three (3) of the pillar structures 122 (e.g., the second pillar structure 122B, the third pillar structure 122C, the fourth pillar structure 122D) coupled to an individual SGD plug structure 126, but does not substantially horizontally overlap a final one (1) of the pillar structures 122 (e.g., the first pillar structure 122A) coupled to the SGD plug structure 126.

Referring to FIG. 1B, some of the channel structures 134 may horizontally extend in parallel with one another, and some other of the channel structures 134 may horizontally extend in series with one another. Channel structures 134 within a horizontal area of the same sub-block group 116 (e.g., the first sub-block group 116A, the second sub-block group 116B, the third sub-block group 116C, or the fourth sub-block group 116D) as one another may horizontally extend in parallel with one another in a direction acutely angled relative to each of the X-direction and the Y-direction shown in FIG. 1B. In addition, at least some channel structures 134 within horizontal areas of different sub-block groups 116 than one another may horizontally extend in series with one another in the direction acutely angled relative to each of the X-direction and the Y-direction shown in FIG. 1B.

The channel structures 134 of the channel tier 132 may individually be formed of and include at least one semiconductor material, such as one or more of silicon, germanium, at least one compound semiconductor material, and at least one oxide semiconductor material. In some embodiments, the channel structures 134 are formed of and include polycrystalline silicon. In additional embodiments, the channel structures 134 are formed of and include oxide semiconductor material. Each of the channel structures 134 may individually be substantially homogeneous, or one or more of the channel structures 134 may individually be substantially heterogeneous. In some embodiments, each of the channel structures 134 is substantially homogeneous. The semiconductor material of the channel structures 134 may be doped with one or more conductivity-enhancing species (e.g., P-type dopant, N-type dopant), or the semiconductor material of the channel structures 134 may not be doped one or more conductivity-enhancing species. In some embodiments, the channel structures 134 are each individually formed of and include P-type polycrystalline silicon (e.g., polycrystalline silicon doped with at least one P-type dopant, such as polycrystalline silicon doped with B).

Still referring to FIG. 1A, a gate dielectric tier 129 including gate dielectric structures 130 vertically interposed between the channel tier 132 and the SGD plug tier 127. The gate dielectric structures 130 may horizontally extend across at least the channel structures 134 of the channel tier 132 and portions of the SGD plug structures 126 of the SGD plug tier 127, and may vertically extend from and between the channel structures 134 and the SGD plug structures 126. The gate dielectric structures 130 may be formed of and include dielectric material, such as one or more of at least one dielectric oxide material (e.g., one or more of $SiO_x$, $AlO_x$, phosphosilicate glass, borosilicate glass, borophosphosilicate glass, fluorosilicate glass), at least one dielectric nitride material (e.g., $SiN_y$), and at least one low-K dielectric material (e.g., one or more of silicon oxycarbide ($SiO_xC_y$), silicon oxynitride ($SiO_xN_y$), hydrogenated silicon oxycarbide ($SiC_xO_yH_z$), and silicon oxycarbonitride ($SiO_xC_zN_y$)). The gate dielectric structures 130 may be substantially homogeneous, or the gate dielectric structures 130 may be heterogeneous. In some embodiments, the gate dielectric structure 130 is formed of and includes $SiO_x$ (e.g., $SiO_2$).

The SGD plug structures 126, the gate dielectric structures 130, and the channel structures 134 may together form horizontal sense transistors 136 (e.g., planar sense transistors, laterally oriented sense transistors) of the microelectronic device structure 100. Each horizontal sense transistor 136 may be a thin film transistor (TFT). The SGD plug structures 126 may serve as gate electrodes for the horizontal sense transistors 136. Each horizontal sense transistor 136 may individually include a SGD plug structure 126, a channel structure 134 horizontally overlapping the SGD plug structure 126, and gate dielectric structures 130 vertically interposed between the SGD plug structure 126 and the channel structure 134.

Still referring to FIG. 1A, the selector tiers 138 may vertically overlie the channel tier 132 (and, hence, the horizontal sense transistors 136). The selector tiers 138 may include a first selector tier 138A, a second selector tier 138B vertically overlying the first selector tier 138A, and a third selector tier 138C vertically overlying the second selector tier 138B. Each of the selector tiers 138 may individually include an additional conductive structure 140 (e.g., gate electrode). Insulative material (e.g., dielectric oxide material, such as $SiO_x$) may be vertically interleaved with the additional conductive structures 140 of the selector tiers 138. The additional conductive structures 140 of the selector tiers 138 may be confined within horizontal areas of the blocks 164 (FIG. 1B) of the stack structure 104. In some embodiments, the additional conductive structures 140 of the selector tiers 138 are formed substantially simultaneously with the formation of the conductive structures 106 of the tiers 110 of the stack structure 104 (e.g., during so-called "replacement gate" or "gate last" processes), as described in further detail below.

The additional conductive structures 140 of the selector tiers 138 may individually be formed of and include conductive material. By way of non-limiting example, the additional conductive structures 140 may individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the additional conductive structures 140 are individually formed of and include one or more of W, Ru, Mo, and $TiN_y$. Each of the additional conductive structures 140 may individually be substantially homogeneous, or one or more of the additional conductive structures 140 may individually be substantially heterogeneous. In some embodiments, each of the additional conductive structures 140 is substantially homogeneous.

Within a horizontal area of an individual block 164 (FIG. 1B), one (1) of the selector tiers 138 (e.g., the first selector tier 138A) may be employed as a write selector tier, another one (1) of the selector tiers 138 (e.g., the second selector tier 138B) may be employed as a read selector tier, and an additional one (1) of the selector tiers 138 (e.g., the third selector tier 138C) may be employed as a block selector tier. In some embodiments, the first selector tier 138A is employed as a write selector tier, and an individual additional conductive structure 140 thereof is employed as write select gate electrode; the second selector tier 138B is employed as a read selector tier, and an individual additional conductive structure 140 thereof is employed as read select gate electrode; and the third selector tier 138C is employed as a block selector tier, and an individual additional conductive structure 140 thereof is employed as block select gate electrode.

With continued reference to FIG. 1A, the microelectronic device structure 100 further includes write select pillar structures 144 vertically extending through the selector tiers 138 and to or into the SGD plug structures 126. The write select pillar structures 144 may be positioned with horizontal areas of the SGD plug structures 126, and may be horizontally offset from the channel structures 134. Each of the SGD plug structures 126 may individually include one (1) of the write select pillar structures 144 in contact (e.g., physical contact, electrical contact) therewith. As shown in FIG. 1A, in some embodiments, an individual write select pillar structure 144 horizontally overlaps (e.g., is substantially horizontally centered about) one (1) of the pillar structures 122 (e.g., the first pillar structure 122A) coupled to the SGD plug structure 126 in contact with the write select pillar structure 144.

Still referring to FIG. 1A, the microelectronic device structure 100 further includes first read select pillar structures 146 (e.g., source-side read select pillars) and second read select pillar structures 148 (e.g., drain-side read select pillars) vertically extending through the selector tiers 138 and to or into the channel structures 134. The first read select pillar structures 146 and the second read select pillar structures 148 may be positioned with horizontal areas of the channel structures 134, and may be horizontally offset from one another and the channel structures 134. Each of the channel structures 134 may individually include one (1) of the first read select pillar structures 146 and one (1) of the second read select pillar structures 148 in contact (e.g., physical contact, electrical contact) therewith. Accordingly, each of the horizontal sense transistors 136 may individually include one (1) of the first read select pillar structures 146 and one (1) of the second read select pillar structures 148 in electrical communication therewith. In some embodiments, for an individual horizontal sense transistor 136, a first read select pillar structure 146 is employed a source-side read select pillar that contacts a source region of the channel structure 134; and a second read select pillar structure 148 is employed a drain-side read select pillar that contacts a drain region of the channel structure 134. Within a horizontal area of an individual SGD plug structure 126, a horizontal distance between the second read select pillar structure 148 and the write select pillar structure 144 may be less than a horizontal distance between the first read select pillar structure 146 and the write select pillar structure 144. As shown in FIG. 1A, in some embodiments, an individual first read select pillar structure 146 horizontally overlaps (e.g., is substantially horizontally centered about) one (1) of the pillar structures 122 (e.g., the fourth pillar structure 122D) coupled to the SGD plug structure 126 horizontally overlapping the first read select pillar structure 146; and an individual second read select pillar structure 148 horizontally overlaps (e.g., is substantially horizontally centered about) an additional one (1) of the pillar structures 122 (e.g., the second pillar structure 122B) coupled to the SGD plug structure 126 horizontally overlapping the second read select pillar structure 148.

The write select pillar structures 144, the first read select pillar structures 146, and the second read select pillar structures 148 may each individually be formed of and include a stack of materials. By way of non-limiting example, the write select pillar structures 144, the first read select pillar structures 146, and the second read select pillar structures 148 may each individually be formed of and include a gate dielectric material (e.g., $SiO_x$, such as $SiO_2$), a channel material (e.g., silicon, such as polycrystalline silicon), and a dielectric fill (e.g., $SiO_x$, such as $SiO_2$; $SiN_y$, such as $Si_3N_4$; air). The gate dielectric material may be formed on or over surfaces of the additional conductive structures 140 and the insulative material of the selector tiers 138 at least partially defining horizontal boundaries of the write select pillar structures 144, the first read select pillar structures 146, and the second read select pillar structures 148; the channel material may be horizontally surrounded by the gate dielectric material; and the dielectric fill material may be horizontally surrounded by the channel material.

Still referring to FIG. 1A, intersections of the write select pillar structures 144 and the additional conductive structures 140 of individual selector tiers 138 may define write selector transistors 131 of the microelectronic device structure 100. By way of non-limiting example, intersections of the write select pillar structures 144 and the additional conductive structure 140 (e.g., serving as a write select gate) of first selector tier 138A the may define write selector transistors 131 at the vertical elevation of the first selector tier 138A. An individual write selector transistor 131 may comprise a vertical transistor (e.g., a vertically oriented transistor) including a channel region vertically offset from source/drain regions. Channel regions of the write selector transistors 131 may be positioned within vertical boundaries of the additional conductive structure 140 of an individual selector tier 138; and source/drain regions of the write selector transistors 131 may vertically neighbor the channel regions, and may be vertically offset from the additional conductive structure 140. In some embodiments, the write selector transistors 131 comprise metal-oxide-semiconductor (MOS) transistors. Write selector transistors 131 within vertical boundaries of selector tiers 138 employed as write selector tiers (e.g., the first selector tier 138A) may have different $V_t$ characteristics than write selector transistors 131 of selector tiers 138 employed as read selector tiers (e.g., the second selector tier 138B). For example, write selector transistors 131 within vertical boundaries of the first selector tier 138A may comprise relatively higher $V_t$ transistors, and write selector transistors 131 within vertical boundaries of the second selector tier 138B may comprise relatively lower $V_t$ transistors.

Intersections of the additional conductive structures 140 of individual selector tiers 138 and each of the first read select pillar structures 146 and the second read select pillar structures 148 may define read selector transistors 135 of the microelectronic device structure 100. By way of non-limiting example, intersections of the additional conductive structure 140 of the second selector tier 138B and each of the first read select pillar structures 146 and the second read select pillar structures 148 may define read selector transistors 135 at the vertical elevation of the second selector tier 138B. An individual read selector transistor 135 may comprise a vertical transistor (e.g., a vertically oriented transistor) including a channel region vertically offset from source/drain regions. Channel regions of the read selector transistors 135 may be positioned within vertical boundaries of the additional conductive structure 140 of an individual selector tier 138; and source/drain regions of the read selector transistors 135 may vertically neighbor the channel regions, and may be vertically offset from the additional conductive structure 140. In some embodiments, the read selector transistors 135 comprise MOS transistors. Read selector transistors 135 within vertical boundaries of selector tiers 138 employed as read selector tiers (e.g., the second selector tier 138B) may have different $V_t$ characteristics than read selector transistors 135 of selector tiers 138 employed as write selector tiers (e.g., the first selector tier 138A). For example, read selector transistors 135 within vertical boundaries of the second selector tier 138B may comprise relatively higher $V_t$ transistors, and read selector transistors 135 within vertical boundaries of the first selector tier 138A may comprise relatively lower $V_t$ transistors.

Write selector transistors 131 and read selector transistors 135 within vertical boundaries of an individual selector tier 138 employed as a block selector tier may be employed for block select operations for a microelectronic device including the microelectronic device structure 100. By way of non-limiting example, if the third selector tier 138C is employed as a block selector tier of the microelectronic device structure 100, the write selector transistors 131 and read selector transistors 135 within vertical boundaries of the third selector tier 138C may be employed for block select operations for a microelectronic device including the microelectronic device structure 100. Within a horizontal area of an individual block 164 (FIG. 1B), write selector transistors 131 and read selector transistors 135 within vertical boundaries of an individual selector tier 138 employed as a block selector tier (e.g., the third selector tier 138C) may have substantially the same $V_t$ characteristics as one another. For example, within a horizontal area of an individual block 164 (FIG. 1B), write selector transistors 131 and read selector transistors 135 within vertical boundaries of the third selector tier 138C may all comprise relatively higher $V_t$ transistors.

Still referring to FIG. 1A, different portions of the selector tiers 138 (e.g., the first selector tier 138A, the second selector tier 138B, the third selector tier 138C), the write select pillar structures 144, the first read select pillar structures 146, and the second read select pillar structures 148 may be doped with one or more conductivity-enhancing species (e.g., one or more P-type dopants, such as one or more of B, Al, and Ga; one or more N-type dopants, such as one or more of P, As, Sb, and Bi). By way of non-limiting example, within horizontal areas of the blocks 164 (FIG. 1B), the microelectronic device structure 100 may include doped sections 142 at vertical positions of at least some of the selector tiers 138. Each doped section 142 may individually include a portion of a selector tier 138 doped with at least one conductivity-enhancing species (e.g., at least one P-type dopant, at least one N-type dopant), as well as portions of one or more a write select pillar structure 144, a first read select pillar structure 146, and a second read select pillar structure 148 doped with the at least one conductivity-enhancing species. An individual doped section 142 may be substantially confined within horizontal boundaries of an individual sub-block group 116 of the block 164 (FIG. 1B), or may horizontally extend at least partially across and between at least two (2) horizontally neighboring sub-block groups 116 of the block 164 (FIG. 1B). The doped sections 142 of the microelectronic device structure 100 may be used to provide different select transistors (e.g., write selector transistors 131, read selector transistors 135, block select transistors) within the selector tiers 138 with desired $V_t$ characteristics, as described in further detail below. For example, as a result of the doped sections 142, some of the write selector transistors 131 and read selector transistors 135 within boundaries (e.g., vertical boundaries, horizontal boundaries) of doped sections 142 may be relatively higher $V_t$ transistors, while some other of the write selector transistors 131 and read selector transistors 135 outside of the boundaries of doped sections 142 may be relatively lower $V_t$ transistors.

Within an individual block 164 (FIG. 1B) of the stack structure 104, the doped sections 142 may be configured such that the write selector transistors 131, the read selector transistors 135, and the block select transistors have desired $V_t$ characteristics for use and operation of a microelectronic device including the microelectronic device structure 100. For example, the doped sections 142 may be configured such that read selector transistors 135 substantially vertically aligned with one another (e.g., within the same selector tier 138 as one another) have substantially the same $V_t$ characteristics (e.g., are set to the same $V_t$ levels) as one another, and different $V_t$ characteristics (e.g., are set to different $V_t$ levels) than write selector transistors 131 substantially vertically aligned therewith (e.g., within the same selector tier 138 as one another). As another example, the doped sections 142 may be configured such that some vertically neighboring transistors operatively associated with the same write select pillar structure 144, the same first read select pillar structure 146, or the same second read select pillar as one another have different $V_t$ characteristics (e.g., different $V_t$ levels) than one another.

As shown in FIG. 1A, in some embodiments, the doped sections 142 of the microelectronic device structure 100 include first doped sections 142A at a vertical elevation of the first selector tier 138A; second doped sections 142B at a vertical elevation of the second selector tier 138B; and third doped sections 142C at a vertical elevation of the third selector tier 138C. Within a horizontal area of an individual SGD plug structure 126, different doped sections 142 may have horizontal positions than one another and/or may have different horizontal dimensions than one another. Non-limiting examples of configurations of some of the doped sections 142 within a horizontal area of the sub-section $B_1$ of the microelectronic device structure 100 shown in FIGS. 1A and 1B are described in further detail below.

Referring to FIG. 1A, within a horizontal area of the sub-section $B_1$ of the microelectronic device structure 100, a first doped section 142A may comprise a portion of at least the additional conductive structure 140 of the first selector tier 138A doped with at least one conductivity-enhancing species, as well as a portion of the write select pillar structure 144 at the vertical position of the additional conductive structure 140 of the first selector tier 138A. The first doped section 142A may not include portions of the first read select pillar structure 146 and the second read select pillar structure 148 at the vertical position of the additional conductive structure 140 of the first selector tier 138A. For example, the first doped section 142A may not substantially horizontally overlap the channel structure 134 in contact with the first read select pillar structure 146 and the second read select pillar structure 148. The first doped section 142A may permit a write selector transistor 131 at the vertical position of the first selector tier 138A to have different $V_t$ characteristics than additional transistors (e.g., read selector transistors 135) at the vertical position of the first selector tier 138A. In some embodiments, the conductivity-enhancing species of the first doped section 142A includes P-type dopant (e.g., B).

Within a horizontal area of the sub-section $B_1$ of the microelectronic device structure 100, a second doped section 142B may comprise portions of at least the additional conductive structure 140 of the second selector tier 138B doped with at least one conductivity-enhancing species, as well as a portion of the first read select pillar structure 146 and the second read select pillar structure 148 at the vertical position of the additional conductive structure 140 of the second selector tier 138B. The second doped section 142B may not include a portion of the write select pillar structure 144 at the vertical position of the additional conductive structure 140 of the second selector tier 138B. For example, the second doped section 142B may substantially horizontally confined within the horizontal area of the channel structure 134 in contact with the first read select pillar structure 146 and the second read select pillar structure 148. The second doped section 142B may permit read selector transistors 135 at the vertical position of the second selector tier 138B to have substantially the same $V_t$ characteristics as one another and different $V_t$ characteristics than additional transistors (e.g., a write selector transistor 131) at the vertical position of the second selector tier 138B. In some embodiments, the conductivity-enhancing species of the second doped section 142B includes P-type dopant (e.g., B). Optionally, an additional portion of at least the additional conductive structure 140 of the second selector tier 138B and a portion of the write select pillar structure 144 may be doped with an additional conductivity-enhancing species (e.g., N-type dopant, such as P) having a conductivity type different than the conductivity-enhancing species (e.g., P-type dopant, such as B) included in the second doped section 142B.

Within a horizontal area of the sub-section $B_1$ of the microelectronic device structure 100, a third doped section 142C may comprise portions of at least the additional conductive structure 140 of the third selector tier 138C doped with at least one conductivity-enhancing species, as well as a portion of the write select pillar structure 144, the first read select pillar structure 146, and the second read select pillar structure 148 at the vertical position of the additional conductive structure 140 of the third selector tier 138C. For example, the third doped section 142C may continuously horizontally extend across and beyond the horizontal area of the SGD plug structure 126 within the sub-section $B_1$ of the microelectronic device structure 100. The third doped section 142C may permit additional transistors (e.g., write selector transistors 131, read selector transistors 135, block select transistors) at the vertical position of the third selector tier 138C to have substantially the same $V_t$ characteristics as one another. In some embodiments, the conductivity-enhancing species of the third doped section 142C includes P-type dopant (e.g., B).

Referring collectively to FIGS. 1A and 1B, the conductive routing tier 150 (FIG. 1A) includes read source line structures 152 and local strap structures 154 vertically overlying the selector tiers 138. The read source line structures 152 may individually vertically overlie, horizontally overlap, and contact (e.g., physically contact, electrically contact) multiple of the first read select pillar structures 146 (e.g., source-side read select pillar structures) a horizontal area of and individual block 164 (FIG. 1B) of the stack structure 104. The local strap structures 154 may individually vertically overlie, horizontally extend from and between, and contact (e.g., physically contact, electrically contact) a write select pillar structure 144 and a second read select pillar structure 148 within a horizontal area of an individual SGD plug structure 126. The read source line structures 152 and local strap structures 154 may be substantially vertically aligned with one another within the conductive routing tier 150.

As shown in FIG. 1B, the read source line structures 152 may horizontally extend in parallel within one another and rows of the first read select pillar structures 146 (as well as rows of the second read select pillar structures 148, rows of the write select pillar structures 144, and rows of the pillar structures 122) in the X-direction. Each of the read source line structures 152 may individually be coupled to the first read select pillar structures 146 of at least one (1) row of the first read select pillar structures 146 extending in the X-direction. As depicted in FIG. 1B, in some embodiments, each source line structure 152 is individually coupled to two (2) rows of the first read select pillar structures 146. A first of the two (2) rows of the first read select pillar structures 146 may be positioned within a horizontal area of one (1) of the sub-block groups 116 of an individual block 164; and a second of the two (2) rows of the first read select pillar structures 146 may be positioned within a horizontal area of another one (1) of the sub-block groups 116 of block 164 horizontally neighboring the one (1) of the sub-block groups 116.

Referring to FIGS. 1A and 1B, the local strap structures 154 may individually couple a write select pillar structure 144 within a horizontal area of an individual SGD plug structure 126 to a second read select pillar structure 148 within the horizontal area of SGD plug structure 126. As shown FIG. 1B, some of the local strap structures 154 may horizontally extend in parallel with one another (and some of the SGD plug structures 126 and some of the channel structures 134), and some other of the local strap structures 154 may horizontally extend in series with one another (and some other of the SGD plug structures 126 and some other of the channel structures 134). Local strap structures 154 within a horizontal area of the same sub-block group 116 (e.g., the first sub-block group 116A, the second sub-block group 116B, the third sub-block group 116C, or the fourth sub-block group 116D) as one another may horizontally extend in parallel with one another in a direction acutely angled relative to each of the X-direction and the Y-direction shown in FIG. 1B. In addition, at least some local strap structures 154 within horizontal areas of different sub-block groups 116 than one another may horizontally extend in series with one another in the direction acutely angled relative to each of the X-direction and the Y-direction shown in FIG. 1B.

The read source line structures 152 and the local strap structures 154 may each individually be formed of and include conductive material. By way of non-limiting example, the read source line structures 152 and the local strap structures 154 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the read source line structures 152 and the local strap structures 154 are each individually formed of and include one or more of W, Ru, Mo, and $TiN_y$. Each of the read source line structures 152 and the local strap structures 154 may individually be substantially homogeneous, or one or more of the read source line structures 152 and/or and one or more of the local strap structures 154 may individually be substantially heterogeneous. In some embodiments, each of the read source line structures 152 and each of the local strap structures 154 is substantially homogeneous.

Referring to FIG. 1B, in some embodiments, within boundaries of an individual sub-block group 116, all of the channel structures 134 are substantially aligned with one another in the Y-direction, all of the write select pillar structures 144 are substantially aligned with one another in the Y-direction, all of the first read select pillar structures 146 are substantially aligned with one another in the Y-direction, all of the second read select pillar structures 148 are substantially aligned with one another in the Y-direction, and all of the local strap structures 154 are substantially aligned with one another in the Y-direction. In additional embodiments, within boundaries of an individual sub-block group 116, some of the channel structures 134 are horizontally offset from one another in the Y-direction, some of the write select pillar structures 144 are horizontally offset from one another in the Y-direction, some of the first read select pillar structures 146 are horizontally offset from one another in the Y-direction, some of the second read select pillar structures 148 are horizontally offset from one another in the Y-direction, and/or some of the local strap structure 154 are horizontally offset from one another in the Y-direction. For example, horizontal positions in the Y-direction of channel structures 134, write select pillar structures 144, first read select pillar structures 146, second read select pillar structures 148, and local strap structure 154 operatively associated with SGD plug structures 126 (and, hence, horizontal sense transistors 136) horizontally neighboring one another in the X-direction within boundaries of an individual sub-block group 116 may be horizontally inverted in the Y-direction relative to another. By way of non-limiting example, within boundaries of an individual sub-block group 116, a write select pillar structure 144 operatively associated with a first SGD plug structure 126 of two (2) horizontally neighboring SGD plug structures 126 may be substantially horizontally aligned in the Y-direction with a first read select pillar structure 146 operatively associated with a second SGD plug structure 126 of the two (2) horizontally neighboring SGD plug structures 126; a write select pillar structure 144 operatively associated with the second SGD plug structure 126 may be substantially horizontally aligned in the Y-direction with a first read select pillar structure 146 operatively associated with the first SGD plug structure 126; a second read select pillar structure 148 operatively associated with the first SGD plug structure 126 may be completely horizontally offset in the Y-direction from a second read select pillar structure 148 operatively associated with the second SGD plug structure 126; a channel structure 134 operatively associated with the first SGD plug structure 126 may be partially horizontally offset in the Y-direction from a channel structure 134 operatively associated with the second SGD plug structure 126; and a local strap structure 154 operatively associated with the first SGD plug structure 126 may be completely horizontally offset in the Y-direction from a local strap structure 154 operatively associated with the second SGD plug structure 126.

Referring collectively to FIGS. 1A and 1B, the digit line tier 156 (FIG. 1A) includes digit line structures 158 vertically overlying the conductive routing tier 150. As shown in FIG. 1B, the digit line structures 158 may horizontally extend in parallel with one another in the Y-direction. The digit line structures 158 may horizontally extend perpendicular to the read source line structures 152. The digit line structures 158 may be coupled to logic circuitry (e.g., page buffer circuitry) of a microelectronic device including the microelectronic device structure 100. The logic circuitry may, for example, be included within the base structure 102 (FIG. 1A) vertically underlying the stack structure 104. In some embodiments, the digit line structures 158 are coupled to page buffer devices each individually including an arrangement of data cache circuitry (e.g., dynamic data cache (DDC) circuitry, primary data cache (PDC) circuitry, secondary data cache (SDC) circuitry, temporary data cache (TDC) circuitry), sense amplifier (SA) circuitry, and digit line pre-charge circuitry. Optionally, isolation devices (e.g., isolation transistors) may be interposed between the digit line structures 158 and the page buffer devices at desirable locations along conductive paths extending from and between the digit line structures 158 and the page buffer devices. In some embodiments, the isolation devices comprise high-voltage-isolation (HVISO) transistors configured and operated to pass voltages greater than or equal to about 18V, such as within a range of from about 18V to about 25V. In additional embodiments, the isolation devices comprise low-voltage-isolation (LVISO) transistors configured and operated to substantially block applied voltages less than about 18 V while in an OFF state (e.g., an inactive state, a depletion state, a deselected state).

The digit line structures 158 may each individually be formed of and include conductive material. By way of non-limiting example, the digit line structures 158 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the digit line structures 158 are each individually formed of and include one or more of W, Ru, Mo, and $TiN_y$. Each of the digit line structures 158 may individually be substantially homogeneous, or one or more of the digit line structures 158 may individually be substantially heterogeneous. In some embodiments, each of the digit line structures 158 is substantially homogeneous.

Referring to FIG. 1A, the microelectronic device structure 100 further includes digit line contact structures 160 vertically interposed between the digit line tier 156 and the conductive routing tier 150. The digit line contact structures 160 may be configured to couple individual digit line structures 158 to individual local strap structures 154. Each local strap structure 154 within a horizontal area of an individual block 164 (FIG. 1B) of the stack structure 104 may individually be coupled to an individual digit line structure 158 by way of an individual digit line contact structure 160. The digit line contact structure 160 may vertically extend from and between the local strap structure 154 and the digit line structure 158.

The digit line contact structures 160 may each individually be formed of and include conductive material. By way of non-limiting example, the digit line contact structures 160 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the digit line contact structures 160 are each individually formed of and include one or more of W, Ru, Mo, and $TiN_y$. Each of the digit line contact structures 160 may individually be substantially homogeneous, or one or more of the digit line contact structures 160 may individually be substantially heterogeneous.

Still referring to FIG. 1A, the microelectronic device structure 100 further includes at least one isolation material 162 covering and surrounding various features (e.g., materials, structures, devices) thereof. For example, the isolation material 162 may vertically overlie the stack structure 104, and may at least partially cover, at least partially surround, and/or at least partially be interposed (e.g., horizontally interposed, vertically interposed) between additional features of the microelectronic device structure 100 vertically overlying the stack structure 104 (e.g., the SGD plug structures 126, the channel structures 134, the additional conductive structures 140, the write select pillar structures 144, the first read select pillar structures 146, the second read select pillar structures 148, the read source line structures 152, the local strap structures 154, the digit line contact structures 160, the digit line structures 158).

The isolation material 162 may be formed of and include insulative material. By way of non-limiting example, the isolation material 162 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the isolation material 162 is formed of and includes $SiO_x$ (e.g., $SiO_2$). The isolation material 162 may be substantially homogeneous, or the isolation material 162 may be heterogeneous.

During use and operation of a microelectronic device (e.g., a memory device, such as a 3D NAND Flash memory device) including the microelectronic device structure 100, programming operations may be performed to set (e.g., program) $V_t$ levels of select transistors 123 within the SGD tier section 111B and the sense node tier section 111C of the stack structure 104. Such operations are referred to herein as "SGPGM" operations. The SGPGM operations may be facilitated, in part, by the $V_t$-enhanced sections 118 within the sense node tier section 111C. The $V_t$-enhanced sections 118 within the sense node tier section 111C may, for example, be used to identify different pillar structures 122 within the horizontal area of an individual block 164 (FIG. 1B) of the stack structure. As a non-limiting example, within a horizontal area of the sub-section $B_1$ of the microelectronic device structure 100, the tenth $V_t$ enhanced sections 118J of the second SGP tier 110L and the ninth $V_t$-enhanced sections 118I of the first SGP tier 110K may be used to identify each of the first pillar structure 122A, the second pillar structure 122B, the third pillar structure 122C, and the first pillar structure 122A. The first pillar structure 122A may be identified by the horizontal overlap of each of one (1) of the tenth $V_t$-enhanced sections 118J and one (1) of the ninth $V_t$-enhanced sections 118I with the first pillar structure 122A, due to the impact thereof on the characteristics (e.g., channel types) of the select transistors 123 at the intersections of the first pillar structure 122A and the first SGP tier 110K and second SGP tier 110L. The second pillar structure 122B may be identified by the horizontal overlap of one (1) of the ninth $V_t$-enhanced sections 118I with the second pillar structure 122B, along with the absence of horizontal overlap (and select transistor 123 $V_t$ properties) of one (1) of the tenth $V_t$-enhanced sections 118J within the second pillar structure 122B, due to the impact thereof on the characteristics (e.g., channel types) of the select transistors 123 at the intersections of the second pillar structure 122B and the first SGP tier 110K and second SGP tier 110L. The third pillar structure 122C may be identified by the absence of horizontal overlap of the ninth $V_t$-enhanced sections 118I and the tenth $V_t$-enhanced sections 118J with the third pillar structure 122C, due to the impact thereof on the characteristics (e.g., channel types) of the select transistors 123 at the intersections of the third pillar structure 122C and the first SGP tier 110K and second SGP tier 110L. The fourth pillar structure 122D may be identified by the horizontal overlap of one (1) of the tenth $V_t$-enhanced sections 118J with the second pillar structure 122B, along with the absence of horizontal overlap of one (1) of the ninth $V_t$-enhanced sections 118I with the second pillar structure 122B, due to the impact thereof on the characteristics (e.g., channel types) of the select transistors 123 at the intersections of the fourth pillar structure 122D and the first SGP tier 110K and second SGP tier 110L.

A non-limiting example of SGPGM operations to set $V_t$ levels for different select transistors 123 within the SGD tier section 111B and the sense node tier section 111C of the stack structure 104 is described below by and with reference to Table 1 and Table 2.

TABLE 1

| | SB | L | K | J | I | H | G | F | E | D | C |
|---|---|---|---|---|---|---|---|---|---|---|---|
| J | C + B | L | H | Pgm | H | H | H | H | H | H | H |
| I | B + A | L | H | H | Pgm | H | H | H | H | H | H |
| H | By SB* | L/H | L/H | L/H | L/H | Pgm | H | H | H | H | H |
| G | By SB* | L/H | L/H | L/H | L/H | Inh | Pgm | Pass | Pass | Pass | Pass |
| F | By SB* | L/H | L/H | L/H | L/H | Inh | Pass | Pgm | Pass | Pass | Pass |
| E | By SB* | L/H | L/H | L/H | L/H | Inh | Pass | Pass | Pgm | Pass | Pass |
| D | By SB* | L/H | L/H | L/H | L/H | Inh | Pass | Pass | Pass | Pgm | Pass |
| C | By SB* | L/H | L/H | L/H | L/H | Inh | Pass | Pass | Pass | Pass | Pgm |

TABLE 2

| | SB | L | K | J | I |
|---|---|---|---|---|---|
| H, G, F, E, D, C | A | H | H | L | L |
| | B | L | H | H | L |
| | C | L | L | H | H |
| | D | H | L | L | H |

In Table 1, the farthest column to the left represents the tier 110 of the stack structure 104 of the microelectronic device structure 400 in which select transistors 123 are being programmed, wherein J, I, H, G, F, E, D, and C represent programming operations for select transistors 123 within the second SGP bar tier 110J, the first SGP bar tier 110I, the read-amplification SGD tier 110H, the second SGD tier 110G, the first SGD tier 110F, the second SGD bar tier 110E, the first SGD bar tier 110D, and the program-inhibit SGD tier 110C, respectively. In addition, in the uppermost row in Table 1, SB, L, K, J, I, H, G, F, E, D, and C represent the sub-blocks 114 being acted upon, the second SGP tier 110L, the first SGP tier 110K, the second SGP bar tier 110J, the first SGP bar tier 110I, the read-amplification SGD tier 110H, the second SGD tier 110G, the first SGD tier 110F, the second SGD bar tier 110E, the first SGD bar tier 110D, and the program-inhibit SGD tier 110C, respectively. Furthermore, within the "SB" (sub-block) column, "C+B" represents the combination of a third sub-block 114C and a second sub-block 114B of the stack structure 104; "B+A" represents the combination of a second sub-block 114B and a first sub-block 114A of the stack structure 104; and "By SB*" represents a sub-block selection scheme further described by and with reference to Table 2. In addition, at intersections of the columns and the rows of Table 1, "L" represents a LOW drive state, "H" represents HIGH drive state; "L/H" represents a LOW drive state or a HIGH drive state, according to sub-block address; "Pgm" represents an fulfilled program action for associated select transistors 123; "Inh" represents a program inhibit action; and "Pass" represents a pass through action.

In Table 2, the farthest column to the left represents the tiers 110 of the stack structure 104 of the microelectronic device structure 400 subject to the "By SB*" sub-block selection scheme identified in Table 1, wherein H, G, F, E, D, and C represent operations for select transistors 123 within the read-amplification SGD tier 110H, the second SGD tier 110G, the first SGD tier 110F, the second SGD bar tier 110E, the first SGD bar tier 110D, and the program-inhibit SGD tier 110C, respectively. In addition, in the uppermost row in Table 2, SB, L, K, J, and I represent the sub-blocks 114 being acted upon, the second SGP tier 110L, the first SGP tier 110K, the second SGP bar tier 110J, and the first SGP bar tier 110I. Furthermore, A, B, C, and D within the "SB" (sub-block) column represent the first sub-block 114A, the second sub-block 114B, the third sub-block 114C, and the fourth sub-block 114D, respectively. In addition, at intersections of the columns and the rows of Table 2, "L" represents a LOW drive state, and "H" represents HIGH drive state.

As a non-limiting example, if it is desired to program select transistors 123 at the vertical elevation of the second SGP bar tier 110J to desired $V_t$ levels, 0 volts (V) may be supplied by a digit line structure 158 to the pillar structures 122 within an individual pillar group 124 by way of a horizontal sense transistor 136 while also biasing the conductive structure 106 of the second SGP bar tier 110J to a relatively HIGH (H) programming voltage ($V_{pgm}$) to facilitate a $V_t$ potential difference. However, if the conductive structure 106 of the second SGP tier 110L is biased to 0 V, the 0 V supplied by the digit line structure 158 cannot be transferred to the tiers 110 thereunder. Accordingly, the select transistors 123 at intersections of the second SGP tier 110L and the first pillar structures 122A within the first sub-block 114A and the fourth pillar structures 122D within the fourth sub-block 114D may be set to an OFF (e.g., inactive) state. Through the combination of 0 V supplied from the digit line structure 158, the relatively HIGH $V_{pgm}$ applied to the conductive structure 106 of the second SGP bar tier 110J, and the OFF state of the select transistors 123 associated with the first pillar structures 122A and the second pillar structures 122B at the vertical elevation of the second SGP tier 110L, select transistors 123 at intersections of the second SGP bar tier 110J and the second pillar structures 122B within the second sub-block 114B and the third pillar structures 122C within the third sub-block 114C be programmed to desired $V_t$ levels. In addition, since the select transistors 123 at intersections of the second SGP bar tier 110J and the first pillar structures 122A within the first sub-block 114A and the fourth pillar structures 122D within the fourth sub-block 114D have not been programmed through the foregoing process, the second SGP tier 110L may be utilized in the reverse (e.g., select transistors 123 at intersections of the second SGP tier 110L and the first pillar structures 122A within the first sub-block 114A and the fourth pillar structures 122D within the fourth sub-block 114D may be set to an ON state, while select transistors 123 at intersections of the second SGP tier 110L and the second pillar structures 122B within the second sub-block 114B and the third pillar structures 122C within the third sub-block 114C may be set to an OFF state) to program the select transistors 123 at intersections of the second SGP bar tier 110J and the first pillar structures 122A within the first sub-block 114A and the fourth pillar structures 122D within the fourth sub-block 114D. The second SGP bar tier 110J may be employed to program $V_t$ levels of the select transistors 123 at the vertical elevation of the second SGP tier 110L in a similar manner. In addition, the first SGP bar tier 110I and the first SGP tier 110K may be utilized in combination with one another to program $V_t$ levels of the select transistors 123 and the vertical elevations thereof in a similar manner. Once the select transistors 123 within the sense node tier section 111C of the stack structure 104 are programmed to desired $V_t$ levels, the pillar structures 122 may be individually accessed, and $V_t$ levels of select transistors 123 within tiers 110 of the stack structure 104 underlying the sense node tier section 111C may be programmed as desired.

During use and operation of a microelectronic device (e.g., a memory device, such as a 3D NAND Flash memory device) including the microelectronic device structure 100, memory cell programming operations may also be performed. Such operations are referred to herein as "program operations." As a non-limiting example, still referring to FIG. 1A, if it is desired to program a memory cell 121 operatively associated with the second pillar structure 122B within the second sub-block 114B in the sub-section $B_1$ of the microelectronic device structure 100, the conductive structures 106 of the second SGD tier 110G and the first SGD bar tier 110D may be grounded, and the conductive structures 106 of the GG tier 110M, the first SGD tier 110F, the second SGD bar tier 110E, and the read-amplification SGD tier 110H may be biased HIGH. As a result, the second transistors 123 at vertical elevations of the second SGD tier 110G, the first SGD bar tier 110D, the first SGD tier 110F, and the second SGD bar tier 110E may facilitate access to second pillar structure 122B within the second sub-block 114B alone. In addition, the conductive structure 106 of the program-inhibit SGD tier 110C may be biased to a program-inhibit voltage ($V_{SGD\_Inh}$). Depending on digit line size potential, if the digit line structure 158 supplies 0 V bias to the vertical position of the second SGD bar tier 110E, back-bias effect may effectuate the discharge of the second pillar structure 122B. Thus, the second pillar structure 122B may be biased to 0 V, and if the conductive structure 106 of an active access line tier 110A intersecting the second pillar structure 122B is being driven to $V_{pgm}$, the memory cell 121 defined at the intersection will be programmed. Conversely, if the digit line structure 158 is biased to supply voltage ($V_{cc}$), the select transistor 123 at the intersection of the second pillar structure 122B and the program-inhibit SGD tier 110C is not activated due to relatively higher source side potential, and memory cell 121 programming is inhibited.

During use and operation of a microelectronic device (e.g., a memory device, such as a 3D NAND Flash memory device) including the microelectronic device structure 100, memory cell read operations may also be performed. Such operations are referred to herein as "read operations." As a non-limiting example, during a read operation, write selector transistors 131 at the vertical elevation of the first selector tier 138A (e.g., employed as a write selector tier) may be set to an OFF state and a flow of current may be directed along a path extending from a source line structure 152, through each of a first read select pillar structure 146, a horizontal sense transistor 136, a second read select pillar structure 148, a local strap structure 154, and a digit line structure 158, and to a digit line structure 158. During the read operation, the horizontal sense transistor 136 may be used to sense the potential of the SGD plug structure 126, and the potential of the sense node 112 may change (e.g., from 4 V to 0 V) depending on the status of selected memory cells 121. The conductive structures 106 of all of the tiers 110 (e.g., the first SGP bar tier 110I, the second SGP bar tier 110J, the first SGP tier 110K, the second SGP tier 110L, and the GG tier 110M) within the sense node tier section 111C may be pre-charged to a desired level, such as 4 V (without limitation), and the select transistors 123 at vertical positions thereof may be provided in an ON state. Accordingly, the sense node 112 may act as a capacitive node having a desired potential, such as 4 V (without limitation). If, for example, it is desired to read a memory cell 121 operatively associated with a second pillar structure 122B within the second sub-block 114B in the sub-section $B_1$ of the microelectronic device structure 100, the conductive structures 106 of the second SGD tier 110G and the first SGD bar tier 110D may be grounded and conductive structures 106 of the first SGD tier 110F and the second SGD bar tier 110E may be biased HIGH. By doing so, the select transistors 123 at vertical elevations of the second SGD tier 110G, the first SGD bar tier 110D, the first SGD tier 110F, and the second SGD bar tier 110E may facilitate access to the second pillar structure 122B within the second sub-block 114B alone. In addition, the conductive structure 106 of the read-amplification SGD tier 110H may be utilized to provide a bias, and the select transistor 123 defined at the intersection of the second pillar structure 122B and the read-amplification SGD tier 110H may be employed as a clamp transistor and may facilitate a back bias effect. A lower portion of the second pillar structure 122B may be pre-charged to a desired level, such as 1 V (without limitation). If 1 V reaches the vertical elevation of the second SGD tier 110G, the relatively higher potential below the read-amplification SGD tier 110H results in an OFF state of the select transistor 123 at the intersection of the second pillar structure 122B and the read-amplification SGD tier 110H and the 4 V potential of the sense node 112 is maintained. However, once the memory cell 121 associated with the second pillar structure 122B is ramped down to 0 V, depending on the status of the associated active access line tier 110A, the second pillar structure 122B will discharge. If the access transistor of the read-amplification SGD tier 110H is in an OFF state, then 1 V is maintained at the top portion of the second pillar structure 122B, and the select transistor 123 at the intersection of the second pillar structure 122B and the read-amplification SGD tier 110H is in an OFF state such that the 4 V potential of the sense node 112 is maintained. However, if the access transistor of the read-amplification SGD tier 110H is in an ON state, then after ramping the source to 0 V, a portion of the second pillar structure 122B below the read-amplification SGD tier 110H will be discharged to close to 0 V, resulting in an ON state of the select transistor 123 at the intersection of the second pillar structure 122B and the read-amplification SGD tier 110H to leak charge from the sense node 112 and bring the potential thereof to close to 0 V. By sensing the potential difference between 0 V and 4 V, horizontal sense transistor 136 facilitates read out the data stored in the memory cell 121.

Having pillar structures 122 within multiple different sub-blocks 114 share an individual sense node 112 with one another provides efficiency and performance benefits relative to conventional configurations wherein sensing circuitry is simply shared by pillar structures within the same sub-block as one another alleviates a need for sequential reading of all sub-blocks 114 to access specific sub-block data. In addition, the continuity of the conductive structures 106 of the tiers 110 within the sense node tier section 111C and the stacked SGD tier section 111B across and between different sub-blocks 114 of an individual block 164 alleviates the need for the complex and costly patterning conventionally required to form segmented SGD structures (e.g., discrete SGD structures, each discrete SGD structure within a different sub-block than each other discrete SGD structure) within an individual SGD tier, as well as undesirable resistivity characteristics (e.g., relatively high resistivity) that may be associated with segmented SGD structures within an individual block. Furthermore, as sense node capacitance is orders of magnitude lower than digit line capacitance, discharge can be achieved using a relatively small amount of current, promoting relatively faster sense and read operations. Moreover, as the current path through a horizontal sense transistor 136 may be shorter than a current path through relatively long pillar structure 122, current drive rating may be relatively higher and may facilitate faster read operation and simpler page buffer design as compared to conventional configurations.

Thus, a microelectronic device according to embodiments of the disclosure comprises a microelectronic device comprises a stack structure, pillar structures, a conductive plug structure, a sense transistor, and selector transistors. The stack structure comprises a vertically alternating sequence of conductive material and insulative material. The stack structure is divided into blocks separated by dielectric slot structures. The blocks individually include sub-blocks horizontally extending in parallel with one another. The pillar structures vertically extend through one of the blocks of the stack structure. Each pillar structure of a group of the pillar structures is horizontally positioned within a different one of the sub-blocks of the one of the blocks than each other pillar structure of the group of the pillar structures. The conductive plug structure is coupled to and horizontally extends across and between multiple of the pillar structures of the group of the pillar structures. The sense transistor is gated by the conductive plug structure. The selector transistors couple the sense transistor to a read source line structure and a digit line structure.

Furthermore, a memory device according to embodiments of the disclosure comprises a stack structure divided into blocks separated by dielectric slot structures, pillar groups within horizontal areas of the blocks, horizontal sense transistors vertically overlying and coupled to the pillar groups, vertical read selector transistors vertically overlying and coupled to the horizontal sense transistors, vertical write selector transistors vertically overlying and coupled to the horizontal sense transistors, and vertical write selector transistors vertically overlying and coupled to the horizontal sense transistors. Each of the each of the block of the stack structure comprises an access line section comprising tiers including access line structures, a select gate section overlying the access line section and comprising additional tiers including drain side select gate (SGD) structures, and a sense node section overlying the select gate section and comprising further tiers including select gate programming (SGP) structures. The pillar groups individually comprise multiple pillar structures vertically extending completely through one of the blocks, each pillar structure of the multiple pillar structures horizontally positioned within a different sub-block of the one of the blocks than each other pillar structure of the multiple pillar structures. The vertical write selector transistors are horizontally offset from the vertical read selector transistors.

In additional embodiments, the microelectronic device structure 100 may be formed to have a different configuration than that previously described with reference to FIGS. 1A and 1B. The microelectronic device structure 100 may, for example, be formed to exhibit a configuration such as one of the configurations depicted in FIGS. 2 and 3 and described in further detail below. With the description provided below, it will be readily apparent to one of ordinary skill in the art that the structures and devices described herein may be included in relatively larger structures, devices, and systems.

Figure 2:
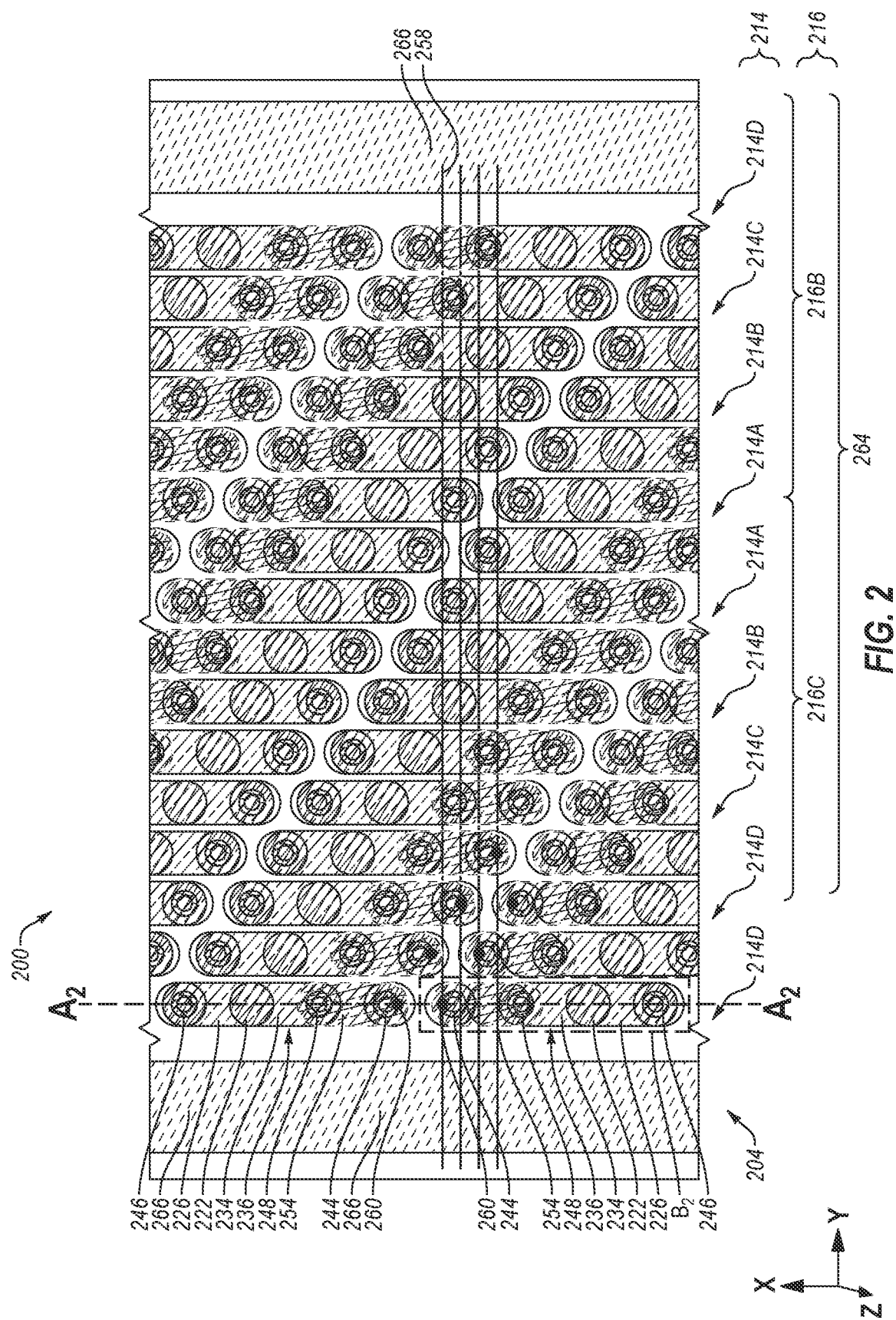
FIG. 2 is a simplified, partial top-down view of a microelectronic device structures for a microelectronic device, in accordance with additional embodiments of the disclosure.

Before referring to FIG. 2, it will be understood that throughout FIGS. 2, 3, and 4A through 4M and the associated description, features (e.g., regions, materials, structures, devices) functionally similar previously described features (e.g., previously described materials, structures, devices) are referred to with similar reference numerals incremented by 100. To avoid repetition, not all features shown in FIGS. 2, 3, and 4A through 4M are described in detail herein. Rather, unless described otherwise below, a feature in one or more of FIGS. 2, 3, and 4A through 4M designated by a reference numeral that is a 100 increment of the reference numeral of a feature previously described with reference to one or more of FIGS. 1A and 1B will be understood to be substantially similar to the previously described feature. As a non-limiting example, unless described otherwise below, features designated by the reference numerals 236, 336, and 436 in FIGS. 2, 3, and 4F (and subsequent FIGS. 4G through 4M), respectively, will be understood to respectively be substantially similar to the horizontal sense transistors 136 previously described herein with reference to FIGS. 1A and 1B.

FIG. 2 is simplified, partial top-down view of a microelectronic device structure 200 for a microelectronic device (e.g., a memory device, such as a NAND Flash memory device), in accordance with additional embodiments of the disclosure. The microelectronic device structure 200 may be similar to the microelectronic device structure 100 previously described with reference to FIGS. 1A and 1B, except that, for example, relative horizontal orientations and/or relative horizontal positions of some features of the microelectronic device structure 200 within horizontal areas of individual blocks 264 of a stack structure 204 are different than relative horizontal orientations and/or relative horizontal positions of corresponding features of the microelectronic device structure 100. For instance, as shown in FIG. 2, horizontal orientations of SGD plug structures 226 within a horizontal area of an individual block 264 of the stack structure 204 may be different than horizontal orientations of the SGD plug structures 126 of the microelectronic device structure 100 previously described with reference to FIG. 1B. As a result, horizontal orientations and/or horizontal positions of additional features of the microelectronic device structure 200 operatively associated with the SGD plug structures 226 may be different than horizontal orientations and/or horizontal positions of additional features of the microelectronic device structure 100 operatively associated with the SGD plug structures 126, as described in further detail below. It will be understood that a simplified, partial longitudinal cross-sectional view of the microelectronic device structure 200 about dashed line $A_2$-$A_2$ depicted in FIG. 2 is substantially similar to the simplified, partial longitudinal cross-sectional view of the microelectronic device structure 100 shown in FIG. 1A.

As shown in FIG. 2, the SGD plug structures 226 of the microelectronic device structure 200 may individually horizontally extend in the X-direction. Within a horizontal area of an individual block 264 of the stack structure 204, the SGD plug structures 226 may horizontally extend in parallel in the X-direction with the slot structures 266 horizontally neighboring the block 264 in the Y-direction; and may horizontally extend perpendicular to the digit line structures 258 horizontally extending in the Y-direction. Some of the SGD plug structures 226 may horizontally extend in parallel with one another in the X-direction; and other of the SGD plug structures 226 may horizontally extend in series with one another in the X-direction.

Similar to the SGD plug structures 126 (FIGS. 1A and 1B), each of the SGD plug structures 226 may individually be operatively associated with a pillar group including four (4) pillar structures 222 vertically extending through the stack structure 204. An individual SGD plug structure 226 may be coupled to and may horizontally extend in the X-direction across and between the four (4) of the pillar structures 222 of the pillar group associated therewith. The four (4) pillar structures 222 of an individual pillar group operatively associated with an individual SGD plug structure 226 may substantially horizontally aligned with one another in the Y-direction.

Still referring to FIG. 2, each block 264 of the stack structure 204 may be sub-divided into multiple (e.g., a plurality of, more than one) sub-blocks 214. The sub-blocks 214 may horizontally extend parallel with one another in a direction acutely angled relative to each of the X-direction and the Y-direction shown in FIG. 2. Each of the sub-blocks 214 may individually be operatively associated with at least one set of the pillar structures 222 horizontally extending in the direction acutely angled relative to each of the X-direction and the Y-direction. In addition, for an individual block 264, multiple (e.g., a plurality of, more than one) sub-blocks 214 thereof may be grouped together with one another within sub-block groups 216. In FIG. 2, two (2) sub-block groups 216 are depicted, a second sub-block group 216B and a third sub-block group 216C. Each of the sub-block groups 216 may individually include a first sub-block 214A, a second sub-block 214B, a third sub-block 214C, and a fourth sub-block 214D. Sub-block groups 216 horizontally neighboring one another within an individual block 264 may exhibit an inverse horizontal arrangement of the different sub-blocks 214 thereof relative to one another. For example, the first sub-block 214A of the second sub-block group 216B may be most horizontally proximate the first sub-block 214A of the third sub-block group 216C horizontally neighboring the second sub-block group 216B.

Similar to the configuration of the microelectronic device structure 100 previously described with reference to FIGS. 1A and 1B, pillar structures 222 of the microelectronic device structure 200 operatively associated with an individual SGD plug structure 226 may be located within different sub-blocks 214 of an individual block 264 than one another. For example, within the horizontal area of a sub-section $B_2$ of the microelectronic device structure 200, one (1) of the SGD plug structures 226 may vertically overlie and be coupled to each of four (4) pillar structures 222 located in different sub-blocks 214 within the third sub-block group 216C than one another. A first of the pillar structures 222 may be located within the first sub-block 214A of the third sub-block group 216C; a second of the pillar structure 222 may be located within the second sub-block 214B of the third sub-block group 216C; a third of the pillar structures 222C may be located within the third sub-block 214C of the third sub-block group 216C; and a fourth of the pillar structure 222 may be located within the fourth sub-block 214D of the third sub-block group 216C.

With continued reference to FIG. 2, channel structures 234 of the microelectronic device structure 200 may be positioned within horizontal areas of the SGD plug structures 226, and may individually horizontally extend in the X-direction. The SGD plug structures 226, the channel structures 234, and gate dielectric structures (e.g., corresponding to the gate dielectric structures 130 previously described with reference to FIG. 1A) may together form horizontal sense transistors 236 substantially similar to the horizontal sense transistors 136 previously described with reference to FIGS. 1A and 1B, except for the horizontal orientations thereof. In addition, the microelectronic device structure 200 may include tiers, memory cells, select transistors, $V_t$-enhanced sections, sense nodes, write pillar structures 244, first read pillar structures 246, second read pillar structures 248, selector tiers, doped sections, write selector transistors, read selector transistors, read source line structures, local strap structures 254, digit line contact structures 260, digit line structures 258, and isolation material respectively substantially similar to and utilized in substantially the same manner as the tiers 110, the memory cells 121, the select transistors 123, the $V_t$-enhanced sections 118, the sense nodes 112, the write pillar structures 144, the first read pillar structures 146, the second read select pillar structures 148, the selector tiers 138, the doped sections 142, the write selector transistors 131, the read selector transistors 135, the read source line structures 152, the local strap structures 154, the digit line contact structures 160, the digit line structures 158, and the isolation material 162 previously described with reference to FIGS. 1A and 1B.

Figure 3:
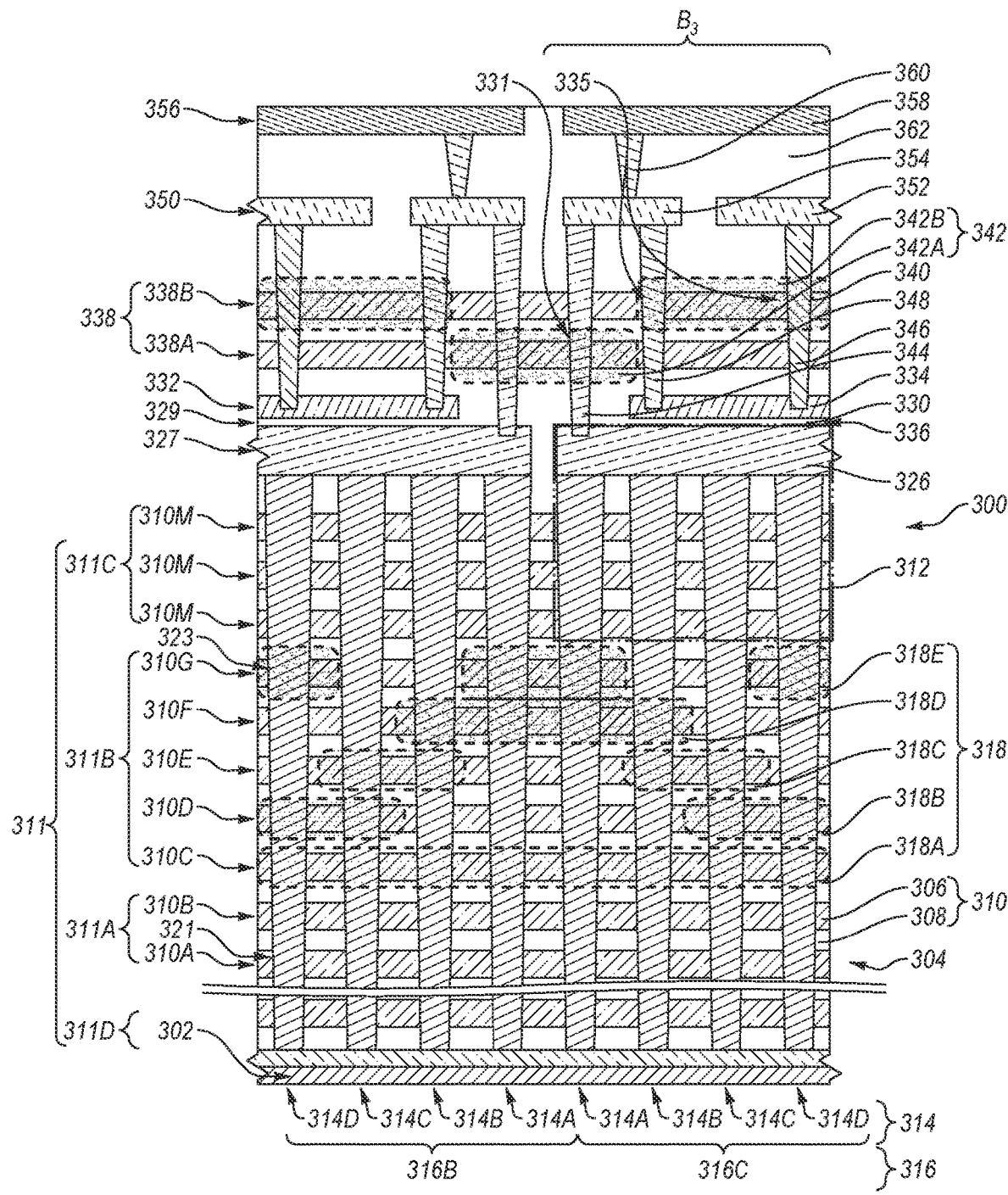
FIG. 3 is simplified, partial longitudinal cross-sectional view of a microelectronic device structure for a microelectronic device, in accordance with further embodiments of the disclosure.

FIG. 3 is simplified, partial longitudinal cross-sectional view of a microelectronic device structure 300 for a microelectronic device (e.g., a memory device, such as a NAND Flash memory device), in accordance with further embodiments of the disclosure. The microelectronic device structure 300 may be similar to the microelectronic device structure 100 previously described with reference to FIGS. 1A and 1B, except that, for example, the microelectronic device structure 300 may have a reduced quantity of tiers 310 and/or some of the tiers 310 may be utilized differently for various operations (e.g., SGPGM operations, program operations, read operations, erase operations) of a microelectronic device (e.g., a memory device, such as a 3D NAND Flash memory device) including the microelectronic device structure 300. For instance, as shown in FIG. 3, the microelectronic device structure 300 may be free of (e.g., may not include) tiers 310 corresponding to the read-amplification SGD tier 110H, the first SGP bar tier 110I, the second SGP bar tier 110J, the first SGP tier 110K, and the second SGP tier 110L of the microelectronic device structure 100 previously described with reference to FIG. 1A. Accordingly, a sense node tier section 311C of a stack structure 304 of the microelectronic device structure 300 may modified relative to the sense node tier section 111C (FIG. 1A) of the microelectronic device structure 100 (FIG. 1A), and may include one or more (e.g., two or more, three or more) GG tiers 310M. Sense nodes 312 of the microelectronic device structure 300 may be defined by and include SGD plug structures 326 and portions of the GG tiers 310M. The sense nodes 312 may not include portions of SGP bar tiers and SGP tiers corresponding to the first SGP bar tier 110I, the second SGP bar tier 110J, the first SGP tier 110K, and the second SGP tier 110L of the microelectronic device structure 100 previously described with reference to FIG. 1A.

In some embodiments, the microelectronic device structure 300 includes multiple (e.g., two or more, three or more) of the GG tiers 310M. For example, as shown in FIG. 3, the stack structure 304 of the microelectronic device structure 300 may include three (3) of the GG tiers 310M in a vertically stacked arrangement with one another. The GG tiers 310M may be vertically interposed between a second SGD tier 310G of the stack structure 304 and a SGD plug tier 327 of the microelectronic device structure 300.

Since the microelectronic device structure 300 does not include tiers 310 corresponding to the read-amplification SGD tier 110H, the first SGP bar tier 110I, the second SGP bar tier 110J, the first SGP tier 110K, and the second SGP tier 110L of the microelectronic device structure 100 previously described with reference to FIG. 1A, operations (e.g., SGPGM operations, program operations, read operations, erase operations) that may otherwise utilize such omitted (e.g., absent) tiers 310 (e.g., in the manners previously described in relation to use and operation of a microelectronic device including the microelectronic device structure 100) may be effectuated using different tiers 310 of the microelectronic device structure 300. For example, for program operations, the first SGD bar tier 110D and the second SGD bar tier 110E may be employed to program $V_t$ levels of the first SGD tier 110F and the second SGD tier 110G, respectively; and the first SGD bar tier 110D, the second SGD bar tier 110E, the first SGD tier 110F, and the second SGD tier 110G may be employed to program $V_t$ levels of the program-inhibit SGD tier 310C. In addition, for read operations, the program-inhibit SGD tier 310C in a manner similar to that of the read-amplification SGD tier 110H previously described with reference to FIGS. 1A and 1B; and the GG tiers 310M may all be provided in an ON state, to effectively serve as a coupling capacitor for the sense nodes 312.

FIGS. 4A through 4M are simplified, partial longitudinal cross-sectional views illustrating a microelectronic device structure at different processing stages of a method of forming a microelectronic device (e.g., a memory device, such as a 3D NAND Flash memory device), in accordance with embodiments of the disclosure. The methods described herein with reference to FIGS. 4A through 4M may be used to form one or more of the microelectronic device structures (e.g., the microelectronic device structure 100, the microelectronic device structure 200, the microelectronic device structure 300) of the disclosure previously described herein with reference to FIGS. 1A and 1B, 2, and 3. With the description provided below, it will be readily apparent to one of ordinary skill in the art that the methods described herein may be used for forming various devices. In other words, the methods of the disclosure may be used whenever it is desired to form a microelectronic device.

FIG. 4A is a simplified, longitudinal cross-sectional view of a portion of a microelectronic device structure 400 at a processing stage of a method of forming a microelectronic device, in accordance with embodiments of the disclosure. A horizontal position of the portion of the microelectronic device structure 400 shown in FIG. 4A may correspond to the horizontal position of the sub-section $B_1$ of the microelectronic device structure 100 previously described with reference to FIGS. 1A and 1B; and a vertical position of the portion of the microelectronic device structure 400 shown in FIG. 4A may correspond to that of a portion of the microelectronic device structure 100 vertically extending between the first SGP tier 110K (FIG. 1A) of the stack structure 104 (FIG. 1A) and an upper vertical boundary of the stack structure 104 (FIG. 1A).

As shown in FIG. 4A, the microelectronic device structure 400 may be formed to include a preliminary stack structure including a vertically alternating sequence of insulative material 405 and sacrificial material 407 arranged in preliminary tiers 409. The sacrificial material 407 may be vertically interleaved with the insulative material 405, and each of the preliminary tiers 409 may include the sacrificial material 407 vertically neighboring the insulative material 405. In addition, the microelectronic device structure 400 may be formed to include pillar structures 422 vertically extending through the preliminary tiers 409 of the preliminary stack structure. The pillar structures 422 may correspond to the pillar structures 122 previously described herein with reference to FIGS. 1A and 1B.

The sacrificial material 407 of each of the preliminary tiers 409 of the preliminary stack structure may be formed of and include at least one material (e.g., at least one insulative material) that may be selectively removed relative to the insulative material 405 during subsequent processing (e.g., subsequent "replacement gate" or "gate last" processing) of the microelectronic device structure 400, as described in further detail below. A material composition of the sacrificial material 407 is different than a material composition of the insulative material 405. The sacrificial material 407 may be selectively etchable relative to the insulative material 405 during common (e.g., collective, mutual) exposure to a first etchant, and the insulative material 405 may be selectively etchable to the sacrificial material 407 during common exposure to a second, different etchant. As a non-limiting example, the sacrificial material 407 may be formed of and include additional insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the sacrificial material 407 is formed of and includes dielectric nitride material, such as $SiN_y$ (e.g., $Si_3N_4$). The sacrificial material 407 of each of the preliminary tiers 409 may be substantially homogeneous, or the sacrificial material 407 of one or more (e.g., each) of the preliminary tiers 409 may be heterogeneous.

The insulative material 405 of each of the preliminary tiers 409 of the preliminary stack structure may be formed of and include at least one dielectric material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulative material 405 of each of the preliminary tiers 409 of the preliminary stack structure is formed of and includes dielectric oxide material, such as $SiO_x$ (e.g., $SiO_2$). The insulative material 405 of each of the preliminary tiers 409 may be substantially homogeneous, or the insulative material 405 of one or more (e.g., each) of the preliminary tiers 409 may be heterogeneous.

The pillar structures 422 may each individually be formed of and include a stack of materials facilitating the use of the pillar structures 422 to form vertically extending strings of memory cells following subsequent processing acts, as described in further detail below. By way of non-limiting example, each of the pillar structures 422 may be formed to include cell film material 419A, channel material 419B, and dielectric fill material 419C. The cell film material 419A may be formed on or over surfaces of the sacrificial material 407 and the insulative material 405 of the preliminary tiers 409 of the preliminary stack structure and may be formed of and include a stack of materials, such as a charge-blocking material (e.g., a first dielectric oxide material, such as one or more of $SiO_x$, and $AlO_x$), a charge-trapping material (e.g., dielectric nitride material, such as $SiN_y$) on the charge-blocking material, and a gate dielectric material (e.g., a second dielectric oxide material, such as $SiO_x$) on the charge-trapping material. The channel material 419B may be located on the gate dielectric material of the cell film material 419A, and may be formed of and include semiconductive material (e.g., silicon, such as polycrystalline silicon). The dielectric fill material 419C may located on the channel material 419B, and may be formed of and include dielectric material (e.g., one or more of dielectric oxide material, dielectric nitride material, and an air gap).

As shown in FIG. 4A, in some embodiments, the cell film material 419A and the channel material 419B are formed to substantially continuously extend (e.g., horizontally extend, vertically extend) from and between horizontally neighboring pillar structures 422 within horizontal areas of different sub-blocks 414 (e.g., a first sub-block 414A, a second sub-block 414B, a third sub-block 414C, a fourth sub-block 414D) within the horizontal area of an individual sub-block group 416 (e.g., a third sub-block group 416C). For example, portions of the cell film material 419A and the channel material 419B may substantially continuously horizontally extend on or over an uppermost surface of the preliminary stack structure (e.g., an uppermost surface of an uppermost preliminary tier 409). In additional embodiments, the cell film material 419A and the channel material 419B do not horizontally extend from and between horizontally neighboring pillar structures 422 within the horizontal areas of horizontally neighboring sub-blocks 414. For example, the cell film material 419A and the channel material 419B forming a portion of individual pillar structure 422 may be substantially confined within a horizontal area of the sub-block 414 in which the pillar structure 422 is located.

Still referring to FIG. 4A, for each pillar structure 422, an upper vertical boundary (e.g., an upper surface) of the dielectric fill material 419C thereof may be formed to be vertically recessed (e.g., to vertically underlie) relative to an upper vertical boundary of the channel material 419B thereof. Accordingly, inner side surfaces (e.g., inner sidewalls) of the channel material 419B forming portions of the pillar structures 422 may be exposed by openings (e.g., plug recesses) vertically extending into upper regions of the pillar structures 422.

Referring next to FIG. 4B, which is a simplified, longitudinal cross-sectional view of the portion of the microelectronic device structure 400 shown in FIG. 4A following the processing stage previously described with reference to FIG. 4A, at least one first masking structure 466 including openings 468 vertically extending therethrough may be formed on or over an uppermost one of the preliminary tiers 409 of the preliminary stack structure, and then one or more conductivity-enhancing species may be provided (e.g., implanted) into one or more of the preliminary tiers 409 at horizontal positions of the openings 468 in the first masking structure 466 to form one or more $V_t$-enhanced sections 418 of the microelectronic device structure 400. As a non-limiting example, as shown in FIG. 4B, ninth $V_t$-enhanced sections 418I corresponding to the ninth $V_t$-enhanced sections 118I previously described with reference to FIG. 1A may be formed at horizontal positions and vertical locations corresponding to those previously described with reference to FIG. 1A.

In some embodiments, the first masking structure 466 is a photoresist mask formed of and including photoresist material, such as positive tone photoresist material or negative tone photoresist material. Suitable photoresist materials (e.g., positive tone photoresist materials, negative tone photoresist materials) are known in the art, and are, therefore, not described in detail herein. The first masking structure 466 may, for example, be compatible with 13.7 nm, 157 nm, 193 nm, 248 nm, or 365 nm wavelength systems; with 193 nm wavelength immersion systems; and/or with electron beam lithographic systems. In addition, the openings 468 in the first masking structure 466 may be formed using conventional processes (e.g., conventional photolithographic patterning and development processes) and conventional equipment, which are not described in detail herein.

In some embodiments, at least one P-type dopant (e.g., one or more of B, Al, and Ga) is implanted at one or more vertical positions (e.g., at a vertical position corresponding to that of first SGP tier 110K previously described with reference to FIG. 1A) within the microelectronic device structure 400 at the processing stage of FIG. 4B to form some of the $V_t$-enhanced sections 418 of the microelectronic device structure 400. The conductivity-enhancing species (e.g., P-type dopant) may be implanted into the microelectronic device structure 400 using conventional implantation processes (e.g., a plasma doping (PLAD) implantation process, a beam-line (BL) implantation process) and equipment, which are not described in detail herein.

Referring next to FIG. 4C, which is a simplified, longitudinal cross-sectional view of the portion of the microelectronic device structure 400 shown in FIG. 4B following the processing stage previously described with reference to FIG. 4B, the first masking structure 466 may be removed and an second masking structure 470 include additional openings 472 vertically extending therethrough may be formed on or over the uppermost one of the preliminary tiers 409 of the preliminary stack structure. Horizontal positions of the additional openings 472 in the second masking structure 470 may be at least partially horizontally offset from the horizontal positions of the openings 468 (FIG. 4B) in the first masking structure 466 (FIG. 4B). Following the formation of the second masking structure 470, one or more conductivity-enhancing species may be provided (e.g., implanted) into one or more other of the preliminary tiers 409 at the horizontal positions of the additional openings 472 in the second masking structure 470 to form more of the $V_t$-enhanced sections 418 of the microelectronic device structure 400. As a non-limiting example, as shown in FIG. 4C, tenth $V_t$-enhanced sections 418J corresponding to the tenth $V_t$-enhanced sections 118J previously described with reference to FIG. 1A may be formed at horizontal positions and vertical locations corresponding to those previously described with reference to FIG. 1A.

In some embodiments, the second masking structure 470 is an additional photoresist mask formed of and including additional photoresist material, such as additional positive tone photoresist material or additional negative tone photoresist material. The second masking structure 470 may, for example, be compatible with 13.7 nm, 157 nm, 193 nm, 248 nm, or 365 nm wavelength systems; with 193 nm wavelength immersion systems; and/or with electron beam lithographic systems. Furthermore, the additional openings 472 in the second masking structure 470 may be formed using conventional processes (e.g., conventional photolithographic patterning and development processes) and conventional equipment, which are not described in detail herein.

In some embodiments, at least one P-type dopant (e.g., one or more of B, Al, and Ga) is implanted at one or more vertical positions (e.g., at a vertical position corresponding to that of second SGP tier 110L previously described with reference to FIG. 1A) within the microelectronic device structure 400 at the processing stage of FIG. 4C to form some more of the $V_t$-enhanced sections 418 of the microelectronic device structure 400. The conductivity-enhancing species (e.g., P-type dopant) may be implanted into the microelectronic device structure 400 using conventional implantation processes (e.g., PLAD implantation process, a BL implantation process) and equipment, which are not described in detail herein.

Referring next to FIG. 4D, which is a simplified, longitudinal cross-sectional view of the portion of the microelectronic device structure 400 shown in FIG. 4C following the processing stage previously described with reference to FIG. 4C, the second masking structure 470 (FIG. 4C) may be removed, and then SGD plug material 425, gate dielectric material 429, channel material 433, backside dielectric material 473, and dielectric cap material 475 may be formed in sequence over the pillar structures 422 and the uppermost one of the preliminary tiers 409 of the preliminary stack structure. The SGD plug material 425 may be formed on or over the channel material 419B and the dielectric fill material 419C of the pillar structures 422, and may substantially continuously extend from and between the pillar structures 422. The gate dielectric material 429 may be formed on or over the SGD plug material 425. The channel material 433 may be formed on or over the gate dielectric material 429. The backside dielectric material 473 may be formed on or over the channel material 433. The dielectric cap material 475 may be formed on or over the backside dielectric material 473.

As shown in FIG. 4D, the SGD plug material 425 may be formed to substantially fill the openings (e.g., plug recesses) in the upper regions of the pillar structures 422 partially defined by the upper vertical boundaries of the dielectric fill material 419C of the pillar structures 422. Accordingly, portions of the SGD plug material 425 may contact (e.g., physically contact, electrically contact) inner side surfaces (e.g., inner sidewalls) and upper surfaces of the channel material 419B forming portions of the pillar structures 422, and may also physically contact upper surfaces of the dielectric fill material 419C forming portions of the pillar structures 422. The SGD plug material 425 may vertically overlie the pillar structures 422, and may horizontally extend across and between the pillar structures 422. An upper vertical boundary (e.g., an upper surface) of the SGD plug material 425 may be substantially planar, and a lower vertical boundary (e.g., a lower surface) of the SGD plug material 425 may be non-planar. Within a horizontal area of an individual sub-block group 416 (e.g., the third sub-block group 416C), some of the pillar structures 422 covered by the SGD plug material 425 may be located in the same sub-block 414 as one another, and other of the pillar structures 422 covered by the SGD plug material 425 may be located in different sub-blocks 414 than one another. A material composition of the SGD plug material 425 may correspond to (e.g., be the same as) the material composition of the SGD plug structure 126 previously described with reference to FIGS. 1A and 1B. In some embodiments, the SGD plug material 425 is formed of and includes N-type polycrystalline silicon (e.g., polycrystalline silicon doped with at least one N-type dopant, such as polycrystalline silicon doped with phosphorous (P)).

The gate dielectric material 429 may be formed to vertically overlie and substantially continuously horizontally extend across and cover an upper surface of the SGD plug material 425. A material composition of the gate dielectric material 429 may correspond to (e.g., be the same as) the material composition of the gate dielectric structures 130 previously described with reference to FIG. 1A. In some embodiments, the gate dielectric material 429 is formed of and includes $SiO_x$ (e.g., $SiO_2$).

The channel material 433 may be formed to vertically overlie and substantially continuously horizontally extend across and cover an upper surface of the gate dielectric material 429. A material composition of the channel material 433 may correspond to (e.g., be the same as) the material composition of the channel structures 134 previously described with reference to FIGS. 1A and 1B. In some embodiments, the channel material 433 is formed of and includes lightly P-type doped polycrystalline silicon (e.g., polycrystalline silicon doped with at least one P-type dopant, such as polycrystalline silicon doped with B).

The backside dielectric material 473 may be formed to vertically overlie and substantially continuously horizontally extend across and cover an upper surface of the channel material 433. The backside dielectric material 473 may be formed of and include dielectric material, such as one or more of at least one dielectric oxide material (e.g., one or more of $SiO_x$, $AlO_x$, phosphosilicate glass, borosilicate glass, borophosphosilicate glass, fluorosilicate glass), at least one dielectric nitride material (e.g., $SiN_y$), and at least one low-K dielectric material (e.g., one or more of $SiO_xC_y$, $SiO_xN_y$, $SiC_xO_yH_z$, and $SiO_xC_zN_y$). The backside dielectric material 473 may be substantially homogeneous, or the backside dielectric material 473 may be heterogeneous. In some embodiments, the backside dielectric material 473 is formed of and includes $SiO_x$ (e.g., $SiO_2$).

The dielectric cap material 475 may be formed to vertically overlie and substantially continuously horizontally extend across and cover an upper surface of the backside dielectric material 473. The dielectric cap material 475 may be formed of and include dielectric material, such as one or more of at least one dielectric oxide material (e.g., one or more of $SiO_x$, $AlO_x$, phosphosilicate glass, borosilicate glass, borophosphosilicate glass, fluorosilicate glass), at least one dielectric nitride material (e.g., $SiN_y$), and at least one low-K dielectric material (e.g., one or more of $SiO_xC_y$, $SiO_xN_y$, $SiC_xO_yH_z$, and $SiO_xC_zN_y$). A material composition of the dielectric cap material 475 may be different than a material composition of the backside dielectric material 473. The dielectric cap material 475 may be substantially homogeneous, or the dielectric cap material 475 may be heterogeneous. In some embodiments, the dielectric cap material 475 is formed of and includes $SiN_y$ (e.g., $Si_3N_4$).

Figures 4E, 4F:
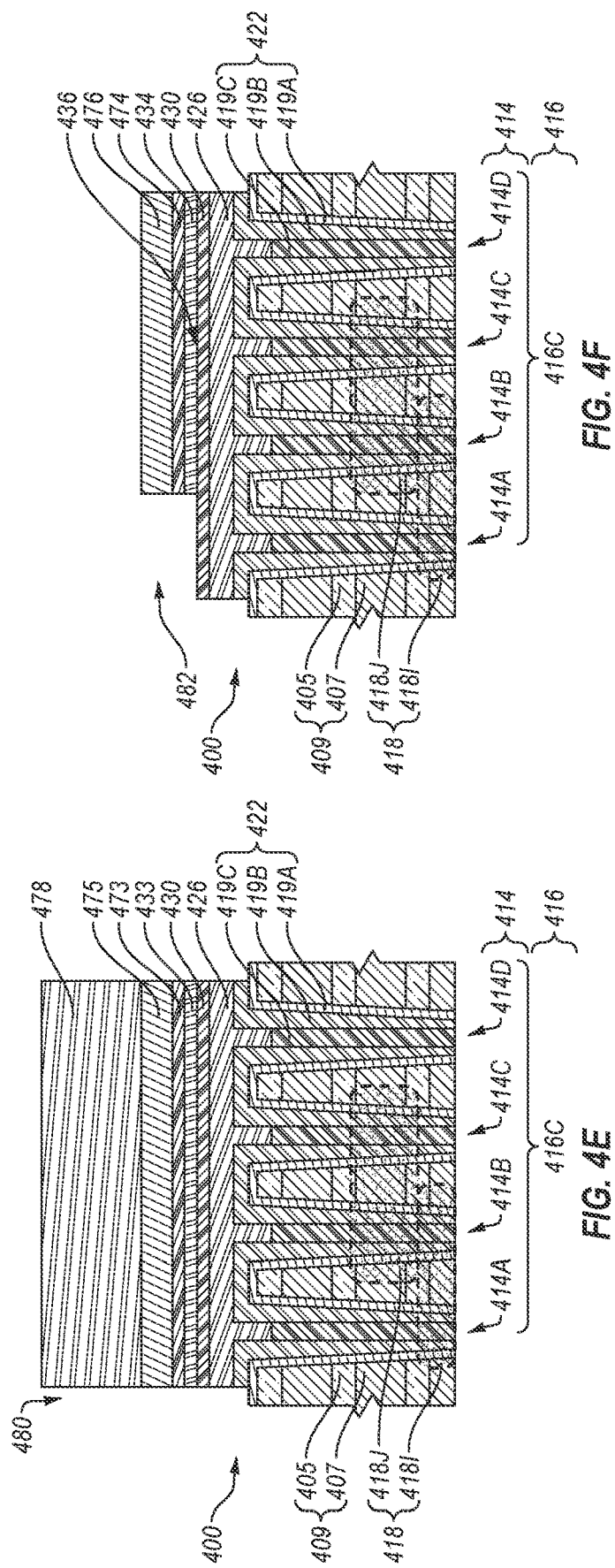

Referring next to FIG. 4E, which is a simplified, longitudinal cross-sectional view of the portion of the microelectronic device structure 400 shown in FIG. 4D following the processing stage previously described with reference to FIG. 4D, a third masking structure 478 may be formed on or over the dielectric cap material 475, and then portions of the dielectric cap material 475, the backside dielectric material 473, the channel material 433, the gate dielectric material 429 (FIG. 4D), the SGD plug material 425 (FIG. 4D), and the channel material 419B. The material removal process may form first openings 480 vertically extending from an upper boundary (e.g., an upper surface) of a remaining portion of the third masking structure 478 to or beyond an upper boundary of the cell film material 419A.

The material removal process of FIG. 4E may form SGD plug structures 426 from (e.g., from remaining portions of) the SGD plug material 425 (FIG. 4D), and may form gate dielectric structures 430 from (e.g., from remaining portions of) the gate dielectric material 429 (FIG. 4D). The SGD plug structures 426 may be formed to have configurations corresponding to (e.g., substantially the same as) the configurations of the SGD plug structures 126 previously described with reference to FIGS. 1A and 1B. In addition, the gate dielectric structures 430 may be formed to have configurations corresponding to (e.g., substantially the same as) the configurations of the gate dielectric structures 130 previously described with reference to FIG. 1A. The first openings 480 horizontally intervene between and separate horizontally neighboring SGD plug structures 126 and horizontally neighboring gate dielectric structures 130.

In some embodiments, the third masking structure 478 is a photoresist mask formed of and including photoresist material, such as positive tone photoresist material or negative tone photoresist material. The third masking structure 478 may, for example, be compatible with 13.7 nm, 157 nm, 193 nm, 248 nm, or 365 nm wavelength systems; with 193 nm wavelength immersion systems; and/or with electron beam lithographic systems. Furthermore, the first openings 480 may be formed using conventional processes (e.g., conventional photolithographic patterning and development processes, conventional etching processes) and conventional equipment, which are not described in detail herein.

Referring next to FIG. 4F, which is a simplified, longitudinal cross-sectional view of the portion of the microelectronic device structure 400 shown in FIG. 4E following the processing stage previously described with reference to FIG. 4E, portions of the third masking structure 478 (FIG. 4E) may be removed; additional portions of the dielectric cap material 475 (FIG. 4E), the backside dielectric material 473 475 (FIG. 4E), the channel material 433 475 (FIG. 4E) not covered by a remaining portion of the third masking structure 478 (FIG. 4E) may be removed; and the remaining portion of the third masking structure 478 (FIG. 4E) may be removed. The material removal process may form second openings 482 from some of the first openings 480 (FIG. 4E), wherein horizontal dimensions of the second openings 482 at vertical positions above of the gate dielectric structures 430 are relatively greater than horizontal dimensions of the first openings 480 (FIG. 4E) at the vertical positions above of the gate dielectric structures 430. As shown in FIG. 4E, portions of upper surfaces of the gate dielectric structures 430 may be exposed by the second openings 482.

The material removal process of FIG. 4F may form channel structures 434 from (e.g., from remaining portions of) the channel material 433 (FIG. 4E), backside dielectric structures 474 from (e.g., from remaining portions of) the backside dielectric material 473 (FIG. 4E), and dielectric cap structures 476 from (e.g., from remaining portions of) dielectric cap material 475 (FIG. 4E). The channel structures 434 may be formed to have configurations corresponding to (e.g., substantially the same as) the configurations of the channel structures 134 previously described with reference to FIGS. 1A and 1B. In addition, the backside dielectric structures 474 and the dielectric cap structures 476 may be formed to have horizontal areas, horizontal shape, and horizontal positions substantially the same as the horizontal areas, the horizontal shapes, and the horizontal positions of the channel structures 434, respectively.

The material removal process of FIG. 4F may form horizontal sense transistors 436 of the microelectronic device structure 400. Each of the horizontal sense transistors 436 may individually including one (1) of the SGD plug structures 426, one (1) of the channel structures 434, and one (1) of the gate dielectric structures 430 vertically interposed between the one (1) of the SGD plug structures 426 and the one (1) of the channel structures 434. The horizontal sense transistors 436 may be formed to have configurations corresponding to (e.g., substantially the same as) the configurations of the horizontal sense transistors 136 previously described with reference to FIGS. 1A and 1B. In addition, each of the horizontal sense transistors 436 may be operatively associated with a group of the pillar structures 422 in a manner corresponding to (e.g., substantially the same as) that previously described in relation to operative association of the horizontal sense transistors 136 (FIGS. 1A and 1B) with the pillar groups 124 (FIG. 1A) of the pillar structures 122 (FIGS. 1A and 1B).

Referring next to FIG. 4G, which is a simplified, longitudinal cross-sectional view of the portion of the microelectronic device structure 400 shown in FIG. 4F following the processing stage previously described with reference to FIG. 4F, isolation material 484 may be formed on or over exposed surfaces of the microelectronic device structure 400. As shown in FIG. 4G, the isolation material 484 may substantially fill the first openings 480 (FIG. 4E) and the second openings 482 (FIG. 4F). The isolation material 484 may be formed on surfaces of the SGD plug structures 426, the gate dielectric structures 430, the channel structures 434, the backside dielectric structures 474, and the dielectric cap structures 476. An upper vertical boundary (e.g., an upper surface) of the isolation material 484 may be substantially planar, and a lower vertical boundary (e.g., a lower surface) of the isolation material 484 may be non-planar.

The isolation material 484 may be formed of and include dielectric material, such as one or more of at least one dielectric oxide material (e.g., one or more of $SiO_x$, $AlO_x$, phosphosilicate glass, borosilicate glass, borophosphosilicate glass, fluorosilicate glass), at least one dielectric nitride material (e.g., $SiN_y$), and at least one low-K dielectric material (e.g., one or more of $SiO_xC_y$, $SiO_xN_y$, $SiC_xO_yH_z$, and $SiO_xC_zN_y$). The isolation material 484 may be substantially homogeneous, or the isolation material 484 may be heterogeneous. In some embodiments, the isolation material 484 is formed of and includes $SiO_x$ (e.g., $SiO_2$).

Referring next to FIG. 4H, which is a simplified, longitudinal cross-sectional view of the portion of the microelectronic device structure 400 shown in FIG. 4G following the processing stage previously described with reference to FIG. 4G, an additional preliminary stack structure including preliminary selector tiers 437 each including additional sacrificial material 439 and additional insulative material 441 may be formed on or over the isolation material 484; and then pillar openings 485 may be formed to vertically extend therethrough and to the horizontal sense transistors 436. The pillar openings 485 may include first read pillar openings 485A, second read pillar openings 485B, and write pillar openings 485C.

The additional sacrificial material 439 of each of the preliminary selector tiers 437 of the additional preliminary stack structure may be formed of and include at least one material (e.g., at least one insulative material) that may be selectively removed relative to the additional insulative material 441 during subsequent processing (e.g., subsequent "replacement gate" or "gate last" processing) of the microelectronic device structure 400, as described in further detail below. A material composition of the additional sacrificial material 439 is different than a material composition of the additional insulative material 441. The material composition of the sacrificial material 407 and may be substantially the same as the material composition of the sacrificial material 407 of the preliminary tiers 409 of the preliminary stack structure vertically underlying the SGD plug structures 426. The additional sacrificial material 439 may be selectively etchable relative to the additional insulative material 441 during common (e.g., collective, mutual) exposure to a first etchant, and the additional insulative material 441 may be selectively etchable to the additional sacrificial material 439 during common exposure to a second, different etchant. As a non-limiting example, the additional sacrificial material 439 may be formed of and include additional insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the additional sacrificial material 439 is formed of and includes dielectric nitride material, such as SiN y (e.g., $Si_3N_4$). The additional sacrificial material 439 of each of the preliminary selector tiers 437 may be substantially homogeneous, or the additional sacrificial material 439 of one or more (e.g., each) of the preliminary selector tiers 437 may be heterogeneous.

The additional insulative material 441 of each of the preliminary selector tiers 437 of the additional preliminary stack structure may be formed of and include at least one dielectric material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the additional insulative material 441 of each of the preliminary selector tiers 437 of the additional preliminary stack structure is formed of and includes dielectric oxide material, such as $SiO_x$ (e.g., $SiO_2$). The additional insulative material 441 of each of the preliminary selector tiers 437 may be substantially homogeneous, or the additional insulative material 441 of one or more (e.g., each) of the preliminary selector tiers 437 may be heterogeneous.

The additional preliminary stack structure may be formed to include any desired quantity of the preliminary selector tiers 437. As shown in FIG. 4I1 in some embodiments, the additional preliminary stack structure is formed to include three (3) of the preliminary selector tiers 437, a first preliminary selector tier 437A, a second preliminary selector tier 437B, and a third preliminary selector tier 437C. In additional embodiments, the additional preliminary stack structure is formed to include a different quantity of the preliminary selector tiers 437, such as two (2) of the preliminary selector tiers 437, or greater than or equal to four (4) of the preliminary selector tiers 437.

Still referring to FIG. 4H, the first read pillar openings 485A and the second read pillar openings 485B may be positioned within horizontal areas of the channel structures 434 (and, hence, the dielectric cap structures 476 and the backside dielectric structures 474), and may vertical extend to or into the backside dielectric structures 474. The write pillar openings 485C may be positioned outside of the horizontal areas of the channel structures 434 (and, hence, the dielectric cap structures 476 and the backside dielectric structures 474) but within horizontal areas of the SGD plug structures 426, and may vertically extend to or into the SGD plug structures 426. Within a horizontal area of an individual SGD plug structure 426, one (1) of the first read pillar openings 485A and one (1) of the second read pillar openings 485B may be formed to vertically extend to and expose portions of one (1) of the backside dielectric structures 474; and one (1) of the write pillar openings 485C may be formed to vertically extend to and expose a portion of the SGD plug structures 426. As shown in FIG. 4H, an individual write pillar openings 485C may be formed to vertically extend through the preliminary selector tiers 437 (including through the additional sacrificial material 439 and additional insulative material 441 thereof), the isolation material 484, and an individual gate dielectric structures 430, and into an individual SGD plug structure 426. In addition, each of an individual first read pillar opening 485A and an individual second read pillar openings 485B may be formed to vertically extend through the preliminary selector tiers 437 (including through the additional sacrificial material 439 and additional insulative material 441 thereof), the isolation material 484, and an individual dielectric cap structure 476, and to or into an individual backside dielectric structure 474.

The first read pillar openings 485A, the second read pillar openings 485B, and the write pillar openings 485C may be formed substantially simultaneously within one another. In some embodiments, the formation of the first read pillar openings 485A, the second read pillar openings 485B, and the write pillar openings 485C utilizing multiple material removal processes. For example, by way of first material removal process (e.g., a first anisotropic etching process), initial portions of the first read pillar openings 485A and the second read pillar openings 485B may be formed substantially simultaneously with one another and initial portions of the write pillar openings 485C. The initial portions of the first read pillar openings 485A and the second read pillar openings 485B may vertically terminate at or within the dielectric cap structures 476. The initial portions of the write pillar openings 485C may vertically terminate at or within the SGD plug structures 426. Next, by way of second material removal process (e.g., a second anisotropic etching process), the initial portions of the first read pillar openings 485A and the second read pillar openings 485B and the initial portions of the write pillar openings 485C may be vertically extended substantially simultaneously with one another to form the first read pillar openings 485A, the second read pillar openings 485B, and the write pillar openings 485C, respectively. The second material removal process may remove portions of the dielectric cap structures 476 exposed by the initial portions of the first read pillar openings 485A and the second read pillar openings 485B, and may also remove portions of the SGD plug structures 426 exposed by the initial portions of the write pillar openings 485C.

Referring next to FIG. 4I, which is a simplified, longitudinal cross-sectional view of the portion of the microelectronic device structure 400 shown in FIG. 4H following the processing stage previously described with reference to FIG. 4H, gate dielectric material 488 may be formed inside and outside of the pillar openings 485 (FIG. 4H), and then portions of the microelectronic device structure 400 vertically underlying and within horizontal areas of the pillar openings 485 (FIG. 4H) may be removed to vertically extend the pillar openings 485 (FIG. 4H) and form extended pillar openings 486. The extended pillar openings 486 may include first extended read pillar openings 486A, second extended read pillar openings 486B, and extended write pillar openings 486C.

As shown in FIG. 4I, the gate dielectric material 488 may be formed on and may substantially cover side surfaces of the preliminary selector tiers 437 (including side surfaces of the additional sacrificial material 439 and additional insulative material 441 thereof) partially defining the pillar openings 485 (FIG. 4H). The gate dielectric material 488 may also be formed on and may substantially cover an upper surface of an uppermost one of the preliminary selector tiers 437 outside of the horizontal boundaries of the pillar openings 485 (FIG. 4H). For portions of gate dielectric material 488 partially defining the first extended read pillar openings 486A and the second extended read pillar openings 486B, the gate dielectric material 488 may also be formed on and may substantially cover side surfaces of the dielectric cap structures 476, and may vertically terminate at or within the backside dielectric structures 474. Vertical dimensions of the portions of the gate dielectric material 488 partially defining the first extended read pillar openings 486A and the second extended read pillar openings 486B may be less than the vertical dimensions of the first extended read pillar openings 486A and the second extended read pillar openings 486B. Furthermore, for additional portions of the gate dielectric material 488 partially defining the extended write pillar openings 486C, the gate dielectric material 488 may vertically terminate at or within the SGD plug structures 426. Vertical dimensions of the additional portions of the gate dielectric material 488 partially defining the extended write pillar openings 486C may be less than the vertical dimensions of the extended write pillar openings 486C.

The gate dielectric material 488 may be formed of and include dielectric material, such as one or more of at least one dielectric oxide material (e.g., one or more of $SiO_x$, $AlO_x$, phosphosilicate glass, borosilicate glass, borophosphosilicate glass, fluorosilicate glass), at least one dielectric nitride material (e.g., SiN y), and at least one low-K dielectric material (e.g., one or more of $SiO_xC_y$, $SiO_xN_y$, $SiC_xO_yH_z$, and $SiO_xC_zN_y$). The gate dielectric material 488 may be substantially homogeneous, or the gate dielectric material 488 may be heterogeneous. In some embodiments, the gate dielectric material 488 is formed of and includes $SiO_x$ (e.g., $SiO_2$).

Still referring to FIG. 4I, the first extended read pillar openings 486A and the second extended read pillar openings 486B may have horizontal boundaries defined by side surfaces of the gate dielectric material 488, the backside dielectric structures 474, and the channel structures 434; and may have lower vertical boundaries defined by upper surfaces of the gate dielectric structures 430. Horizontal dimensions of portions of the first extended read pillar openings 486A and the second extended read pillar openings 486B at vertical positions of the backside dielectric structures 474 and lower portions of the dielectric cap structures 476 may be relatively smaller (e.g., horizontally narrower) than horizontal dimensions of additional portions of the first extended read pillar openings 486A and the second extended read pillar openings 486B at vertical positions of the channel structures 434 and the preliminary selector tiers 437.

Still referring to FIG. 4I, the extended write pillar openings 486C may have horizontal boundaries defined by side surfaces of the gate dielectric material 488 and the SGD plug structures 426; and may have lower vertical boundaries defined by surfaces of the SGD plug structures 426. Horizontal dimensions of portions of the extended write pillar openings 486C at relatively higher vertical positions within the SGD plug structures 426 may be relatively smaller (e.g., horizontally narrower) than horizontal dimensions of additional portions of the first extended read pillar openings 486A and the second extended read pillar openings 486B at relatively lower vertical positions within the SGD plug structures 426 and at vertical positions of isolation material 484 and the preliminary selector tiers 437.

To form the gate dielectric material 488 and the extended pillar openings 486, the gate dielectric material 488 may be formed inside and outside of the pillar openings 485 (FIG. 4H) and may partially (e.g., less than completely) fill the pillar openings 485 (FIG. 4H). Thereafter, a sacrificial liner material, such as a semiconductor liner material (e.g., polycrystalline silicon liner) may be formed on or over the gate dielectric material 488, and may partially (e.g., less than completely) fill remaining portions of the pillar openings 485 (FIG. 4H). A relative thickness of the sacrificial liner material formed within the pillar openings 485 (FIG. 4H) is represented by way of the dashed line 490 within the extended write pillar opening 486C shown in FIG. 4I. Following the formation of sacrificial liner material, portions of the semiconductor liner material and the gate dielectric material 488 proximate lower vertical boundaries (e.g., bottoms) of the pillar openings 485 (FIG. 4H) may be removed, such as by way of a so-called "punch through" etch. Within horizontal areas of the first read pillar openings 485A (FIG. 4H) and the second read pillar openings 485B (FIG. 4H), the material removal process may expose positions of the channel structures 434. Within horizontal areas of the write pillar openings 485C (FIG. 4H), material removal process may expose positions of the SGD plug structures 426. Thereafter, at least one additional material removal process (e.g., at least one etching process, such as at least one wet etching process) may be performed to remove the semiconductor liner material, as well as exposed portions of the channel structures 434 and expose positions of the SGD plug structures 426. The additional material removal process may vertically recess and horizontally recess portions of the channel structures 434, and may complete the formation of the first extended read pillar openings 486A and the second extended read pillar openings 486B. The additional material removal process may also vertically recess and horizontally recess the portions of the SGD plug structures 426, and may complete the formation of the extended write pillar openings 486C.

Referring next to FIG. 4J, which is a simplified, longitudinal cross-sectional view of the portion of the microelectronic device structure 400 shown in FIG. 4J following the processing stage previously described with reference to FIG. 4J, additional channel material 492, additional dielectric fill material 494, and plug material 496 may be formed inside and outside of the extended pillar openings 486 (FIG. 4I) (including the first extended read pillar openings 486A (FIG. 4I), the second extended read pillar openings 486B (FIG. 4I), and the extended write pillar openings 486C (FIG. 4I)); and then portions of the gate dielectric material 488, the additional channel material 492, the additional dielectric fill material 494, and the plug material 496 outside of the boundaries of the extended pillar openings 486 (FIG. 4I) may be removed (e.g., by way of a CMP process) to form write select pillar structures 444, first read select pillar structures 446, and second read select pillar structures 448. The write select pillar structures 444, the first read select pillar structures 446, and the second read select pillar structures 448 may respectively be formed to have configurations corresponding to (e.g., substantially the same as) the configurations of the write select pillar structures 144, the first read select pillar structures 146, and the second read select pillar structures 148 previously described with reference to FIGS. 1A and 1B.

As shown in FIG. 4J, the additional channel material 492 may be formed to substantially fill portions of the extended write pillar openings 486C (FIG. 4I) at the vertical position of the SGD plug structures 426. Accordingly, the additional channel material 492 of the write select pillar structures 444 may be formed to contact (e.g., physically contact, electrically contact) the SGD plug structures 426 of the horizontal sense transistors 436. The additional channel material 492 may also substantially fill additional portions of the extended write pillar openings 486C (FIG. 4I) at the vertical positions of the gate dielectric structures 430. In addition, additional channel material 492 may partially fill further portions of the extended write pillar openings 486C (FIG. 4I) vertically overlying the additional portions of the extended write pillar openings 486C (FIG. 4I), such as portions extending from the gate dielectric structures 430 to or beyond an upper boundary of an uppermost one of the preliminary selector tiers 437.

As also shown in FIG. 4J, the additional channel material 492 may be formed to substantially fill portions of the first extended read pillar openings 486A (FIG. 4I) and the second extended read pillar openings 486B (FIG. 4I) at the vertical position of the channel structures 434. Accordingly, the additional channel material 492 of the first read select pillar structures 446 and the second read select pillar structures 448 may be formed to contact (e.g., physically contact, electrically contact) the channel structures 434 of the horizontal sense transistors 436. The additional channel material 492 may also substantially fill additional portions of the first extended read pillar openings 486A (FIG. 4I) and the second extended read pillar openings 486B (FIG. 4I) at the vertical positions of the backside dielectric structures 474 and lower portions of the dielectric cap structures 476. In addition, additional channel material 492 may partially fill further portions of the first extended read pillar openings 486A (FIG. 4I) and the second extended read pillar openings 486B (FIG. 4I) vertically overlying the additional portions of the first extended read pillar openings 486A (FIG. 4I) and the second extended read pillar openings 486B (FIG. 4I), such as portions extending from the lower portions of the dielectric cap structures 476 to or beyond an upper boundary of an uppermost one of the preliminary selector tiers 437.

The additional dielectric fill material 494 may partially fill portions of the extended pillar openings 486 (FIG. 4I) not occupied by the additional channel material 492. For each of the write select pillar structures 444, the first read select pillar structures 446, and the second read select pillar structures 448, surfaces of the additional channel material 492 may define horizontal boundaries and lower vertical boundaries of the additional dielectric fill material 494; and an upper vertical boundary (e.g., an upper surface) of the additional dielectric fill material 494 may be formed to be vertically recessed (e.g., to vertically underlie) relative to an upper vertical boundary of the additional channel material 492. The additional dielectric fill material 494 may be formed on the additional channel material 492, and may be formed of and include dielectric material (e.g., one or more of dielectric oxide material, dielectric nitride material, and an air gap).

The plug material 496 may fill upper portions of the extended pillar openings 486 (FIG. 4I) not occupied by the additional channel material 492 and the additional dielectric fill material 494. For each of the write select pillar structures 444, the first read select pillar structures 446, and the second read select pillar structures 448, side surfaces of the additional channel material 492 may define horizontal boundaries of the plug material 496, and upper surfaces of the additional dielectric fill material 494 may define lower vertical boundaries of the plug material 496. An upper vertical boundary (e.g., an upper surface) of the plug material 496 may be formed to be substantially coplanar with to the upper vertical boundary (e.g., the upper surface) of the additional channel material 492. The plug material 496 may be formed on the additional dielectric fill material 494 and the additional channel material 492. The plug material 496 may be formed of and include conductive material, such as semiconductor material (e.g., polycrystalline silicon) doped with doped with at least one conductivity-enhancing dopant (e.g., at least one N-type dopant, such as one or more of P, As, Sb, and Bi; at least one P-type dopant, such as one or more of B, Al, and Ga). In some embodiments, the plug material 496 is formed of and includes N-type polycrystalline silicon (e.g., polycrystalline silicon doped with at least one N-type dopant, such as polycrystalline silicon doped with phosphorous (P)).

Referring next to FIG. 4K, which is a simplified, longitudinal cross-sectional view of the portion of the microelectronic device structure 400 shown in FIG. 4J following the processing stage previously described with reference to FIG. 4J, at least one third masking structure 497 including openings vertically extending therethrough may be formed on or over an uppermost one of the preliminary selector tiers 437 (e.g., on or over the third preliminary selector tier 437C), and then one or more conductivity-enhancing species may be provided (e.g., implanted) into one or more of the preliminary selector tiers 437 at horizontal positions of the openings in the third masking structure 497. The doping process may form some doped sections 442 (e.g., first doped sections 442A) and some further doped sections 443 at desired vertical positions within vertical boundaries of the preliminary selector tiers 437. As a non-limiting example, first doped sections 442A corresponding to the first doped sections 142A previously described with reference to FIG. 1A may be formed at horizontal positions and vertical locations corresponding to those previously described with reference to FIG. 1A. As another non-limiting example, further doped sections 443 may be formed to vertically overlie and at least partially horizontally overlap the first doped sections 442A.

In some embodiments, the third masking structure 497 is a photoresist mask formed of and including photoresist material, such as positive tone photoresist material or negative tone photoresist material. The third masking structure 497 may, for example, be compatible with 13.7 nm, 157 nm, 193 nm, 248 nm, or 365 nm wavelength systems; with 193 nm wavelength immersion systems; and/or with electron beam lithographic systems. In addition, the openings in the third masking structure 497 may be formed using conventional processes (e.g., conventional photolithographic patterning and development processes) and conventional equipment, which are not described in detail herein.

To form the first doped sections 442A, at least one conductivity-enhancing species (e.g., at least one P-type dopant) may be implanted into portions of the first preliminary selector tier 437A within horizontal areas of the openings in the third masking structure 497 and into portions of the write select pillar structures 444 at the vertical position of the first preliminary selector tier 437A. In some embodiments, the conductivity-enhancing species includes at least one P-type dopant (e.g., one or more of B, Al, and Ga). The conductivity-enhancing species (e.g., P-type dopant) may be implanted using conventional implantation processes (e.g., a PLAD implantation process, a BL implantation process) and equipment, which are not described in detail herein.

To form the further doped sections 443, at least one additional conductivity-enhancing species (e.g., at least one N-type dopant) different than that employed in the first doped sections 442A may be implanted into portions of the second preliminary selector tier 437B within the horizontal areas of the openings in the third masking structure 497 and into portions of the write select pillar structures 444 at the vertical position of the second preliminary selector tier 437B. In some embodiments, the additional conductivity-enhancing species includes at least one N-type dopant (e.g., one or more of P, As, Sb, and Bi). The further doped sections 443 may be formed after the formation of the first doped sections 442A. The additional conductivity-enhancing species (e.g., N-type dopant) may be implanted using conventional implantation processes (e.g., a PLAD implantation process, a BL implantation process) and equipment, which are not described in detail herein.

Referring next to FIG. 4L, which is a simplified, longitudinal cross-sectional view of the portion of the microelectronic device structure 400 shown in FIG. 4K following the processing stage previously described with reference to FIG. 4K, one or more additional conductivity-enhancing species may be provided (e.g., implanted) into one or more of the preliminary selector tiers 437. The doping process may at least form some more doped sections 442 (e.g., second doped sections 442B, third doped sections 442C) at desired vertical positions within vertical boundaries of the preliminary selector tiers 437. As a non-limiting example, second doped sections 442B and third doped sections 442C respectively corresponding to the second doped sections 142B and the third doped sections 142C previously described with reference to FIG. 1A may be formed at horizontal positions and vertical locations corresponding to those previously described with reference to FIG. 1A.

To form the second doped sections 442B, at least one conductivity-enhancing species (e.g., at least one P-type dopant) may be implanted into portions of the second preliminary selector tier 437B and at least into portions of the first read select pillar structures 446 and the second read select pillar structures 448 at the vertical position of the second preliminary selector tier 437B. In some embodiments, the conductivity-enhancing species includes at least one P-type dopant (e.g., one or more of B, Al, and Ga). Optionally, the conductivity-enhancing species may also implanted into portions of the write select pillar structures 444 at the vertical position of the second preliminary selector tier 437B, such that the portions of the write select pillar structures 444 are doped with at least one conductivity-enhancing species (e.g., at least one N-type dopant) as a result of the processing stage of FIG. 4K and are also doped with at least one different conductively enhancing species (e.g., at least one P-type dopant) as a result of the processing stage of FIG. 4K. As a result, the write selector transistors subsequently formed at the portions of the write select pillar structures 444 at the vertical position of the second preliminary selector tier 437B may have different $V_t$ (e.g., negative $V_t$) characteristics than $V_t$ (e.g., positive $V_t$) characteristics of read selector transistors subsequently formed at the portions of the read select pillar structures 446 at the vertical position of the second preliminary selector tier 437B. The conductivity-enhancing species (e.g., P-type dopant) may be implanted during that processing stage of FIG. 4L using conventional implantation processes (e.g., a PLAD implantation process, a BL implantation process) and equipment, which are not described in detail herein.

To form the third doped sections 442C, at least one conductivity-enhancing species (e.g., at least one P-type dopant) may be implanted into portions of the third preliminary selector tier 437C and into portions of the write select pillar structures 444, the first read select pillar structures 446, and the second read select pillar structures 448 at the vertical position of the third preliminary selector tier 437C. In some embodiments, the conductivity-enhancing species includes at least one P-type dopant (e.g., one or more of B, Al, and Ga). The conductivity-enhancing species (e.g., P-type dopant) may be implanted using conventional implantation processes (e.g., a PLAD implantation process, a BL implantation process) and equipment, which are not described in detail herein.

Figure 4M:
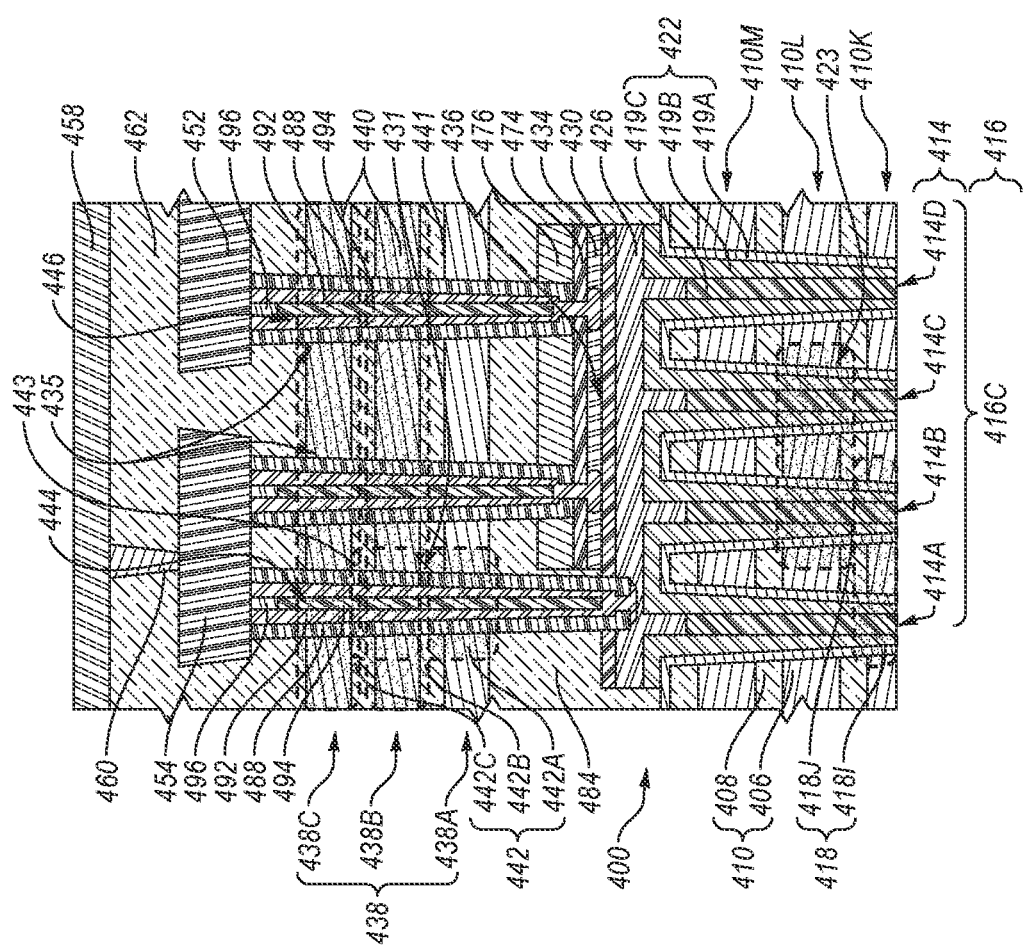

Referring next to FIG. 4M, which is a simplified, longitudinal cross-sectional view of the portion of the microelectronic device structure 400 shown in FIG. 4M following the processing stage previously described with reference to FIG. 4M, the preliminary tiers 409 (FIG. 4K) and the preliminary selector tiers 437 (FIG. 4K) may be subjected to so-called "replacement gate" or "gate last" processing to form tiers 410 from the preliminary tiers 409 (FIG. 4K) and selector tiers 428 from the preliminary selector tiers 437 (FIG. 4K). The tiers 410 may each include at least one conductive structure 406 vertically neighboring at least one insulative structure 408; and the selector tiers 438 may each include at least one additional conductive structure 440 vertically neighboring a remaining portion of the additional insulative material 441. Following the replacement gate process, read source line structures 452 may be formed vertically over and in contact (e.g., physical contact, electrical contact) with the first read select pillar structures 446; and local strap structures 454 may be formed vertically over and in contact (e.g., physical contact, electrical contact) with the write select pillar structures 444 and the second read select pillar structures 448. Thereafter, digit line contact structures 460 may be formed vertically over and in contact (e.g., physical contact, electrical contact) with the local strap structures 454; and digit line structures 458 may be formed vertically over and in contact with the digit line contact structures 460. The tiers 410, the selector tiers 438, the read source line structures 452, the local strap structures 454, the digit line contact structures 460, and the digit line structures 458 may respectively be formed to have configurations corresponding to (e.g., substantially the same as) the configurations of the tiers 110, the selector tiers 138, the read source line structures 152, the local strap structures 154, the digit line contact structures 160, and the digit line structures 158 previously described with reference to FIGS. 1A and 1B.

Referring to back to FIG. 4K, the replacement gate process effectuated at the processing stage of FIG. 4M may include forming slots (e.g., slits, openings) vertically extending through the preliminary selector tiers 437 and the preliminary tiers 409, and then treating the microelectronic device structure 400 with at least one wet etchant formulated to selectively remove portions of the sacrificial material 407 of the preliminary tiers 409 and the additional sacrificial material 439 of the preliminary selector tiers 437 through the slots. The wet etchant may be selected to remove the portions of the sacrificial material 407 and the additional sacrificial material 439 without substantially removing portions of the insulative material 405 of the preliminary tiers 409 and additional insulative material 441 of the preliminary selector tiers 437. In some embodiments wherein the sacrificial material 407 and the additional sacrificial material 439 comprise dielectric nitride material (e.g., $SiN_y$, such as $Si_3N_4$) and the insulative material 405 and the additional insulative material 441 comprise dielectric oxide material (e.g., $SiO_x$, such as $SiO_2$), the sacrificial material 407 and the additional sacrificial material 439 are selectively removed using a wet etchant comprising $H_3PO_4$. Following the selective removal of the portions of the sacrificial material 407 and the additional sacrificial material 439, the resulting recesses may be filled with conductive material to form the conductive structures 406 (FIG. 4M) and the additional conductive structures 440 (FIG. 4M). The conductive structures 406 (FIG. 4M) and the additional conductive structures 440 (FIG. 4M) may be formed substantially simultaneously with one another through the replacement gate process.

Referring again to FIG. 4M, the replacement gate process may effectuate the formation of select transistors 423 within vertical boundaries of the tiers 410 of the microelectronic device structure 400, as well as the formation of write selector transistors 431 and read selector transistors 435 within vertical boundaries of the selector tiers 438 of the microelectronic device structure 400. The select transistors 423, the write selector transistors 431, and read selector transistors 435 may respectively have configurations corresponding to (e.g., substantially the same as) the configurations of select transistors 123, the write selector transistors 131, and read selector transistors 135 previously described with reference to FIGS. 1A and 1B. In addition, the replacement gate process may also effectuate the formation of strings of memory cells operatively associated with the pillar structures 422, wherein the strings of memory cells have configurations corresponding to (e.g., substantially the same as) the configurations of the strings of memory cells 121 previously described with reference to FIGS. 1A and 1B.

Following the replacement gate process, the read source line structures 452, the local strap structures 454, the digit line contact structures 460, the digit line structures 458, and different portions of at least one isolation material 462 may be individually formed using conventional processes (e.g., convention material deposition processes, conventional photolithographic patterning processes, conventional material removal processes) and conventional processing equipment, which are not described in detail herein.

Thus, in accordance with embodiments of the disclosure, a method of forming a microelectronic device comprises forming pillar structures to vertically extend through a stack structure comprising tiers each including sacrificial material vertically adjacent insulative material. P-type dopant is implanted into different horizontal portions of some of the tiers and into portions of the pillar structures at vertical positions of the some of the tiers. Sense transistors are formed vertically over the stack structure. The sense transistors are coupled to different groups of the pillar structures than one another. An additional stack structure is formed over the sense transistors. The additional stack structure comprises additional tiers each including additional sacrificial material vertically adjacent additional insulative material. Additional pillar structures are formed to vertically extend through the additional stack structure and to the sense transistors. Additional P-type dopant is implanted into different horizontal portions of two or more of the additional tiers and into portions of the additional pillar structures at vertical elevations of the two or more of the additional tiers. The sacrificial material and the additional sacrificial material are replaced with conductive material. Conductive line structures are formed over and in electrical communication with the additional pillar structures.

Figure 5:
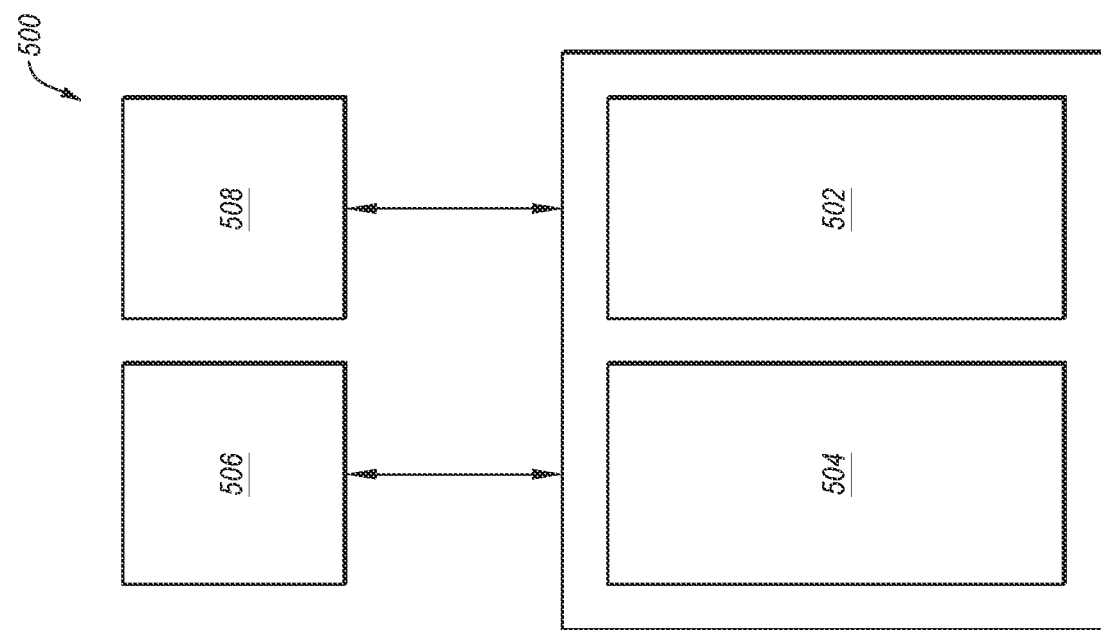
FIG. 5 is a schematic block diagram of an electronic system, in accordance with embodiments of the disclosure.

Microelectronic devices structures (e.g., the microelectronic device structures 100, 200, 300, 400) and microelectronic devices in accordance with embodiments of the disclosure may be used in embodiments of electronic systems of the disclosure. For example, FIG. 5 is a schematic block diagram of an illustrative electronic system 500 according to embodiments of disclosure. The electronic system 500 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, one or more of an iPad® or SURFACE® tablet, an electronic book, and a navigation device. The electronic system 500 includes at least one memory device 502. The memory device 502 may comprise, for example, one or more of a microelectronic device structure (e.g., one or more of the microelectronic device structures 100, 200, 300, 400) and a microelectronic device previously described herein. The electronic system 500 may further include at least one electronic signal processor device 504 (often referred to as a "microprocessor"). The electronic signal processor device 504 may, optionally, include one or more of a microelectronic device structure (e.g., one or more of the microelectronic device structures 100, 200, 300, 400) and a microelectronic device previously described herein. While the memory device 502 and the electronic signal processor device 504 are depicted as two (2) separate devices in FIG. 5, in additional embodiments, a single (e.g., only one) memory/processor device having the functionalities of the memory device 502 and the electronic signal processor device 504 is included in the electronic system 500. In such embodiments, the memory/processor device may include one or more of a microelectronic device structure (e.g., one or more of the microelectronic device structures 100, 200, 300, 400) and a microelectronic device previously described herein. The electronic system 500 may further include one or more input devices 506 for inputting information into the electronic system 500 by a user, such as, for example, a mouse or other pointing device, a keyboard, a touchpad, a button, or a control panel. The electronic system 500 may further include one or more output devices 508 for outputting information (e.g., visual or audio output) to a user such as, for example, one or more of a monitor, a display, a printer, an audio output jack, and a speaker. In some embodiments, the input device 506 and the output device 508 may comprise a single touchscreen device that can be used both to input information to the electronic system 500 and to output visual information to a user. The input device 506 and the output device 508 may communicate electrically with one or more of the memory device 502 and the electronic signal processor device 504.

Thus, an electronic system in accordance with embodiments of the disclosure comprises an input device, an output device, a processor device operably connected to the input device and the output device, and a memory device operably connected to the processor device. The memory device comprises pillar structures vertically extending through blocks of a stack structure comprising conductive material vertically alternating with insulative material; conductive plug structures within horizontal areas of the blocks of the stack structure and coupled to different groups of the pillar structures than one another, each of the different groups of the pillar structures including multiple of the pillar structures positioned within different sub-blocks of one of the blocks than one another; horizontal sense transistors gated by the conductive plug structures; read source lines vertically overlying the horizontal sense transistors; digit lines vertical overlying the read source lines; first vertical read selector transistors vertically interposed between and in electrical communication with the read source lines and source regions of the horizontal sense transistors; second vertical read selector transistors vertically interposed between and in electrical communication with the digit lines structures and drain regions of the horizontal sense transistors; and vertical write selector transistors vertically interposed between and in electrical communication with the digit lines structures and the conductive plug structures.

The structures, devices, methods, and systems of the disclosure advantageously facilitate one or more of improved microelectronic device performance, reduced costs (e.g., manufacturing costs, material costs), increased miniaturization of components, and greater packaging density as compared to conventional structures, conventional devices, conventional methods, and conventional systems. The structure, devices, methods, and systems of the disclosure may also improve scalability, efficiency, and simplicity as compared to conventional structures, conventional devices, conventional methods, and conventional systems.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A microelectronic device, comprising:
a stack structure comprising a vertically alternating sequence of conductive material and insulative material, the stack structure divided into blocks separated by dielectric slot structures, the blocks individually including sub-blocks horizontally extending in parallel with one another;
pillar structures comprising semiconductor material vertically extending through one of the blocks of the stack structure, each pillar structure of a group of the pillar structures horizontally positioned within a different one of the sub-blocks of the one of the blocks than each other pillar structure of the group of the pillar structures;
a conductive plug structure coupled to and horizontally extending across and between multiple of the pillar structures of the group of the pillar structures;
a sense transistor gated by the conductive plug structure; and
selector transistors coupling the sense transistor to a read source line structure and a digit line structure.

2. The microelectronic device of claim 1, wherein the stack structure comprises tiers each including the conductive material and the insulative material vertically adjacent the conductive material, the tiers grouped into tier sections comprising:
an access line tier section comprising a first group of the tiers;
stacked drain side select gate (SGD) tier section overlying the access line tier section and comprising a second group of the tiers; and
a sense node tier section overlying the SGD tier section and comprising a third group of the tiers.

3. The microelectronic device of claim 2, wherein the conductive plug structure and portions of each of the second group of the tiers and the third group of the tiers within a horizontal area of the one of the blocks of the stack structure occupied by the group of the pillar structures define a sense node of the one of the blocks.

4. The microelectronic device of claim 2, wherein:
the second group of the tiers of the SGD tier section comprises:
a program-inhibit SGD tier overlying the access line tier section;
multiple SGD tiers overlying the program-inhibit SGD tier; and a read-amplification SGD tier overlying a second SGD tier; and the third group of the tiers of the sense node tier section comprises multiple select gate programming (SGP) tiers overlying the read-amplification SGD tier.

5. The microelectronic device of claim 4, wherein:
the multiple SGD tiers comprise:
a first SGD bar tier overlying the program-inhibit SGD tier;
a second SGD bar tier overlying the first SGD bar tier;
a first SGD tier overlying the second SGD bar tier; and
a second SGD tier overlying the first SGD tier; and
the multiple SGP tiers comprise:
a first SGP bar tier overlying the read-amplification SGD tier;
a second SGP bar tier overlying the first SGP bar tier;
a first SGP tier overlying the second SGP bar tier; and
a second SGP tier overlying the first SGP tier.

6. The microelectronic device of claim 5, wherein each of the first SGD bar tier, the second SGD bar tier, the first SGD tier, and the second SGD tier comprises a different horizontal arrangement of higher $V_t$ transistors and lower $V_t$ transistors within vertical boundaries thereof than each other of the first SGD bar tier, the second SGD bar tier, the first SGD tier, and the second SGD tier.

7. The microelectronic device of claim 5, wherein each of the first SGP bar tier, the second SGP bar tier, the first SGP tier, and the second SGP tier comprises a different horizontal arrangement of higher $V_t$ transistors and lower $V_t$ transistors within vertical boundaries thereof than each other of the first SGP bar tier, the second SGP bar tier, the first SGP tier, and the second SGP tier.

8. The microelectronic device of claim 4, wherein intersections of the pillar structures and the conductive material of at least some of the tiers within of the second group of the tiers and the third group of the tiers define select transistors within the blocks of the stack structure, some of the select transistors having a relatively higher threshold voltage level than some other of the select transistors.

9. The microelectronic device of claim 4, wherein the third group of the tiers of the sense node tier section further comprises a gate-induced drain-leakage (GIDL) generation tier overlying the multiple SGP tiers.

10. The microelectronic device of claim 1, wherein the group of the pillar structures comprises four of the pillar structures.

11. The microelectronic device of claim 1, wherein:
the sub-blocks of the blocks horizontally extend in parallel with the dielectric slot structures in a first direction; and
a horizontal orientation the conductive plug structure is acutely angled relative to the first direction.

12. The microelectronic device of claim 1, wherein:
conductive plug structure horizontally extends in parallel with the dielectric slot structures in a first direction; and
the sub-blocks of the blocks horizontally extend in parallel in a second direction acutely angled relative to the first direction.

13. The microelectronic device of claim 1, wherein the sense transistor comprises a horizontal sense transistor comprising:
the conductive plug structure;
a channel structure vertically overlying and only partially horizontally extending across the conductive plug structure; and
a gate dielectric structure vertically interposed between the conductive plug structure and the channel structure.

14. The microelectronic device of claim 13, wherein the selector transistors comprise vertical selector transistors, each of the vertical selector transistors comprising:
a semiconductive material comprising channel region vertically interposed between a source region and a drain region;
a gate electrode horizontally neighboring the semiconductive material and within vertical boundaries of the channel region; and
a gate dielectric material horizontally interposed between the semiconductive material and the gate electrode.

15. The microelectronic device of claim 1, the selector transistors comprise:
a write selector transistor vertically interposed between and coupled to the digit line structure and the conductive plug structure;
a first read selector transistor vertically interposed between and coupled to the read source line structure and a source side of a channel structure of the sense transistor; and
a second read selector transistor vertically interposed between and coupled to the digit line structure and a drain side of the channel structure of the sense transistor.

16. The microelectronic device of claim 15, further comprising:
a local strap structure coupled to each of the digit line structure, the write selector transistor, and the second read selector transistor; and
a digit line contact vertically interposed between and coupled to the local strap structure and the digit line structure.

17. The microelectronic device of claim 1, wherein:
the read source line structure vertically overlies the sense transistor;
the digit line structure vertically overlies the read source line structure; and
the selector transistors are vertically interposed between the read source line structure and the sense transistor.

18. The microelectronic device of claim 17, wherein the selector transistors comprise:
a write selector transistor vertically interposed between and coupled to the digit line structure and the conductive plug structure;
a read selector transistor vertically interposed between and coupled to one of:
the read source line structure and a source side of a channel structure of the sense transistor; and
the digit line structure and a drain side of the channel structure of the sense transistor.

19. The microelectronic device of claim 18, further comprising an additional read selector transistor having different $V_t$ characteristics than the read selector transistor, the additional read selector transistor vertically interposed between and coupled to an other of:
the read source line structure and the source side of the channel structure of the sense transistor; and
the digit line structure and the drain side of the channel structure of the sense transistor.

20. The microelectronic device of claim 18, further comprising a conductive contact structure vertically interposed between and coupled to an other of:
the read source line structure and the source side of the channel structure of the sense transistor; and
the digit line structure and the drain side of the channel structure of the sense transistor.

21. A method of forming a microelectronic device, comprising:
- forming pillar structures to vertically extend through a stack structure comprising tiers each including sacrificial material vertically adjacent insulative material;
- implanting P-type dopant into different horizontal portions of some of the tiers and into portions of the pillar structures at vertical positions of the some of the tiers;
- forming sense transistors vertically over the stack structure, the sense transistors coupled to different groups of the pillar structures than one another;
- forming an additional stack structure over the sense transistors, the additional stack structure comprising additional tiers each including additional sacrificial material vertically adjacent additional insulative material;
- forming additional pillar structures to vertically extend through the additional stack structure and to the sense transistors;
- implanting additional P-type dopant into different horizontal portions of two or more of the additional tiers and into portions of the additional pillar structures at vertical elevations of the two or more of the additional tiers;
- replacing the sacrificial material and the additional sacrificial material with conductive material; and
- forming conductive line structures over and in electrical communication with the additional pillar structures.

22. The method of claim 21, wherein forming pillar structures comprises forming the pillar structures to individually comprise:
- cell film material on surfaces of the stack structure;
- semiconductive channel material inwardly horizontally adjacent the cell film material; and
- dielectric fill material inwardly horizontally adjacent the semiconductive channel material.

23. The method of claim 21, further comprising selecting the P-type dopant to comprise boron.

24. The method of claim 21, wherein implanting the P-type dopant comprises forming a different pattern of regions doped with the P-type dopant at a vertical position of at least one tier of the some of the tiers than at a vertical position of at least one other tier of the some of the tiers.

25. The method of claim 21, wherein forming sense transistors vertically over the stack structure comprises:
- forming conductive plug material over the stack structure and the pillar structures;
- forming gate dielectric material over the conductive plug material;
- forming channel material over the gate dielectric material;
- forming back-side dielectric material over the channel material;
- forming dielectric cap material over the back-side dielectric material; and
- removing portions of the dielectric cap material, the back-side dielectric material, the channel material, the gate dielectric material, and the conductive plug material to respectively form dielectric cap structures, back-side dielectric structures, channel structures, gate dielectric structures, and conductive plug structures.

26. The method of claim 25, further comprising:
- forming each of the conductive plug structures to be coupled to and horizontally extend across and between a different group of multiple of the pillar structures than each other of the conductive plug structures; and
- forming the channel structures to be substantially confined within horizontal areas of the conductive plug structures and to have additional horizontal areas smaller than the horizontal areas of the conductive plug structures.

27. The method of claim 26, wherein forming additional pillar structures to vertically extend through the additional stack structure and to the sense transistors comprises:
- forming read select pillar structures vertically extending through the additional stack structure, the dielectric cap structures, and the back-side dielectric material and into the channel structures; and
- forming write select pillar structures vertically extending through the additional stack structure and into the conductive plug structures.

28. The method of claim 21, wherein replacing the sacrificial material and the additional sacrificial material with conductive material comprises:
- forming slots vertically extending through the additional stack structure and the stack structure;
- simultaneously removing the sacrificial material of the tiers of the stack structure and the additional sacrificial material of the additional tiers of the additional stack structure by way of the slots to form voids in the tiers of the stack structure and additional voids in the additional tiers of the additional stack structure; and
- simultaneously filling the voids in the tiers of the stack structure and the additional voids in the additional tiers of the additional stack structure with the conductive material.

29. The method of claim 21, wherein forming conductive line structures over and in electrical communication with the additional pillar structures comprises:
- forming read source line structures over and in electrical communication with some of the additional pillar structures coupled to channel structures of the sense transistors; and
- forming digit line structures over and in electrical communication with:
  - some other of the additional pillar structures coupled to the channel structures of the sense transistors, and
  - yet some other of the additional pillar structures coupled to gate electrodes of the sense transistors.

30. A memory device, comprising:
- a stack structure divided into blocks separated by dielectric slot structures, each of the blocks comprising:
  - an access line section comprising tiers including access line structures;
  - a select gate section overlying the access line section and comprising additional tiers including drain side select gate (SGD) structures; and
  - a sense node section overlying the select gate section and comprising further tiers including select gate programming (SGP) structures;
- pillar groups within horizontal areas of the blocks and individually comprising multiple pillar structures vertically extending completely through one of the blocks, each pillar structure of the multiple pillar structures horizontally positioned within a different sub-block of the one of the blocks than each other pillar structure of the multiple pillar structures;
- horizontal sense transistors vertically overlying and coupled to the pillar groups;
- vertical read selector transistors vertically overlying and coupled to the horizontal sense transistors;
- vertical write selector transistors vertically overlying and coupled to the horizontal sense transistors, the vertical write selector transistors horizontally offset from the vertical read selector transistors; and conductive line structures vertically overlying and coupled to the vertical read selector transistors and the vertical write selector transistors.

31. The memory device of claim 30, wherein the SGD structures of each of the additional tiers of at least one of the blocks continuously horizontally extend from and between at least two of the dielectric slot structures horizontally neighboring the at least one of the blocks.

32. The memory device of claim 30, further comprising, horizontal areas of the blocks:
   select gate electrodes vertically overlying the horizontal sense transistors;
   read select pillar structures vertically extending through select gate electrodes and coupled to channel structures of the horizontal sense transistors, intersections of the read select pillar structures and the select gate electrodes defining the vertical read selector transistors; and
   write select pillar structures vertically extending through select gate electrodes and coupled to gate electrodes of the horizontal sense transistors, intersections of the write select pillar structures and the select gate electrodes defining the vertical write selector transistors.

33. The memory device of claim 32, wherein each of the horizontal sense transistors is individually coupled to two of the read select pillar structures and one of the write select pillar structures.

34. The memory device of claim 30, wherein the conductive line structures comprise read source line structures and digit line structures.

35. An electronic system, comprising:
   an input device;
   an output device;
   a processor device operably connected to the input device and the output device; and
   a memory device operably connected to the processor device and comprising:
      pillar structures vertically extending through blocks of a stack structure comprising conductive material vertically alternating with insulative material;
      conductive plug structures within horizontal areas of the blocks of the stack structure and coupled to different groups of the pillar structures than one another, each of the different groups of the pillar structures including multiple of the pillar structures positioned within different sub-blocks of one of the blocks than one another;
      horizontal sense transistors gated by the conductive plug structures;
      read source lines vertically overlying the horizontal sense transistors;
      digit lines structures vertically overlying the read source lines;
      first vertical read selector transistors vertically interposed between and in electrical communication with the read source lines and source regions of the horizontal sense transistors;
      second vertical read selector transistors vertically interposed between and in electrical communication with the digit lines structures and drain regions of the horizontal sense transistors; and
      vertical write selector transistors vertically interposed between and in electrical communication with the digit lines structures and the conductive plug structures.

36. The electronic system of claim 35, wherein the memory device comprises a 3D NAND Flash memory device.

* * * * *

UNITED STATES PATENT AND TRADEMARK OFFICE
CERTIFICATE OF CORRECTION

PATENT NO. : 12,400,686 B2
APPLICATION NO. : 17/812118
DATED : August 26, 2025
INVENTOR(S) : Yoshiaki Fukuzumi et al.

Page 1 of 1

It is certified that error appears in the above-identified patent and that said Letters Patent is hereby corrected as shown below:

In the Specification

| | | |
|---|---|---|
| Column 12, | Line 44, | change "current (I sense) requirements" to --current ($I_{sense}$) requirements-- |
| Column 15, | Line 42, | change "sub-section B 1 of the" to --sub-section $B_1$ of the-- |
| Column 31, | Line 40, | change "tenth $V_t$ enhanced" to --tenth $V_t$-enhanced-- |
| Column 42, | Line 55, | change "sections 4181 corresponding" to --sections 418I corresponding-- |
| Column 48, | Lines 11-12, | change "such as SiN y (e.g., $Si_3N_4$)." to --such as $SiN_y$ (e.g., $Si_3N_4$).-- |
| Column 48, | Line 37, | change "in FIG. 411 in some" to --in FIG. 4H, in some-- |
| Column 50, | Line 24, | change "(e.g., SiN y), and" to --(e.g., $SiN_y$), and-- |

Signed and Sealed this
Thirtieth Day of September, 2025

John A. Squires
*Director of the United States Patent and Trademark Office*